(12) United States Patent
Fukushima et al.

(10) Patent No.: US 10,702,972 B2
(45) Date of Patent: Jul. 7, 2020

(54) POLISHING APPARATUS

(71) Applicant: EBARA CORPORATION, Tokyo (JP)

(72) Inventors: Makoto Fukushima, Tokyo (JP); Hozumi Yasuda, Tokyo (JP); Keisuke Namiki, Tokyo (JP); Osamu Nabeya, Tokyo (JP); Shingo Togashi, Tokyo (JP); Satoru Yamaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 588 days.

(21) Appl. No.: 14/476,680

(22) Filed: Sep. 3, 2014

(65) Prior Publication Data

US 2014/0370794 A1  Dec. 18, 2014

Related U.S. Application Data

(63) Continuation-in-part of application No. 13/905,763, filed on May 30, 2013, now Pat. No. 9,403,255.

(30) Foreign Application Priority Data

May 31, 2012 (JP) .................. 2012-124663
Dec. 21, 2012 (JP) .................. 2012-279751

(51) Int. Cl.
*B24B 37/32* (2012.01)
*B24B 49/16* (2006.01)
(Continued)

(52) U.S. Cl.
CPC ............ *B24B 37/32* (2013.01); *B24B 37/005* (2013.01); *B24B 49/16* (2013.01); *H01L 21/304* (2013.01)

(58) Field of Classification Search
CPC ......... B24B 37/30; B24B 37/32; B24B 49/16; H01L 21/304
(Continued)

(56) References Cited

U.S. PATENT DOCUMENTS 5,738,568 A * 4/1998 Jurjevic .................. B24B 37/30
451/287
5,908,530 A   6/1999 Hoshizaki et al.
(Continued)

FOREIGN PATENT DOCUMENTS

CN    1698185 A    11/2005
CN    101934491 A   1/2011
(Continued)

OTHER PUBLICATIONS

European Patent Application No. 13020025.6; Extended Search Report; dated Sep. 15, 2017; 4 pages.

*Primary Examiner* — Monica S Carter
*Assistant Examiner* — Marcel T Dion
(74) *Attorney, Agent, or Firm* — BakerHostetler

(57) ABSTRACT

A polishing apparatus capable of precisely controlling a polishing profile, particularly a polishing profile in an edge portion, of a wafer is disclosed. The polishing apparatus includes: a top ring shaft; a housing fixed to the top ring shaft; a flexible membrane configured to press a wafer against a polishing pad; a top ring body configured to hold the flexible membrane; a retaining ring coupled to the top ring body and disposed so as to surround the flexible membrane; a gimbal mechanism configured to allow the top ring body and the retaining ring to tilt with respect to the housing; and a local load exerting mechanism configured to exert a downward local load on a part of the retaining ring.

15 Claims, 39 Drawing Sheets

(51) Int. Cl.
 *H01L 21/304* (2006.01)
 *B24B 37/005* (2012.01)
(58) Field of Classification Search
 USPC .............................. 451/398, 388, 287–290
 See application file for complete search history.

(56) References Cited

U.S. PATENT DOCUMENTS

| | | | | |
|---|---|---|---|---|
| 5,916,015 | A | * | 6/1999 | Natalicio ............ B24B 37/0053 451/288 |
| 5,951,368 | A | | 9/1999 | Watanabe et al. |
| 6,019,868 | A | | 2/2000 | Kimura et al. |
| 6,077,385 | A | | 6/2000 | Kimura et al. |
| 6,110,025 | A | * | 8/2000 | Williams ................ B24B 49/16 451/286 |
| 6,116,990 | A | * | 9/2000 | Sinclair ................... B24B 37/30 384/193 |
| 6,132,298 | A | * | 10/2000 | Zuniga .................... B24B 37/32 451/288 |
| 6,217,411 | B1 | | 4/2001 | Hiyama et al. |
| 6,220,945 | B1 | | 4/2001 | Hirokawa et al. |
| 6,290,584 | B1 | | 9/2001 | Kim et al. |
| 6,293,858 | B1 | * | 9/2001 | Kimura .................. B24B 49/16 451/287 |
| 6,354,907 | B1 | | 3/2002 | Satoh et al. |
| 6,435,949 | B1 | * | 8/2002 | Katsuoka ................ B24B 37/30 451/288 |
| 6,857,950 | B2 | | 2/2005 | Hayashi et al. |
| 6,932,671 | B1 | | 8/2005 | Korovin et al. |
| 6,976,903 | B1 | * | 12/2005 | Williams ................ B24B 41/04 257/E21.23 |
| 8,740,673 | B2 | * | 6/2014 | Kalenian ................ B24B 37/32 451/285 |
| 2002/0033230 | A1 | | 3/2002 | Hayashi et al. |
| 2003/0027498 | A1 | | 2/2003 | Tseng et al. |
| 2004/0029503 | A1 | * | 2/2004 | Kajiwara ................ B24B 37/30 451/288 |
| 2004/0142646 | A1 | * | 7/2004 | Chen ....................... B24B 37/12 451/288 |
| 2007/0232193 | A1 | * | 10/2007 | Yasuda ................... B24B 37/32 451/5 |
| 2008/0070479 | A1 | * | 3/2008 | Nabeya ................... B24B 37/30 451/8 |
| 2009/0305612 | A1 | | 12/2009 | Miyazaki et al. |
| 2010/0273405 | A1 | | 10/2010 | Fukushima et al. |
| 2012/0034849 | A1 | | 2/2012 | Chen et al. |

FOREIGN PATENT DOCUMENTS

| | | |
|---|---|---|
| EP | 0861706 A1 | 9/1998 |
| JP | H10-235555 A | 9/1998 |
| JP | 2000-094311 A | 4/2000 |
| JP | 2002-096261 A | 4/2002 |
| JP | 2003-173995 A | 6/2003 |
| TW | 467792 B | 12/2001 |
| TW | 516991 B | 1/2003 |
| TW | 575475 B | 2/2004 |
| TW | 200800483 A | 1/2008 |
| TW | 200915407 A | 4/2009 |
| TW | 201136708 A | 11/2011 |

* cited by examiner

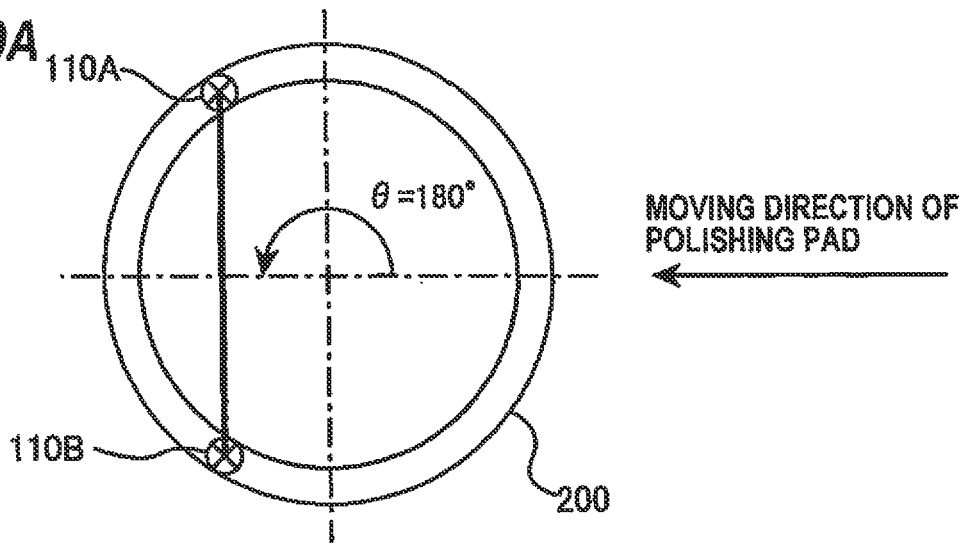
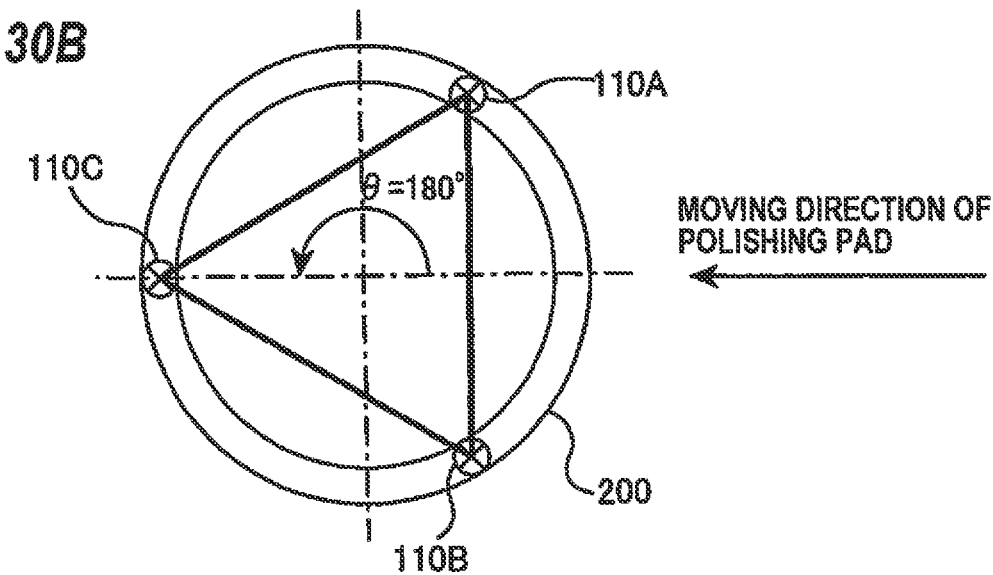
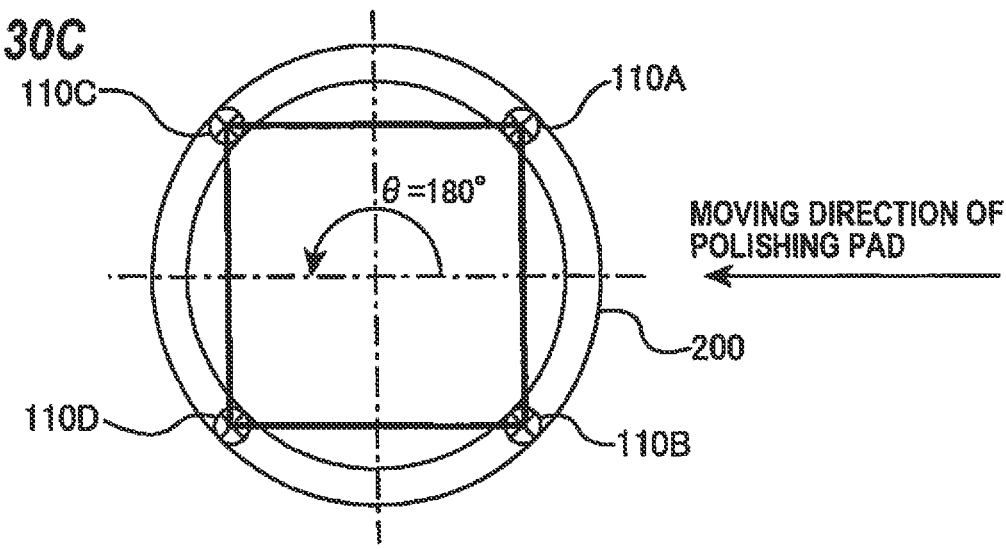

though the pressing force becomes non-uniform in an edge portion (a peripheral portion) of the wafer during polishing of the wafer. Such non-uniform pressing force would result in so-called "rounded edge" which is excessive polishing that occurs only in the edge portion of the wafer. In order to prevent such rounded edge, the substrate holder has a retaining ring for retaining the edge portion of the wafer. This retaining ring is configured to be vertically movable relative to a top ring body (or carrier head body) and press a region in the polishing surface of the polishing pad around the wafer.

POLISHING APPARATUS

CROSS REFERENCE TO RELATED APPLICATIONS

This is a continuation-in-part application of U.S. application Ser. No. 13/905,763 filed May 30, 2013, the disclosure of which is hereby incorporated by reference. This document claims priorities to Japanese Patent Application No. 2012-124663 filed May 31, 2012 and Japanese Patent Application No. 2012-279751 filed Dec. 21, 2012, the entire contents of which are hereby incorporated by reference.

BACKGROUND OF THE INVENTION

Field of the Invention

The present invention relates to a polishing apparatus for polishing a substrate, such as a wafer.

Description of the Related Art

With a recent trend toward higher integration and higher density in semiconductor devices, circuit interconnects become finer and finer and the number of levels in multilayer interconnect is increasing. In the fabrication process of the multilayer interconnect with finer circuit, as the number of interconnect levels increases, film coverage (or step coverage) of step geometry is lowered in thin film formation because surface steps grow while following surface irregularities on a lower layer. Therefore, in order to fabricate the multilayer interconnect, it is necessary to improve the step coverage and planarize the surface. It is also necessary to planarize semiconductor device surfaces so that irregularity steps formed thereon fall within a depth of focus in optical lithography. This is because finer optical lithography entails shallower depth of focus.

Accordingly, the planarization of the semiconductor device surfaces is becoming more important in the fabrication process of the semiconductor devices. Chemical mechanical polishing (CMP) is the most important technique in the surface planarization. This chemical mechanical polishing is a process of polishing a wafer with use of a polishing apparatus by placing the wafer in sliding contact with a polishing surface of a polishing pad while supplying a polishing liquid containing abrasive grains, such as silica ($SiO_2$), onto the polishing surface.

The polishing apparatus of this type has a polishing table that supports the polishing pad thereon, and a substrate holder for holding the wafer. The substrate holder is often called a top ring or a polishing head. This polishing apparatus polishes the wafer as follows. The substrate holder holds the wafer and presses it against the polishing surface of the polishing pad at predetermined pressure. The polishing table and the substrate holder are moved relative to each other to bring the wafer into sliding contact with the polishing surface to thereby polish a surface of the wafer.

When polishing the wafer, if a relative pressing force applied between the wafer and the polishing pad is not uniform over the surface of the wafer in its entirety, lack of polishing or excessive polishing would occur depending on the pressing force applied to each portion of the wafer. Thus, in order to even the pressing force exerted on the wafer, the substrate holder has at its lower part a pressure chamber formed by a flexible membrane. This pressure chamber is supplied with fluid, such as air, to press the wafer through the flexible membrane under the fluid pressure.

However, because the above-described polishing pad has elasticity, the pressing force becomes non-uniform in an edge portion (a peripheral portion) of the wafer during polishing of the wafer. Such non-uniform pressing force would result in so-called "rounded edge" which is excessive polishing that occurs only in the edge portion of the wafer. In order to prevent such rounded edge, the substrate holder has a retaining ring for retaining the edge portion of the wafer. This retaining ring is configured to be vertically movable relative to a top ring body (or carrier head body) and press a region in the polishing surface of the polishing pad around the wafer.

As the types of semiconductor devices have been increasing dramatically in recent years, there is an increasing demand for controlling a polishing profile in the wafer edge portion for each device or each CMP process (e.g., an oxide film polishing process and a metal film polishing process). One of the reasons is that each wafer has a different initial film-thickness distribution because a film-forming process, which is performed prior to the CMP process, varies depending on the type of film. Typically, a wafer is required to have a uniform film-thickness distribution over its entire surface after the CMP process. Therefore, different initial film-thickness distributions necessitate different polishing profiles.

Other reason is that types of polishing pads and polishing liquids, both of which are consumables in the polishing apparatus, are increasing greatly from a viewpoint of costs. Use of different polishing pads or different polishing liquids results in different polishing profiles particularly in the wafer edge portion. Because the polishing profile in the wafer edge portion can greatly affect a product yield, it is very important to precisely control the polishing profile in the wafer edge portion.

As described above, for the purpose of preventing the rounded edge of the wafer, the conventional substrate holder has the retaining ring configured to press the polishing surface of the polishing pad around the wafer. It is possible to control a polishing rate in the wafer edge portion by regulating pressure of the retaining ring. However, changing the pressure of the retaining ring could result in a change in the polishing rate not only in the wafer edge portion, but also in other regions with a relatively large area. Therefore, this approach is not suitable in the case of precisely controlling the polishing profile in the wafer edge portion.

SUMMARY OF THE INVENTION

The polishing profile, particularly the polishing profile in the wafer edge portion, can be controlled precisely by exerting a local force on the retaining ring for holding the edge portion of the wafer. A polishing apparatus and a polishing method capable of precisely controlling a polishing profile, particularly a polishing profile in an edge portion, of a substrate, such as a wafer, are provided.

In an embodiment, a polishing apparatus comprises: a top ring shaft; a housing fixed to the top ring shaft; a flexible membrane configured to press a wafer against a polishing pad; a top ring body configured to hold the flexible membrane; a retaining ring coupled to the top ring body and disposed so as to surround the flexible membrane; a gimbal mechanism configured to allow the top ring body and the retaining ring to tilt with respect to the housing; and a local load exerting mechanism configured to exert a downward local load on a part of the retaining ring.

In an embodiment, the local load exerting mechanism is disposed above the retaining ring.

In an embodiment, the local load exerting mechanism has a wheel that contacts the top ring body.

In an embodiment, the polishing apparatus further comprises a carrier ring that surrounds the retaining ring.

In an embodiment, the polishing apparatus further comprises a retaining ring pressing mechanism configured to press the retaining ring against the polishing pad.

In an embodiment, a polishing apparatus for polishing a substrate by bringing the substrate into contact with a polishing surface, comprises: a substrate holder having a substrate holding surface configured to press the substrate against the polishing surface, a retaining ring coupled to the substrate holding surface and configured to surround the substrate, wherein the retaining ring is brought into contact with the polishing surface during operation of the polishing apparatus, the retaining ring being configured to be tiltable independently of the substrate holding surface; a rotating mechanism configured to rotate the substrate holder about its own axis; and at least one local load exerting mechanism configured to exert a local load on a part of the retaining ring in a direction perpendicular to the polishing surface, the at least one local load exerting mechanism being arranged so as not to move in accordance with the substrate holder.

In an embodiment, the polishing apparatus further comprises a retaining ring pressing mechanism configured to press the retaining ring against the polishing surface.

In an embodiment, the substrate holding surface and the retaining ring are vertically movable relative to each other.

In an embodiment, the polishing apparatus further comprises a supporting mechanism configured to receive a lateral force applied from the substrate to the retaining ring during polishing of the substrate.

In an embodiment, the at least one local load exerting mechanism comprises an air cylinder configured to exert the local load on a part of the retaining ring.

In an embodiment, the at least one local load exerting mechanism comprises a magnet configured to exert the local load on a part of the retaining ring.

In an embodiment, the magnet is an electromagnet configured to exert a downward local load and an upward local load selectively on a part of the retaining ring.

In an embodiment, the polishing apparatus further comprises a load cell configured to measure a force that varies in accordance with the local load.

In an embodiment, the polishing apparatus further comprises structure configured to allow an installation position of the at least one local load exerting mechanism to be changed.

In an embodiment, the polishing apparatus further comprises a polishing surface moving mechanism configured to move the polishing surface horizontally relative to the substrate holder, the at least one local load exerting mechanism being located downstream of the substrate with respect to a moving direction of the polishing surface.

In an embodiment, the at least one local load exerting mechanism comprises a plurality of local load exerting mechanisms.

In another embodiment, a polishing apparatus for polishing a substrate by bringing the substrate into contact with a polishing surface, comprises: a retaining ring arranged so as to surround the substrate; a first load exerting mechanism configured to bring the retaining ring into contact with the polishing surface during operation of the polishing apparatus; and at least one second mechanism configured to exert a second load on a part of the retaining ring in a direction perpendicular to the polishing surface.

In an embodiment, the polishing apparatus further comprises structure configured to allow an installation position of the at least one second exerting mechanism to be changed.

In an embodiment, the polishing apparatus further comprises a retaining ring height sensor configured to measure a height of the retaining ring.

In an embodiment, the polishing apparatus is configured to change either one or both of a magnitude and a position of the second load based on a measurement result of the height of the retaining ring.

In an embodiment, the polishing apparatus further comprises a film thickness sensor configured to obtain a film thickness signal indicating a film thickness of the substrate, the polishing apparatus being configured to change either one or both of a magnitude and a position of the second load based on the film thickness signal obtained.

In an embodiment, the at least one second mechanism is configured to exert a second load on a part of the retaining ring downstream of a rotation of the polishing surface.

In another embodiment, a polishing method of polishing a substrate by bringing the substrate into contact with a polishing surface, comprises: pressing the substrate against the polishing surface while rotating the substrate; bringing a retaining ring, arranged so as to surround the substrate, into contact with the polishing surface while rotating the retaining ring; and when pressing the substrate against the polishing surface, exerting a local load on a part of the retaining ring in a direction perpendicular to the polishing surface, the position of the local load not changing during the rotation of the retaining ring.

In an embodiment, the polishing method further comprises changing the position of the local load based on polishing result of the substrate.

In an embodiment, the polishing method further comprises: measuring a height of the retaining ring; and changing either one or both of a magnitude and the position of the local load based on a measurement result of the height of the retaining ring.

In an embodiment, the polishing method further comprises: obtaining a film thickness signal indicating a film thickness of the substrate; and changing either one or both of a magnitude and the position of the local load based on the film thickness signal.

In another embodiment, a polishing method, comprises: pressing a first substrate against a polishing surface while rotating the first substrate; bringing a retaining ring, arranged so as to surround the first substrate, into contact with the polishing surface while rotating the retaining ring; when pressing the first substrate against the polishing surface, exerting a local load on a part of the retaining ring in a direction perpendicular to the polishing surface, with use of a local load exerting mechanism which is stationary at a first position; after polishing of the first substrate, pressing a second substrate against the polishing surface while rotating the second substrate; bringing the retaining ring into contact with the polishing surface while rotating the retaining ring; when pressing the second substrate against the polishing surface, exerting a local load on a part of the retaining ring in the direction perpendicular to the polishing surface, with use of the local load exerting mechanism which is stationary at a second position differing from the first position; obtaining polishing results of the first substrate and the second substrate; and determining a position of the local load exerting mechanism based on the polishing results.

In an embodiment, the local load when polishing the second substrate is different from the local load when polishing the first substrate.

In another embodiment, a polishing apparatus for polishing a substrate by bringing the substrate into sliding contact with a polishing surface, comprises: a substrate holder having a substrate holding surface for pressing the substrate against the polishing surface and further having a retaining ring arranged so as to surround the substrate, the retaining ring being configured to be tiltable independently of the substrate holding surface, wherein the retaining ring is brought into contact with the polishing surface during operation of the polishing apparatus; a rotating mechanism configured to rotate the substrate holder about its own axis; a local load exerting mechanism configured to generate a load; and a pressure ring disposed between the local load exerting mechanism and the retaining ring, the local load exerting mechanism being configured to exert the load on a part of the pressure ring in a direction perpendicular to the polishing surface, the pressure ring having a load transmitting element configured to transmit the load, received from the local load exerting mechanism, to a part of the retaining ring, the local load exerting mechanism and the pressure ring being substantially fixed in position relative to rotation of the substrate holder during operation of the polishing apparatus.

In an embodiment, the polishing apparatus further comprises structure configured to allow a position of the load transmitting element to be changed along a circumferential direction of the retaining ring.

In an embodiment, the load transmitting element comprises a rolling member.

In an embodiment, the substrate holder further has a retaining ring pressing mechanism configured to press the retaining ring against the polishing surface.

In an embodiment, the local load exerting mechanism comprises load generators, a bridge configured to receive loads generated by the load generators, and a connector configured to transmit the loads, received by the bridge, to the pressure ring.

In an embodiment, of the load generators, one which is closer to the connector generates a relatively large load, and one which is away from the connector generates a relatively small load.

In an embodiment, the load generators are operable to generate the loads such that a center of gravity of the loads coincides with a position of the connector.

In an embodiment, the polishing apparatus further comprises a load cell configured to measure a force that varies in accordance with the load exerted by the local load exerting mechanism.

In an embodiment, the polishing apparatus further comprises a suction line coupling the pressure ring to a vacuum source.

In another embodiment, a polishing apparatus for polishing a substrate by bringing the substrate into contact with a polishing surface, comprises: a substrate holder having a substrate holding surface for pressing the substrate against the polishing surface and further having a retaining ring arranged so as to surround the substrate, the retaining ring being configured to be tiltable independently of the substrate holding surface, the retaining ring configured to contact the polishing surface during operation of the polishing apparatus; a rotating mechanism configured to rotate the substrate holder about its own axis; local load exerting mechanisms configured to generate local loads; and a pressure ring disposed between the local load exerting mechanisms and the retaining ring, each of the local load exerting mechanisms being configured to exert a local load on a part of the pressure ring in a direction perpendicular to the polishing surface, the pressure ring having load transmitting elements configured to transmit the local loads, received from the local load exerting mechanisms, to the retaining ring, the local load exerting mechanisms and the pressure ring being arranged so as not to rotate together with the substrate holder.

In an embodiment, the load transmitting elements comprise rolling members.

In an embodiment, the substrate holder further has a retaining ring pressing mechanism configured to press the retaining ring against the polishing surface.

In an embodiment, the local load exerting mechanisms are configured to be able to change a center of the gravity of the local loads exerted on the pressure ring.

In an embodiment, the polishing apparatus further comprises load cells configured to measure forces that vary in accordance with the local loads.

In another embodiment, a polishing apparatus for polishing a substrate by bringing the substrate into sliding contact with a polishing surface, comprises: a substrate holder having a substrate holding surface for pressing the substrate against the polishing surface, a retaining ring arranged so as to surround the substrate and brought into contact with the polishing surface, a pressing member configured to exert a local load on a part of the retaining ring in a direction perpendicular to the polishing surface, and a load generator configured to generate the local load, the retaining ring being configured to be tiltable independently of the substrate holding surface; a rotating mechanism configured to rotate the substrate holder about its own axis; and a position retaining mechanism arranged so as not to rotate together with the substrate holder and configured to retain a position of the pressing member so as not to allow the pressing member to rotate together with the substrate holder.

In an embodiment, the position retaining mechanism is configured to retain the position of the pressing member via a magnetic force.

In another embodiment, a polishing method of polishing a substrate by bringing the substrate into sliding contact with a polishing surface, comprises: pressing the substrate against the polishing surface while rotating the substrate; bringing a retaining ring, arranged so as to surround the substrate, into contact with the polishing surface while rotating the retaining ring; and when pressing the substrate against the polishing surface, exerting local loads each on a part of the retaining ring in a direction perpendicular to the polishing surface, with positions of the local loads fixed relative to the rotation of the retaining ring.

In an embodiment, the polishing method further comprises changing a center of gravity of the local loads by changing magnitude of the local loads.

In another embodiment, a polishing apparatus for polishing a substrate, comprises: a rotatable polishing table for supporting a polishing pad; a rotatable top ring having a substrate holding device and a retainer ring, wherein the substrate holding device is configured to hold the substrate against the polishing pad and the retainer ring is configured to surround the substrate and to press the polishing pad and is capable of tilting independently from the substrate holding device relative to an axis of the rotation of the top ring; and a first load exerting device for exerting a pressure to the retainer ring to press the polishing pad wherein the load exerting device is stationary relative to the rotation of the top ring.

In an embodiment, the top ring further comprises a second load exerting device for pressing the retaining ring against the polishing pad.

In an embodiment, the retaining ring is vertically movable independent from the substrate holding device.

In an embodiment, the first load exerting device presses the retaining ring at more than two locations of the retaining ring.

In an embodiment, the first load exerting device has an air cylinder for pressing the retaining ring.

In an embodiment, the first load exerting device has a magnetic device for pressing the retaining ring.

In an embodiment, the magnetic device comprises an electromagnet.

In an embodiment, the first load exerting device is able to change the location to be pressed on the retaining ring.

In an embodiment, the location on the retaining ring to be pressed by the first load exerting device is located downstream of the substrate relative to the rotation of the polishing table.

In an embodiment, the substrate holding device is configured to hold the substrate against the polishing pad at different pressures at a central area and a peripheral area.

In an embodiment, the polishing apparatus is a chemical mechanical polishing apparatus.

In an embodiment, the substrate is a semiconductor wafer.

In another embodiment, a method for polishing a substrate, comprises: providing a rotatable top ring having a substrate holding device and a retaining ring; holding a substrate in the substrate holding device against a polishing pad; rotating the polishing pad; rotating the top ring and the substrate held in the substrate holding device; and exerting a pressure to the retaining ring to press the polishing pad by a load exerting device, wherein a position of the exerted pressure is stationary relative to the rotation of the top ring.

In an embodiment, the substrate is a semiconductor wafer.

According to various embodiments described above, it is possible to actively control a surface pressure distribution of the retaining ring, a deformed state of the polishing surface, a deformed state of the retaining ring, and the like by exerting the local load on a part of the retaining ring. As a result, the polishing rate (i.e., the polishing profile) in the wafer edge portion, which is adjacent to the retaining ring, can be controlled precisely.

BRIEF DESCRIPTION OF THE DRAWINGS

FIG. 30A shows an example in which two air cylinders exert local loads on the pressure ring;

FIG. 30B shows an example in which three air cylinders exert local loads on the pressure ring;

FIG. 30C shows an example in which four air cylinders exert local loads on the pressure ring;

DETAILED DESCRIPTION

Figure 1:
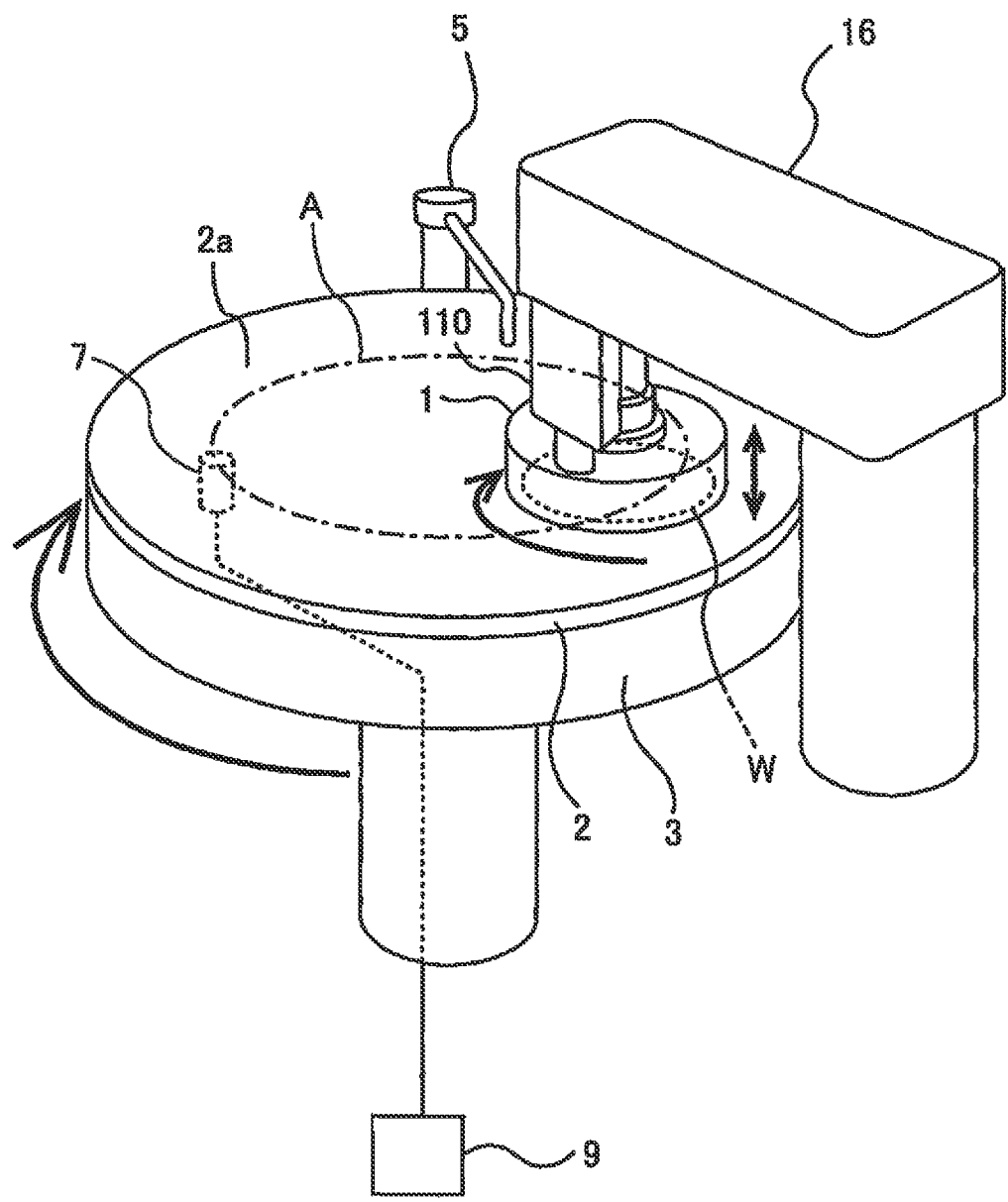
FIG. 1 is a schematic view of a polishing apparatus according to an embodiment.

Embodiments will be described in detail below with reference to the drawings. Identical or corresponding parts are denoted by identical reference numerals throughout the views and their repetitive explanations will be omitted.

FIG. 1 is a schematic view of a polishing apparatus according to an embodiment. As shown in FIG. 1, the polishing apparatus includes a top ring (a substrate holder) 1 for holding and rotating a wafer (i.e., a substrate) W, a polishing table 3 for supporting a polishing pad 2 thereon, a polishing liquid supply mechanism 5 for supplying a polishing liquid (slurry) onto the polishing pad 2, and a film thickness sensor 7 for obtaining a film thickness signal that varies according to a film thickness of the wafer W. The film thickness sensor 7 is disposed in the polishing table 3 and obtains the film thickness signal in a plurality of regions, including a central region, of the wafer W every time the polishing table 3 makes one revolution. Examples of the film thickness sensor 7 include an optical sensor and an eddy current sensor.

The top ring 1 is configured to hold the wafer W on its lower surface by vacuum suction. The top ring 1 and the polishing table 3 rotate in the same direction as indicated by arrows in FIG. 1. In this state, the top ring 1 presses the wafer W against a polishing surface 2a of the polishing pad 2. The polishing liquid is supplied from the polishing liquid supply mechanism 5 onto the polishing pad 2, so that the wafer W is polished by sliding contact with the polishing pad 2 in the presence of the polishing liquid. During polishing of the wafer W, the film thickness sensor 7 rotates together with the polishing table 3 and obtains the film thickness signal while passing across a surface of the wafer W as shown by a symbol A. This film thickness signal is an index value representing the film thickness directly or indirectly, and varies in accordance with a decrease in the film thickness of the wafer W. The film thickness sensor 7 is coupled to a polishing controller 9 so that the film thickness signal is transmitted to the polishing controller 9. This polishing controller 9 is configured to terminate polishing of the wafer W when the film thickness of the wafer W, which is indicated by the film thickness signal, has reached a predetermined target value.

Figure 2:
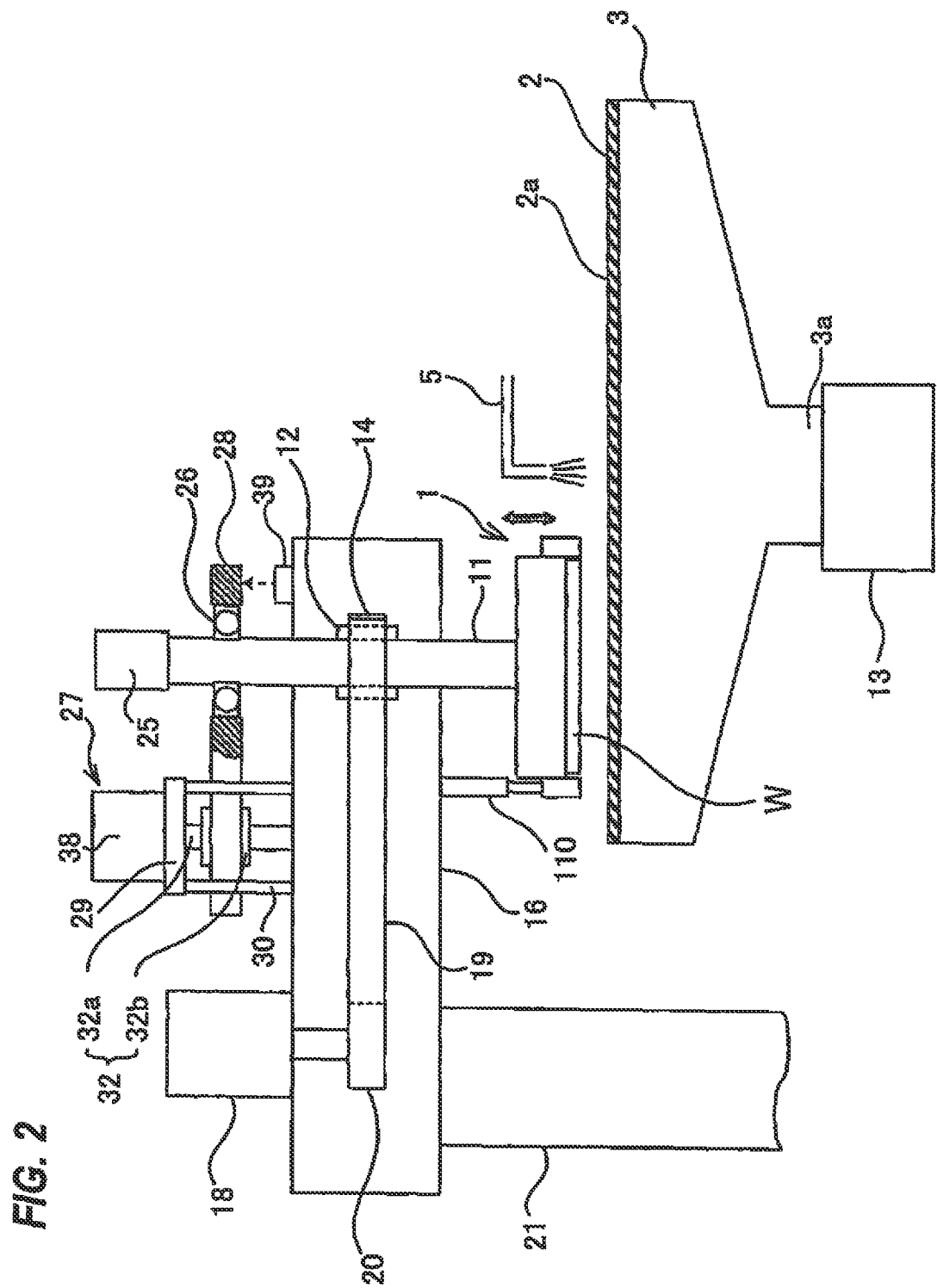
FIG. 2 is a view showing a detailed structure of the polishing apparatus.

FIG. 2 is a view showing a detailed structure of the polishing apparatus. The polishing table 3 is coupled to a motor 13 through a table shaft 3a and is rotated about the table shaft 3a by the motor 13 which is disposed below the polishing table 3. The polishing pad 2 is attached to an upper surface of the polishing table 3. An upper surface of the polishing pad 2 provides the polishing surface 2a for polishing the wafer W. When the polishing table 3 is rotated by the motor 13, the polishing surface 2a moves relative to the top ring 1. Therefore, the motor 13 serves as a polishing surface moving mechanism for moving the polishing surface 2a horizontally.

The top ring 1 is coupled to a top ring shaft 11, which is movable vertically relative to a top ring head 16 by a vertically moving mechanism 27. A vertical movement and positioning of the top ring 1 in its entirety relative to the top ring head 16 are achieved by the vertical movement of the top ring shaft 11. A rotary joint 25 is mounted to an upper end of the top ring shaft 11.

The vertically moving mechanism 27 for elevating and lowering the top ring shaft 11 and the top ring 1 includes a bridge 28 for rotatably supporting the top ring shaft 11 through a bearing 26, a ball screw 32 mounted to the bridge 28, a support base 29 supported by pillars 30, and a servomotor 38 mounted to the support base 29. The support base 29 for supporting the servomotor 38 is secured to the top ring head 16 through the pillars 30.

The ball screw 32 has a screw shaft 32a coupled to the servomotor 38 and a nut 32b which is in engagement with the screw shaft 32a. The top ring shaft 11 is configured to move vertically together with the bridge 28. Therefore, when the servomotor 38 is set in motion, the bridge 28 moves vertically through the ball screw 32 to cause the top ring shaft 11 and the top ring 1 to move vertically. A top ring height sensor 39 is mounted to the top ring head 16 so as to face the bridge 28. This top ring height sensor 39 is configured to measure a height of the top ring 1 based on a position of the bridge 28 which is vertically movable in unison with the top ring 1.

The top ring shaft 11 is further coupled to a rotary cylinder 12 through a key (not shown). This rotary cylinder 12 has a timing pulley 14 on its outer circumferential surface. A top ring motor 18 is secured to the top ring head 16, and a timing pulley 20 is mounted to the top ring motor 18. The timing pulley 14 is coupled to the timing pulley 20 through a timing belt 19. With these configurations, rotation of the top ring motor 18 is transmitted to the rotary cylinder 12 and the top ring shaft 11 through the timing pulley 20, the timing belt 19, and the timing pulley 14 to rotate the rotary cylinder 12 and the top ring shaft 11 in unison, thus rotating the top ring 1 about its own axis. The top ring motor 18, the timing pulley 20, the timing belt 19, and the timing pulley 14 constitute a rotating mechanism for rotating the top ring 1 about its own axis. The top ring head 16 is supported by a top ring head shaft 21 which is rotatably supported by a frame (not shown).

The top ring 1 is configured to hold a substrate, such as the wafer W, on its lower surface. The top ring head 16 is configured to be able to pivot on the top ring shaft 21, so that the top ring 1, holding the wafer W on its lower surface, is moved from a wafer transfer position to a position above the polishing table 3 by the pivotal movement of the top ring head 16. The top ring 1 is then lowered and presses the wafer W against the polishing surface 2a of the polishing pad 2, while the top ring 1 and the polishing table 3 are rotated and the polishing liquid is supplied onto the polishing pad 2 from the polishing liquid supply mechanism 5 disposed above the polishing table 3. The wafer W is placed in sliding contact with the polishing surface 2a of the polishing pad 2, whereby the surface of the wafer W is polished.

Figure 3:
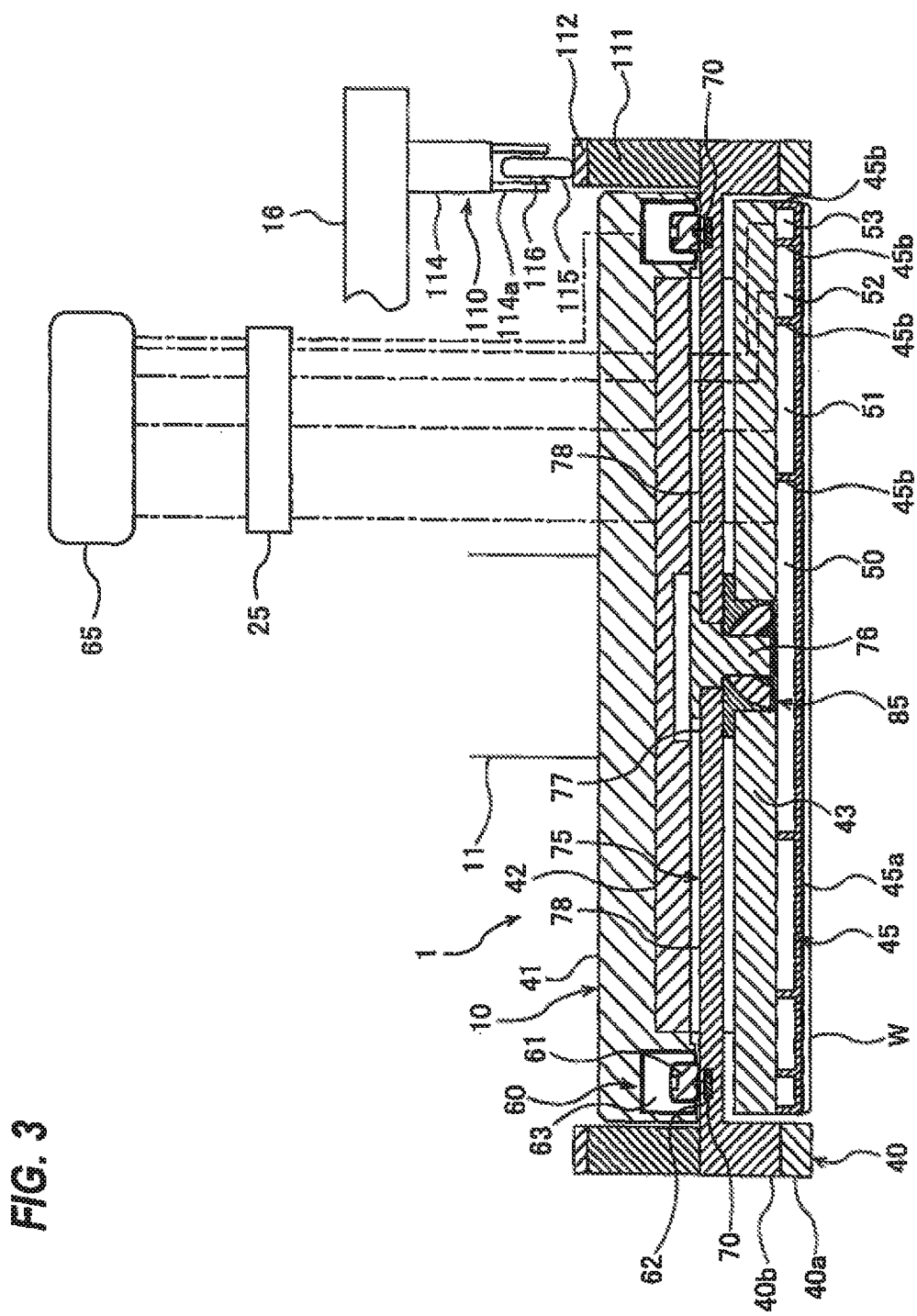
FIG. 3 is a cross-sectional view of a top ring.

The top ring 1, which serves as the substrate holder, will be described in detail below. FIG. 3 is a cross-sectional view of the top ring 1. As shown in FIG. 3, the top ring 1 includes a top ring body 10 for pressing the wafer W against the polishing surface 2a, and a retaining ring 40 arranged so as to surround the wafer W. The top ring body 10 and the retaining ring 40 are rotatable in unison by the rotation of the top ring shaft 11. The retaining ring 40 is configured to be vertically movable independently of the top ring body 10.

The top ring body 10 has a circular flange 41, a spacer 42 mounted to a lower surface of the flange 41, and a carrier 43 mounted to a lower surface of the spacer 42. The flange 41 is coupled to the top ring shaft 11. The carrier 43 is coupled to the flange 41 through the spacer 42, so that the flange 41, the spacer 42, and the carrier 43 rotate and vertically move in unison. The top ring body 10, which is constructed by the flange 41, the spacer 42, and the carrier 43, is made of resin, such as engineering plastic (e.g., PEEK). The flange 41 may be made of metal, such as SUS, aluminum, or the like.

A flexible membrane 45, which is brought into contact with a beck surface of the wafer W, is attached to a lower surface of the carrier 43. This flexible membrane 45 has a lower surface which serves as a substrate holding surface 45a. The flexible membrane 45 further has annular partition walls 45b which define four pressure chambers: a central chamber 50; a ripple chamber 51; an outer chamber 52; and an edge chamber 53, which are located between the flexible membrane 45 and the top ring body 10. These pressure chambers 50 to 53 are in fluid communication with a pressure regulator 65 via the rotary joint 25, so that pressurized fluid is supplied into these pressure chambers 50 to 53 from the pressure regulator 65. This pressure regulator 65 is configured to be able to regulate pressures in the respective four pressure chambers 50 to 53 independently. Further, the pressure regulator 65 is configured to be able to produce negative pressure in the pressure chambers 50 to 53. The flexible membrane 45 has a through-hole (not shown) in a position corresponding to the ripple chamber 51 or the outer chamber 52, so that the top ring 1 can hold the substrate on its substrate holding surface 45a by producing the negative pressure in the through-hole. The flexible membrane 45 is made of a highly strong and durable rubber material, such as ethylene propylene rubber (EPDM), polyurethane rubber, silicone rubber, or the like. The central chamber 50, the ripple chamber 51, the outer chamber 52, and the edge chamber 53 are further coupled to a pressure relief mechanism (not shown), which can establish a fluid communication between the atmosphere and these four pressure chambers 50 to 53.

The retaining ring 40 is disposed so as to surround the carrier 43 and the flexible membrane 45. This retaining ring 40 has a ring member 40a that contacts the polishing surface 2a of the polishing pad 2, and a drive ring 40b fixed to an upper portion of the ring member 40a. The ring member 40a is secured to the drive ring 40b by a plurality of bolts (not shown). The ring member 40a is arranged so as to surround a peripheral edge of the wafer W and retains the wafer W therein so as to prevent the wafer W from being separated from the top ring 1 when the wafer W is being polished.

The retaining ring 40 has an upper portion coupled to an annular retaining ring pressing mechanism 60, which is configured to exert a uniform downward load on an upper surface of the retaining ring 40 (more specifically, an upper surface of the drive ring 40b) in its entirety to thereby press a lower surface of the retaining ring 40 (i.e., a lower surface of the ring member 40a) against the polishing surface 2a of the polishing pad 2.

The retaining ring pressing mechanism 60 includes an annular piston 61 fixed to an upper portion of the drive ring 40, and an annular rolling diaphragm 62 connected to an upper surface of the piston 61. The rolling diaphragm 62 defines a retaining ring pressure chamber 63 therein. This retaining ring pressure chamber 63 is in fluid communication with the pressure regulator 65 through the rotary joint 25. When the pressure regulator 65 supplies a pressurized fluid (e.g., pressurized air) into the retaining ring pressure chamber 63, the rolling diaphragm 62 pushes down the piston 61, which in turn pushes down the retaining ring 40 in its entirety. In this manner, the retaining ring pressing mechanism 60 presses the lower surface of the retaining ring 40 against the polishing surface 2a of the polishing pad 2. Further, when the pressure regulator 65 develops the negative pressure in the retaining ring pressure chamber 63, the retaining ring 40 in its entirety is elevated. The retaining ring pressure chamber 63 is further coupled to a pressure relief mechanism (not shown), which can establish a fluid communication between the atmosphere and the retaining ring pressure chamber 63.

The retaining ring 40 is removably coupled to the retaining ring pressing mechanism 60. More specifically, the piston 61 is made of a magnetic material, such as metal, and a plurality of magnets 70 are disposed on the upper portion of the drive ring 40b. These magnets 70 magnetically attract the piston 61, so that the retaining ring 40 is secured to the piston 61 via a magnetic force. The magnetic material of the piston 61 may be corrosion resisting magnetic stainless steel. The drive ring 40b may be made of a magnetic material, and magnets may be disposed on the piston 61.

Figure 4:
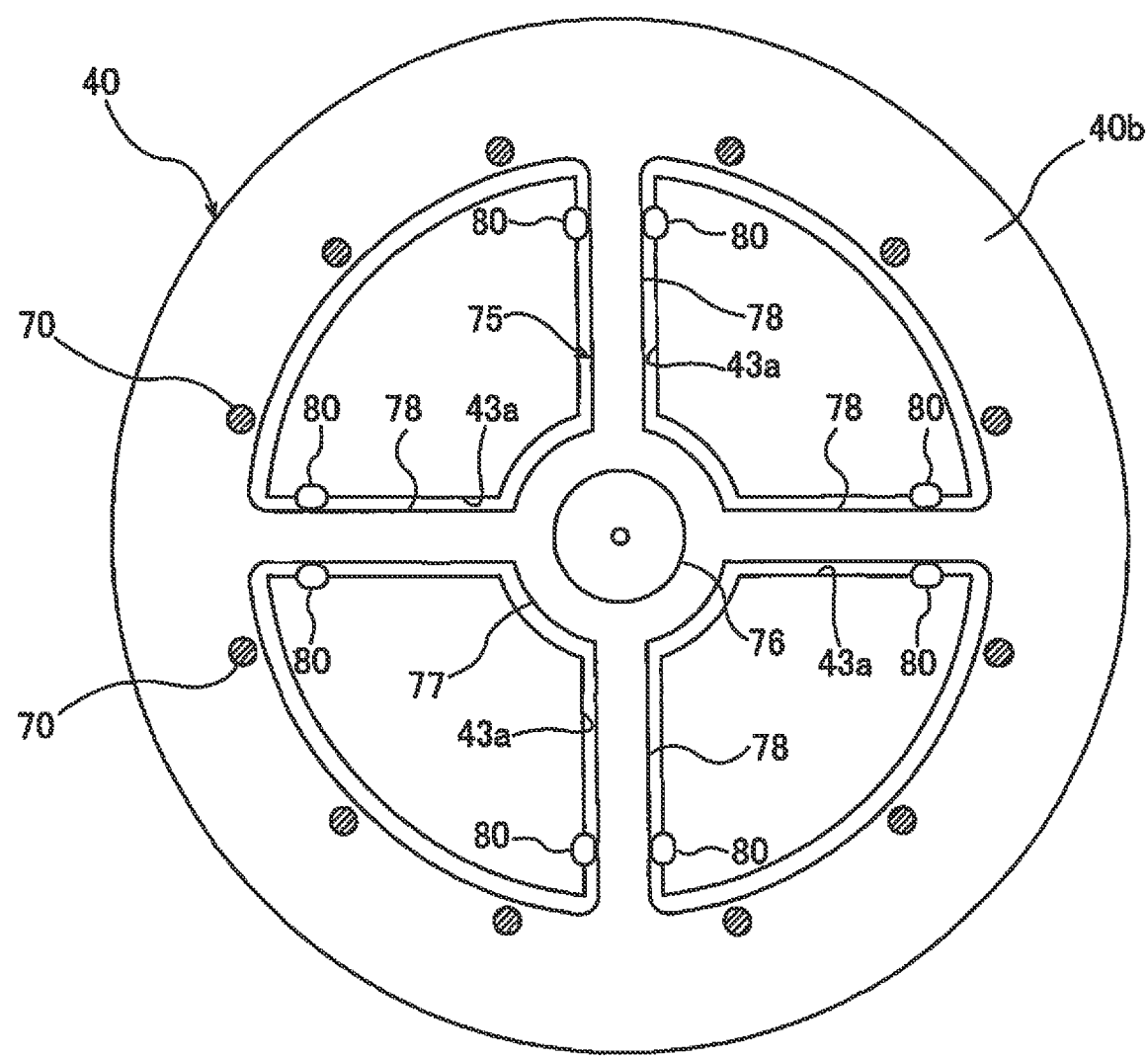
FIG. 4 is a plan view showing a retaining ring and a coupling member.

The retaining ring 40 is coupled to a spherical bearing 85 through a coupling member 75. The spherical bearing 85 is disposed radially inwardly of the retaining ring 40. FIG. 4 is a plan view showing the retaining ring 40 and the coupling member 75. As shown in FIG. 4, the coupling member 75 includes a vertically extending shaft portion 76 disposed centrally in the top ring body 10, a hub 77 secured to the shaft portion 76, and a plurality of spokes 78 extending radially from the hub 77. The spokes 78 have one ends fixed to the shaft portion 76 and have the other ends fixed to the drive ring 40b of the retaining ring 40. In this embodiment, the hub 77, the spokes 78, and the drive ring 40b are formed integrally. Plural pairs of drive pins 80 and 80 are secured to the carrier 43. The drive pins 80 and 80 of each pair are arranged on both sides of each spoke 78. The rotation of the carrier 43 is transmitted to the retaining ring 40 through the drive pins 80 and 80 to thereby rotate the top ring body 10 and the retaining ring 40 in unison.

As shown in FIG. 3, the shaft portion 76 extends vertically in the spherical bearing 85. As shown in FIG. 4, the carrier 43 has a plurality of radial grooves 43a in which the spokes 78 are disposed, respectively. Each spoke 78 is movable freely in the vertical direction in each groove 43a. The shaft portion 76 of the coupling member 75 is supported by the spherical bearing 85 such that the shaft portion 76 can move in the vertical direction. The spherical bearing 85 is located at the center of the top ring body 10. The coupling member 75 and the retaining ring 40 that is secured to the coupling member 75 are thus vertically movable relative to the top ring body 10. Further, the retaining ring 40 is tiltably supported by the spherical bearing 85.

Figure 5:
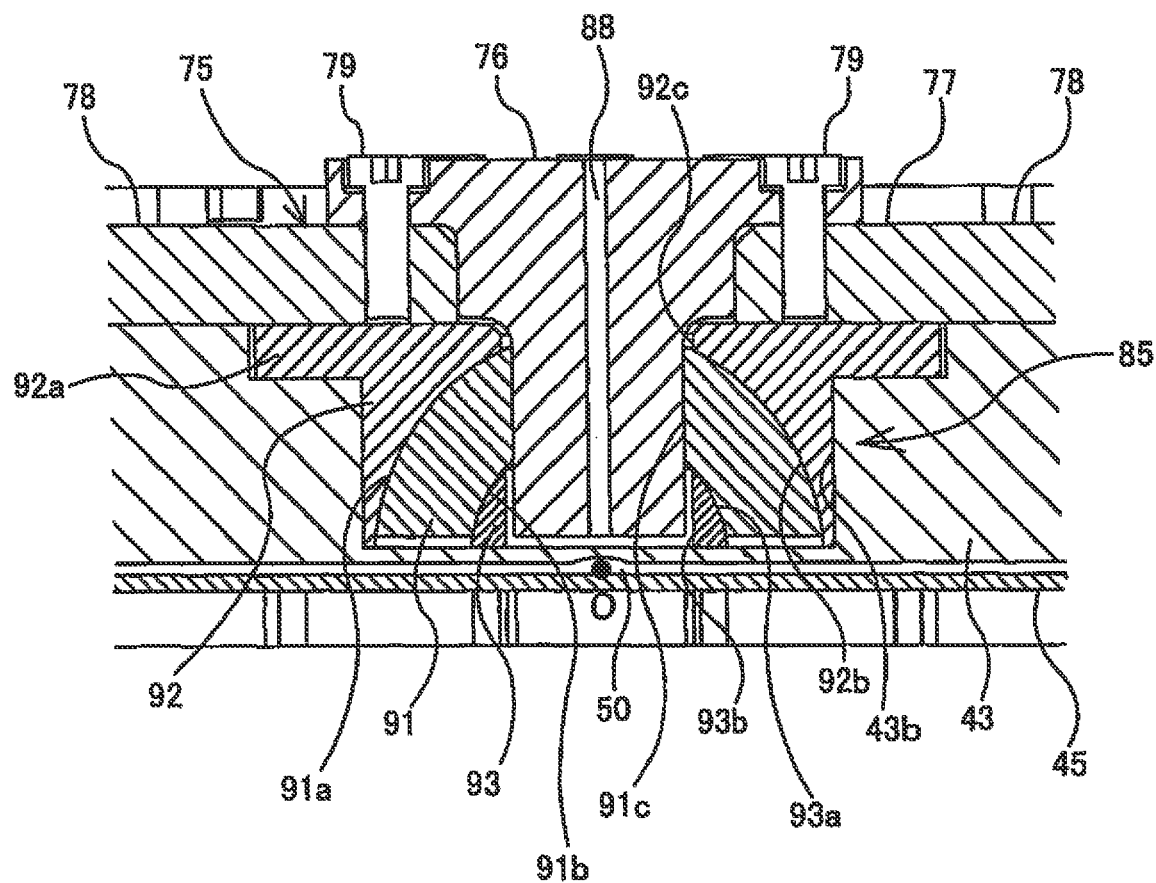
FIG. 5 is an enlarged cross-sectional view of a spherical bearing and a part of the coupling member.

The spherical bearing 85 will now be described in more detail. FIG. 5 is an enlarged cross-sectional view of the spherical bearing 85 and a part of the coupling member 75. As shown in FIG. 5, the shaft portion 76 is secured to the hub 77 by a plurality of screws 79. The shaft portion 76 has a vertically extending through-hole 88 formed therein. This through-hole 88 acts as an air vent hole when the shaft portion 76 moves vertically relative to the spherical bearing 85. Therefore, the retaining ring 40 can move smoothly in the vertical direction relative to the top ring body 10.

The spherical bearing 85 includes an intermediate bearing ring 91 coupled to the retaining ring 40 through the coupling member 75, an outer bearing ring 92 slidably supporting the intermediate bearing ring 91 from above, and an inner bearing ring 93 slidably supporting the intermediate bearing ring 91 from below. The intermediate bearing ring 91 is in the form of a partial spherical shell smaller than an upper half of a spherical shell. The intermediate bearing ring 91 is sandwiched between the outer bearing ring 92 and the inner bearing ring 93.

The carrier 43 has a recess 43b formed at the central portion thereof, and the outer bearing ring 92 is disposed in this recess 43b. The outer bearing ring 92 has a flange portion 92a on its outer circumferential surface. The flange portion 92a is secured to a step of the recess 43b by bolts (not shown), thereby securing the outer bearing ring 92 to the carrier 43 and applying pressure to the intermediate bearing ring 91 and the inner bearing ring 93. The inner bearing ring 93 is disposed on a bottom surface of the recess 43b. This inner bearing ring 93 supports the intermediate bearing ring 91 from below so as to form a gap between a lower surface of the intermediate bearing ring 91 and the bottom surface of the recess 43b.

The outer bearing ring 92 has an inner surface 92b, the intermediate bearing ring 91 has an outer surface 91a and an inner surface 91b, and the inner bearing ring 93 has an outer surface 93a. Each of these surfaces 92b, 91a, 91b, and 93a is a substantially hemispheric surface whose center is represented by a fulcrum O. The outer surface 91a of the intermediate bearing ring 91 slidably contacts the inner surface 92b of the outer bearing ring 92. The inner surface 91b of the intermediate bearing ring 91 slidably contacts the outer surface 93a of the inner bearing ring 93. The inner surface 92b (sliding contact surface) of the outer bearing ring 92, the outer surface 91a and the inner surface 91b (sliding contact surfaces) of the intermediate bearing ring 91, and the outer surface 93a (sliding contact surface) of the inner bearing ring 93 have a partial spherical shape smaller than an upper half of a spherical surface. With these configurations, the intermediate bearing ring 91 is tiltable in all directions through 360° with respect to the outer bearing ring 92 and the inner bearing ring 93. The fulcrum O, which is the center of the tilting movement of the intermediate bearing ring 91, is located below the spherical bearing 85.

The outer bearing ring 92, the intermediate bearing ring 91, and the inner bearing ring 93 have respective throughholes 92c, 91c, and 93b formed therein in which the shaft portion 76 is inserted. There is a gap between the throughhole 92c of the outer bearing ring 92 and the shaft portion 76. Similarly, there is a gap between the through-hole 93b of the inner bearing ring 93 and the shaft portion 76. The through-hole 91c of the intermediate bearing ring 91 has a diameter smaller than those of the through-holes 92c and 93b of the outer bearing ring 92 and the inner bearing ring 93 such that the shaft portion 76 is movable relative to the intermediate bearing ring 91 only in the vertical direction. Therefore, the retaining ring 40, which is coupled to the shaft portion 76, is substantially not allowed to move laterally, i.e., horizontally. That is, the retaining ring 40 is fixed in its lateral position (i.e., its horizontal position) by the spherical bearing 85.

Figure 6A:
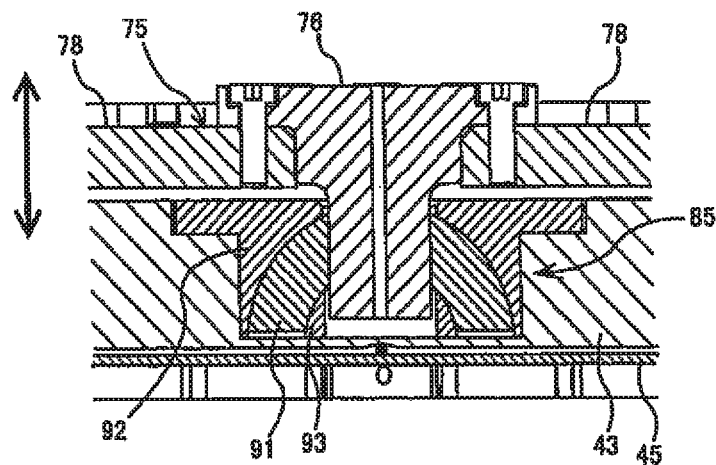
FIG. 6A is a view showing a manner in which the coupling member is vertically moved relative to the spherical bearing.
Figure 6B:
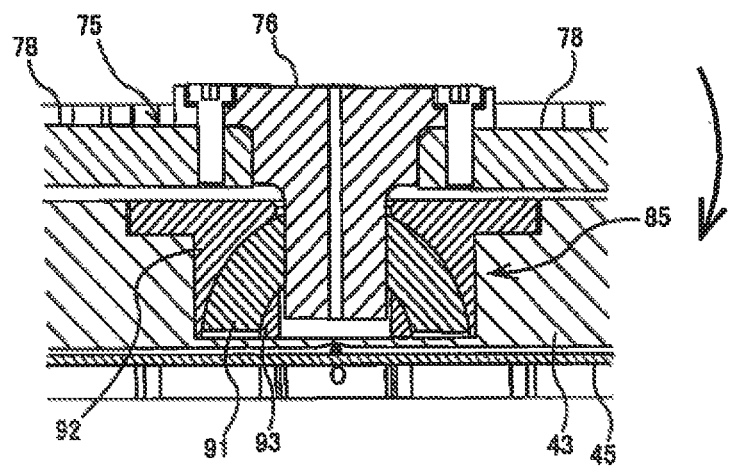
FIG. 6B is a view showing a manner in which the coupling member tilts in unison with an intermediate bearing ring in one direction.
Figure 6C:
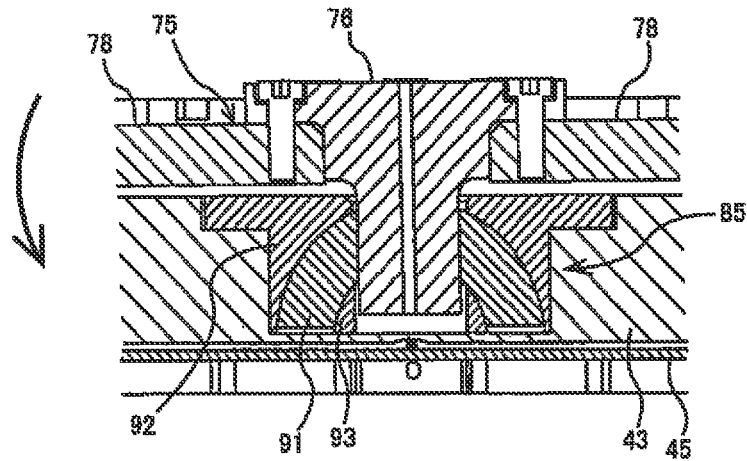
FIG. 6C is a view showing a manner in which the coupling member tilts in unison with the intermediate bearing ring in the other direction.

FIG. 6A shows the manner in which the coupling member 75 is vertically moved relative to the spherical bearing 85, and FIGS. 6B and 6C show the manner in which the coupling member 75 tilts in unison with the intermediate bearing ring 91. As shown in FIGS. 6A through 6C, the retaining ring 40, which is coupled to the coupling member 75, is tiltable around the fulcrum O in unison with the intermediate bearing ring 91 and is vertically movable relative to the intermediate bearing ring 91. The fulcrum O, which is the center of the tilting movement, lies on a central axis of the retaining ring 40.

The spherical bearing 85 allows the retaining ring 40 to move vertically and tilt, while restricting the lateral movement (i.e., the horizontal movement) of the retaining ring 40. During polishing of the wafer, the retaining ring 40 receives a lateral force from the wafer (i.e., a force in a radially outward direction of the wafer). This lateral force is generated due to friction between the wafer and the polishing pad 2. The lateral force is received by the spherical bearing 85. Therefore, the spherical bearing 85 serves as a supporting mechanism capable of supporting the lateral force (i.e., the force in the radially outward direction of the wafer) applied to the retaining ring 40 from the wafer due to the friction between the wafer and the polishing pad 2 and capable of restricting the lateral movement of the retaining ring 40 (i.e., capable of fixing the horizontal position of the retaining ring 40).

Since the spherical bearing 85 is arranged in the top ring body 10 and housed in the recess 43b of the carrier 43, wear debris produced from the sliding contact surfaces of the spherical bearing 85 is confined in the top ring body 10 and does not fall onto the polishing surface 2a.

Figure 7:
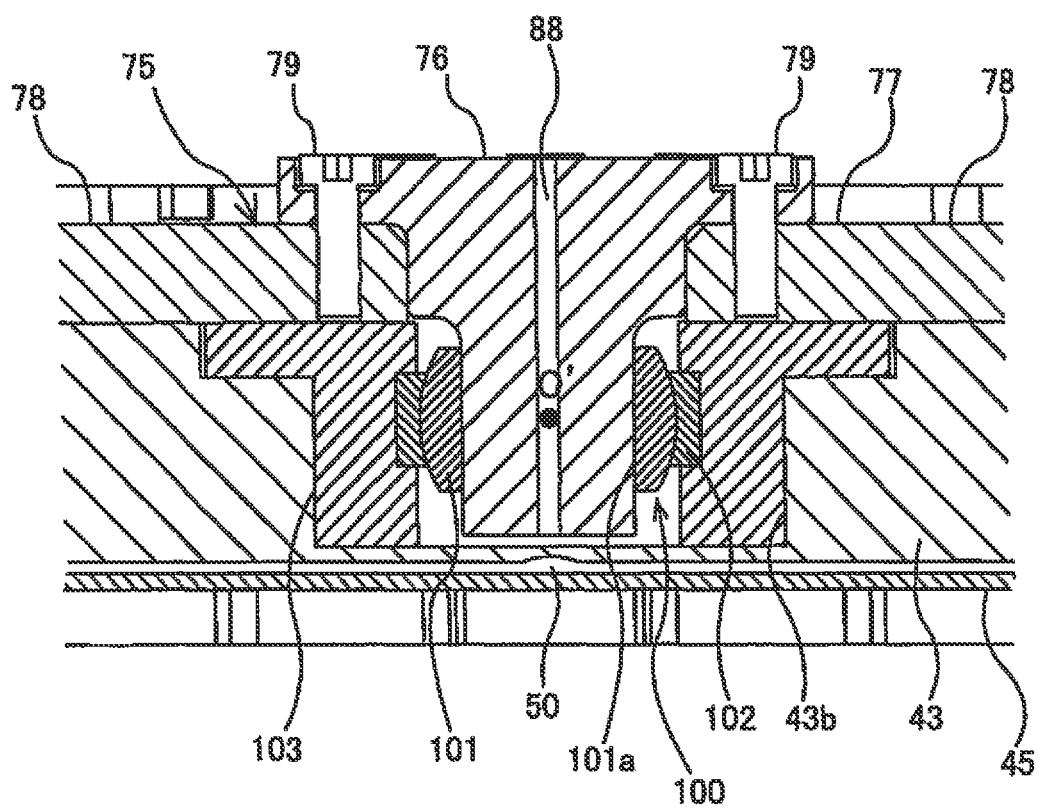
FIG. 7 is a view showing an enlarged cross-sectional view of another example of the spherical bearing.

FIG. 7 shows an enlarged cross-sectional view of another example of the spherical bearing. Components shown in FIG. 7 identical to those shown in FIG. 5 are denoted by the same reference numerals. A spherical bearing 100 shown in FIG. 7 includes an annular inner bearing ring 101, and an annular outer bearing ring 102 which slidably supports an outer circumferential surface of the inner bearing ring 101. The inner bearing ring 101 is coupled to the retaining ring 40 through the coupling member 75. The outer bearing ring 102 is secured to a support member 103, which is secured to the carrier 43. The support member 103 is disposed in the recess 43b which is formed at the central portion of the carrier 43.

The outer circumferential surface of the inner bearing ring 101 has a spherical shape whose upper and lower portions are cut off. A central point (fulcrum) O' of this spherical shape is located at the center of the inner bearing ring 101. The outer bearing ring 102 has an inner circumferential surface which is a concave surface shaped so as to fit the outer circumferential surface of the inner bearing ring 101, so that the outer bearing ring 102 slidably supports the inner bearing ring 101. The inner bearing ring 101 is tiltable in all directions through 360° with respect to the outer bearing ring 102.

The inner bearing ring 101 has an inner circumferential surface which forms a through-hole 101a in which the shaft portion 76 is inserted. The shaft portion 76 is movable relative to the inner bearing ring 101 only in the vertical direction. Therefore, the retaining ring 40, which is coupled to the shaft portion 76, is substantially not allowed to move laterally, i.e., horizontally. That is, the retaining ring 40 is fixed in its lateral position (i.e., its horizontal position) by the spherical bearing 100. As well as the spherical bearing 85, the spherical bearing 100 serves as a supporting mechanism capable of supporting the lateral force (i.e., the force in the radially outward direction of the wafer) applied to the retaining ring 40 from the wafer due to the friction between the wafer and the polishing pad 2 and capable of restricting the lateral movement of the retaining ring 40 (i.e., capable of fixing the horizontal position of the retaining ring 40).

Figure 8A:
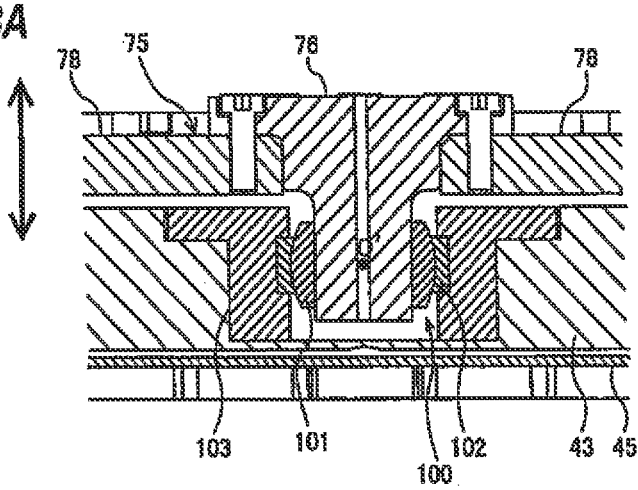
FIG. 8A is a view showing a manner in which the coupling member is vertically moved relative to the spherical bearing.
Figure 8B:
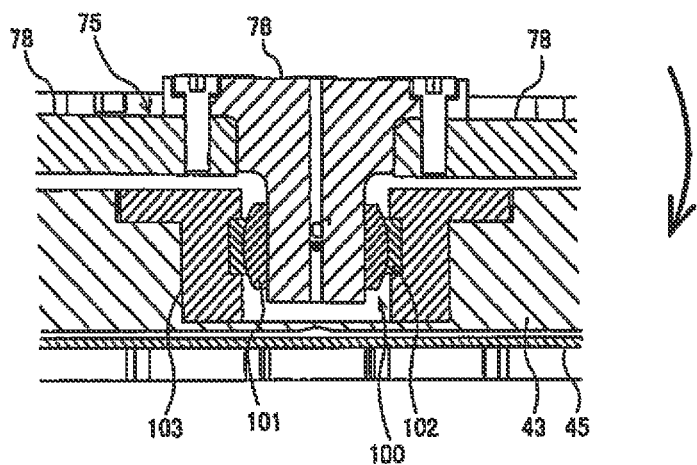
FIG. 8B is a view showing a manner in which the coupling member tilts in unison with an inner bearing ring in one direction.
Figure 8C:
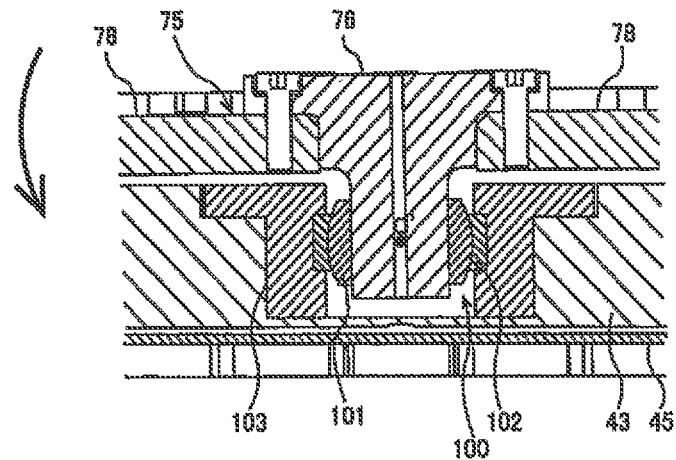
FIG. 8C is a view showing a manner in which the coupling member tilts in unison with the inner bearing ring in the other direction.

FIG. 8A shows the manner in which the coupling member 75 is vertically moved relative to the spherical bearing 100. FIGS. 8B and 8C show the manner in which the coupling member 75 tilts in unison with the inner bearing ring 101. The coupling member 75 and the retaining ring 40 (not shown in FIGS. 8A through 8C) coupled thereto are tiltable around the fulcrum O' in unison with the inner bearing ring 101 and are vertically movable relative to the inner bearing ring 101.

While the spherical bearing 100 shown in FIG. 7 has the same functions as those of the spherical bearing 85 shown in FIG. 5, the fulcrum O' as the center of the tilting movement of the spherical bearing 100 is higher in position than the fulcrum O of the spherical bearing 85. More specifically, the fulcrum O' is located within the spherical bearing 100. The spherical bearing 100 thus constructed still allows the retaining ring 40 to tilt smoothly and positively when the frictional force produced between the wafer and the polishing pad 2 is applied to the retaining ring 40. Since the spherical bearing 100 has the higher fulcrum than that of the spherical bearing 85, the frictional force between the wafer and the polishing pad 2 generates a larger moment that causes the retaining ring 40 to tilt around the fulcrum. Therefore, the retaining ring 40 can tilt more greatly during polishing of the wafer. Use of the spherical bearing 100 may offer a wider controllable range of the tilting movement of the retaining ring 40, and may enable the top ring 1 to control a variety of polishing profiles.

As shown in FIG. 3, the retaining ring 40 has an upper surface extending radially outwardly from the top ring body 10. A local load exerting mechanism 110, which serves to exert a local load on a part of the retaining ring 40, is disposed above the retaining ring 40. FIG. 3 shows an embodiment of the local load exerting mechanism 110. The local load exerting mechanism 110 is fixed to the top ring head 16. While the retaining ring 40 is configured to rotate about its own axis during the polishing process, the local load exerting mechanism 110 does not rotate together with the retaining ring 40 and is fixed in position.

A load transmitting member 111 is fixed to a peripheral upper surface of the retaining ring 40. A guide ring 112 is secured to an upper surface of the load transmitting member 111. The local load exerting mechanism 110 exerts a downward load on a part of the retaining ring 40 through the guide ring 112 and the load transmitting member 11. The load transmitting member 111 may be of a ring shape or may comprise a plurality of columns arranged along a circumferential direction of the drive ring 40b. The downward load of the local load exerting mechanism 110 is transmitted from the guide ring 112 to the retaining ring 40 through the load transmitting member 111. Operations of the local load exerting mechanism 110 are controlled by the polishing controller 9 shown in FIG. 1. The local load exerting mechanism 110 may directly exert a downward local load on the retaining ring 40 without providing the load transmitting member 111 and the guide ring 112.

While the top ring 1 rotates about its own axis, the local load exerting mechanism 110 does not rotate with the top ring 1 because the local load exerting mechanism 110 is secured to the top ring head 16. Specifically, during polishing of the wafer W, the top ring 1 and the wafer W rotate about their own axes, while the local load exerting mechanism 110 is stationary at a predetermined position. In FIG. 3, the single local load exerting mechanism 110 is shown. However, a plurality of local load exerting mechanisms 110 may be installed along a circumferential direction of the top ring 1. These local load exerting mechanisms 110 may be radially spaced from the central axis of the top ring 1 by the same distance or different distances. Installation positions of the local load exerting mechanisms 110 may be variable along the circumferential direction of the top ring 1.

In the embodiment shown in FIG. 3, the local load exerting mechanism 110 includes an air cylinder 114 having a piston 114a, and a wheel 115 coupled to the piston 114a. The air cylinder 114 is fixed to the top ring head 16. The wheel 115 is mounted to a distal end of the piston 114a. When the wheel 115 is lowered by the air cylinder 114, the wheel 115 exerts the load on the guide ring 112.

The wheel 115 is configured to be vertically moved by the air cylinder 114. When the top ring 1 is lowered to bring the retaining ring 40 into contact with the polishing surface 2a, the air cylinder 114 lowers the wheel 115 to exert the local downward local force to a part of the retaining ring 40. Before the top ring 1 moves upward, the air cylinder 114 elevates the wheel 115 away from the guide ring 112. It is possible to change the load of the wheel 115 on the retaining ring 40 by changing pressure of a gas supplied to the air cylinder 114. The wheel 115 is rotatably supported by a non-rotatable wheel shaft 116 disposed centrally so that the wheel 115 can rotate about the wheel shaft 116. The wheel 115 is made of a material having a low coefficient of friction. A bearing, such as a ball bearing, may be interposed between the wheel shaft 116 and the wheel 115.

When the wafer W is being polished, the guide ring 112 rotates about the rotational axis of the top ring 1, but the local load exerting mechanism 110 does not rotate. Therefore, the guide ring 112 moves horizontally relative to the local load exerting mechanism 110. When the wheel 115 is pressed against the guide ring 112, the retaining ring 40 exerts a downward local load (force) to the polishing surface 2a in a direction perpendicular to the polishing surface 2a. Since the wheel 115 is made of a material having a low coefficient of friction, the frictional force that acts between the wheel 115 and the guide ring 112 can be minimized. As a result, an effect on a change in an attitude of the retaining ring 40 due to the frictional force can be minimized. The material having a low coefficient of friction may be a resin material, such as nylon, PTFE (polytetrafluoroethylene), PEEK (polyetheretherketone), PPS (polyphenylene sulfide), or the like, or may be a resin material with fiber, such as carbon fiber, and a solid lubricant added.

Figure 9:
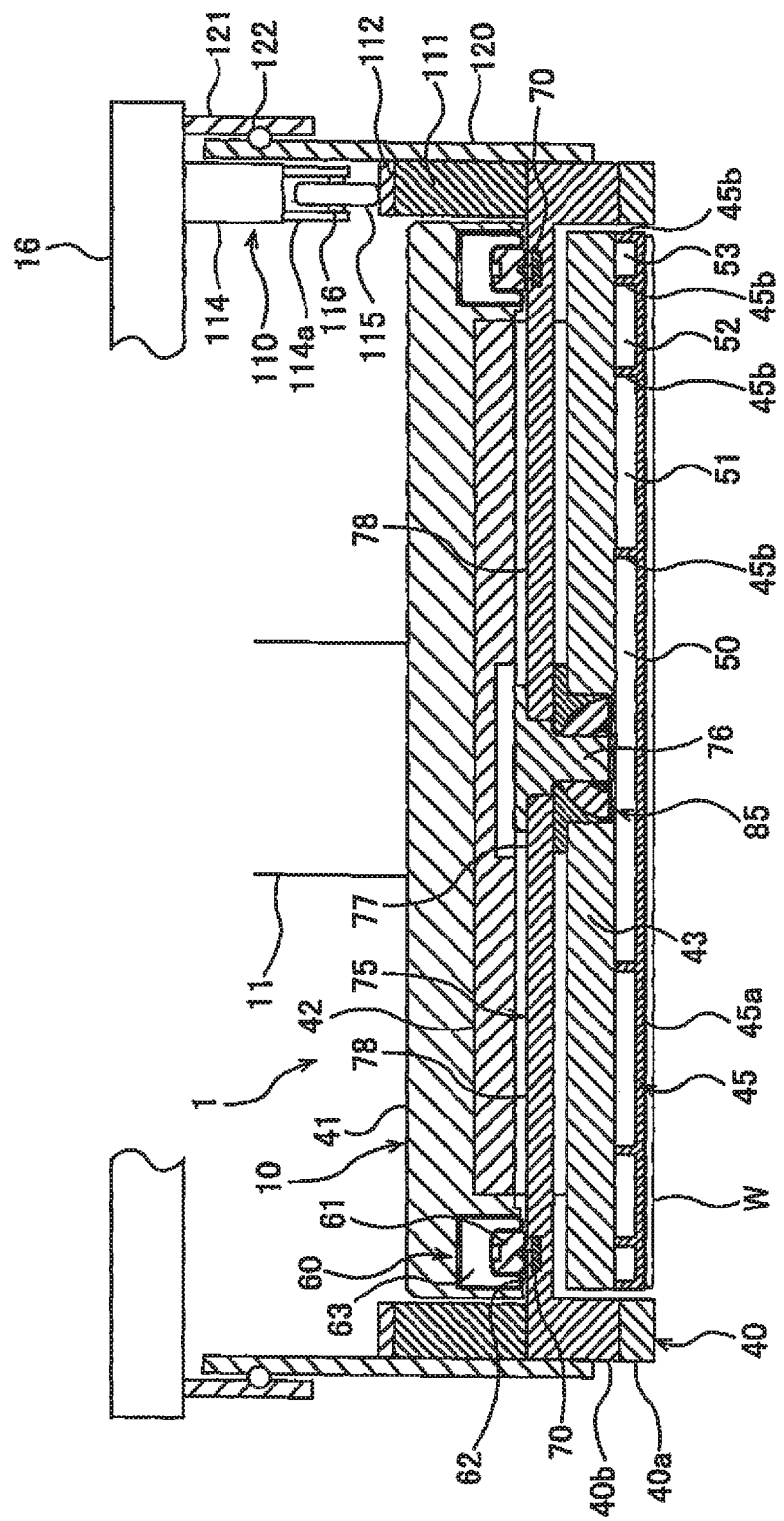
FIG. 9 is a view showing an example in which a rotary cover is provided on the retaining ring and a stationary cover is provided so as to surround the rotary cover.

As shown in FIG. 9, it is preferable to provide a cylindrical rotary cover 120 on the retaining ring 40 and to provide a cylindrical stationary cover 121 so as to surround the rotary cover 120. The rotary cover 120 is fixed to an outer circumferential surface of the retaining ring 40, while the stationary cover 121 is fixed to the top ring head 16. A seal member 122 is interposed between the rotary cover 120 and the stationary cover 121, isolating a space above the top ring 1 from a polishing space in which the polishing surface 2a exists. The covers 120 and 121 and the seal member 122 can prevent droplets of the polishing liquid or other liquid from adhering to sliding elements, such as the wheel 115, and can further prevent particles, which may be produced from the wheel 115, from falling onto the polishing surface 2a. Instead of the seal member 122, a labyrinth structure may be used to prevent the particles from falling onto the polishing surface 2a and prevent the droplets from entering the polishing space. Such a labyrinth structure may be constructed by the covers 120 and 121, one of which is radially superposed on the other.

The retaining ring 40 is supported by the spherical bearing 85 (or 100) arranged on the rotational axis of the top ring 1. This spherical bearing 85 (or 100) allows the retaining ring 40 to tilt smoothly and move in the vertical direction independently of the top ring body 10. During polishing of the wafer W, the retaining ring 40 on the polishing surface 2a tilts around the fulcrum as a result of receiving the frictional force of the wafer W. More specifically, the retaining ring 40 on the polishing pad 2 tilts such that it sinks into the polishing pad 2 at an upstream side of the wafer W (i.e., at an incoming polishing-surface side) while it rises from the polishing pad 2 at a downstream side of the wafer W (i.e., at an outgoing polishing-surface side). The local load exerting mechanism 110 exerts the local load on the tilted retaining ring 40 to make it possible to control the tilt of the retaining ring 40. For example, when the local load is exerted on a part of the retaining ring 40 downstream of the wafer W, the tilt of the retaining ring 40 can be reduced while the wafer W is being polished.

By controlling the tilt of the retaining ring 40 in this manner, it is possible to change the polishing profile of the wafer edge portion as a result of changes in a surface pressure distribution of the retaining ring 40, a deformed state of the polishing pad 2, a deformed state of the wafer W that is pressed against the retaining ring 40 by the frictional force, and a deformed state of the retaining ring 40 subjected to the frictional force. The edge portion of the wafer W is an annular region having a width ranging from 3 mm to 10 mm at the outermost circumferential edge of the wafer W.

Controlling the tilt of the retaining ring 40 can further change a distribution of the polishing liquid that is supplied to the lower surface of the wafer W through a gap between the retaining ring 40 and the polishing surface 2a. As a result, the polishing rate and the polishing profile of the surface of the wafer W in its entirety can be controlled. Only the local load exerting mechanism 110 may be used to press the retaining ring 40. Alternatively, the retaining ring pressing mechanism 60 may be used to press the retaining ring 40 uniformly, while the local load exerting mechanism 110 is additionally exerting the local load on the retaining ring 40.

An example of the polishing profile control using the local load exerting mechanism 110 will be described below. In this example, the wafer W is polished under a first polishing condition and a second polishing condition described below. The first polishing condition is that the retaining ring 40 is pressed against the polishing pad 2 at a surface pressure P1 only by the retaining ring pressing mechanism 60 without using the local load exerting mechanism 110. The second polishing condition is that the retaining ring 40 is pressed against the polishing pad 2 at the surface pressure P1 by the retaining ring pressing mechanism 60 and further pressed against the polishing pad 2 at a surface pressure P2 by the local load exerting mechanism 110.

Under the second polishing condition, since the local load is applied to the retaining ring 40, the attitude of the retaining ring 40 is changed and particularly the polishing profile of the edge portion of the wafer W is changed, as compared with the case of polishing the wafer W under the first polishing condition. Under the second polishing condition, the total surface pressure applied from the retaining ring 40 to the polishing surface 2a is P1+P2, which is greater than the surface pressure P1 applied under the first polishing condition. If the surface pressure applied by the retaining ring pressing mechanism 60 under the second polishing condition is changed from P1 to P1−P2, then the total surface pressure applied from the retaining ring 40 to the polishing surface 2a is P1, which is the same as the surface pressure P1 applied from the retaining ring 40 under the first polishing condition. In such a case, while the same surface pressure of the retaining ring 40 as the surface pressure applied under the first polishing condition is maintained, the polishing profile can be obtained under the different condition in terms of the attitude of the retaining ring 40. For controlling the polishing profile of the edge portion of the wafer W, the surface pressure applied by the retaining ring pressing mechanism 60 under the second polishing condition is preferably in the range of P1−2.5×P2 to P1−0.5×P2, and more preferably in the range of P1−1.8×P2 to P1−1.2×P2.

The retaining ring 40 is tiltable and vertically movable relative to the substrate holding surface 45a and the wafer W held thereon, and is capable of pressing the polishing pad 2 independently of the wafer W. Therefore, when the local load exerting mechanism 110 presses a part of the retaining ring 40 downwardly, the wafer W does not tilt and the pressure applied from the substrate holding surface 45a to the wafer W remains unchanged. Therefore, the local load exerting mechanism 110 can control the attitude of the retaining ring 40 independently of the attitude of the wafer W and the pressure acting on the wafer W. In other words, it is possible to control the polishing profile by controlling the attitude of the retaining ring 40 while keeping the pressure applied from the substrate holding surface 45a to the wafer W constant.

The retaining ring 40 is pressed against the polishing pad 2 while rotating in unison with the wafer W held by the top ring 1. Since the retaining ring 40 and the wafer W are rotating during the polishing process, the region of the polishing surface 2a contacting the retaining ring 40 and the wafer W changes gradually as the polishing table 3 rotates. Therefore, a particular region of the polishing pad 2 is prevented from remaining in contact only with a particular area of the wafer W. As a result, the surface of the wafer W can be uniformly polished. For the same reason, the retaining ring 40 is prevented from being locally worn away.

An inside diameter of the retaining ring 40 is larger than a diameter of the wafer W. Therefore, as the top ring 1 rotates, a relative position between the retaining ring 40 and the wafer W in the circumferential direction changes gradually in a sun-and-planet motion. As a result, the effect of the flatness of the retaining ring 40 can be averaged so that the flatness of the retaining ring 40 does not affect any certain circumferential position of the wafer W. As a consequence, the surface of the wafer W can be polished uniformly, especially over the circumferential direction thereof.

Figure 10:
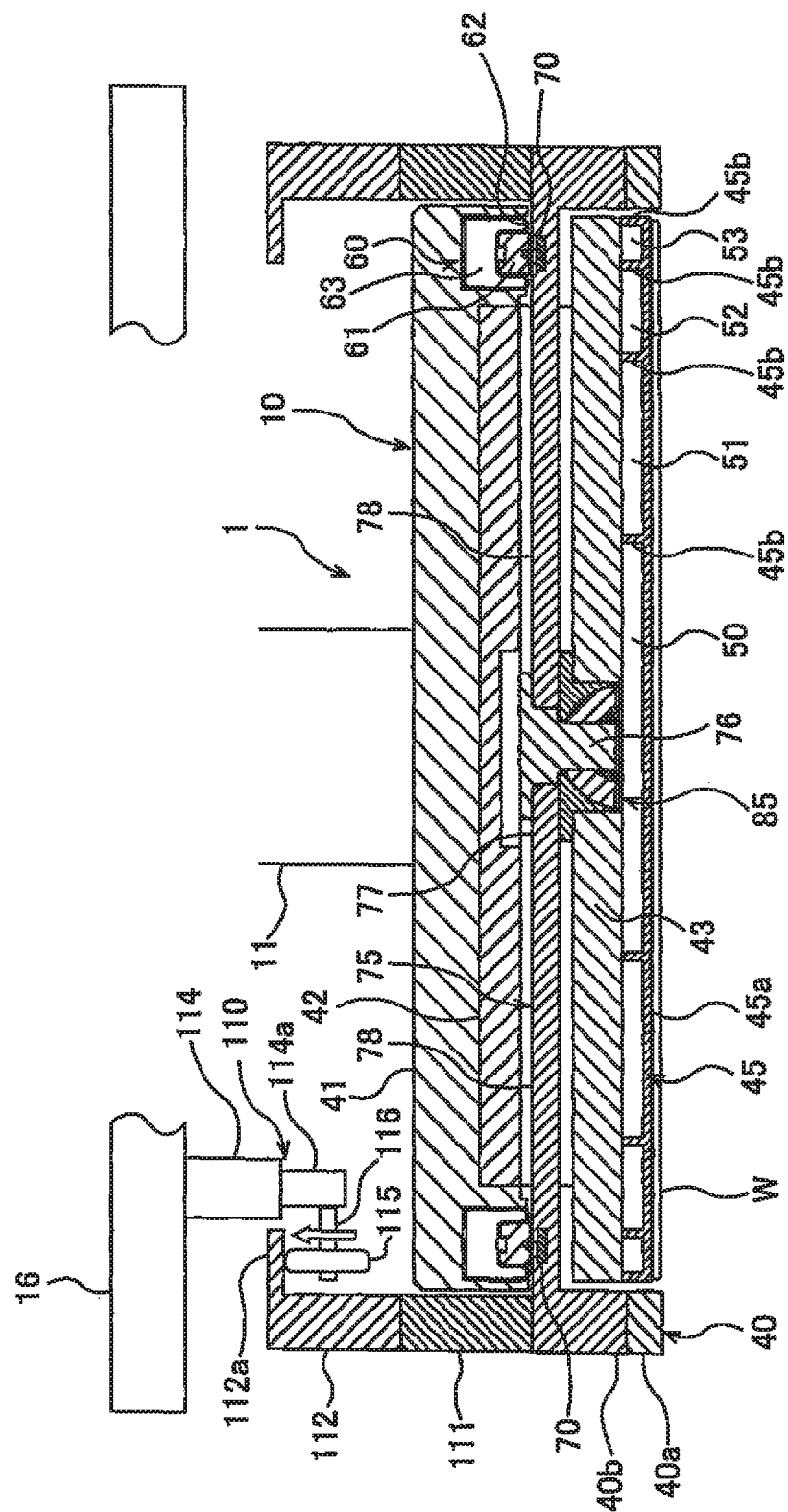
FIG. 10 is a view showing another embodiment of a local load exerting mechanism.

FIG. 10 shows the local load exerting mechanism 110 according to another embodiment. Structures that are not described particularly in this embodiment are identical to those of the previously-discussed embodiment shown in FIG. 3 and their repetitive descriptions are omitted. In this embodiment, the local load exerting mechanism 110 exerts an upward local load (force) on a part of the retaining ring 40 in a direction perpendicular to the polishing surface 2a. As shown in FIG. 10, guide ring 112 supported by load transmitting member 111 has an annular ledge 112a projecting inwardly in the radial direction of the top ring 1. The local load exerting mechanism 110 has wheel 115 that is held in rolling contact with a lower surface of the annular ledge 112a and air cylinder 114 for elevating the wheel 115.

The wheel 115 is rotatably supported by wheel shaft 116, which is mounted to piston 114a of the air cylinder 114. The wheel 115 is coupled to the air cylinder 114 via the wheel shaft 116. The air cylinder 114 elevates the wheel 115 to push the annular ledge 112a upwardly, exerting an upward local load on a part of the retaining ring 40 perpendicularly to the polishing surface 2a. The local load exerting mechanism 110 according to the embodiment shown in FIG. 10 offers the same effects as the local load exerting mechanism 110 according to the embodiment shown in FIG. 3.

An example of the polishing profile control using the local load exerting mechanism 110 shown in FIG. 10 will be described below. In this example, the wafer W is polished under a first polishing condition and a second polishing condition described below. The first polishing condition is that the retaining ring 40 is pressed against the polishing pad 2 at a surface pressure P1 only by the retaining ring pressing mechanism 60, without using the local load exerting mechanism 110. The second polishing condition is that the retaining ring 40 is pressed against the polishing pad 2 at the surface pressure P1 by the retaining ring pressing mechanism 60 and further an upward local load is exerted on the retaining ring 40 by the local load exerting mechanism 110 such that the surface pressure applied to the polishing pad 2 is reduced by a surface pressure P2.

Under the second polishing condition, since the local load is applied to the retaining ring 40, the attitude of the retaining ring 40 is changed and particularly the polishing profile of the edge portion of the wafer W is changed, as compared with the case of polishing the wafer W under the first polishing condition. Under the second polishing condition, the total surface pressure applied from the retaining ring 40 to the polishing surface 2a is P1−P2, which is smaller than the surface pressure P1 applied under the first polishing condition. If the surface pressure applied by the retaining ring pressing mechanism 60 under the second polishing condition is changed from P1 to P1+P2, then the total surface pressure applied from the retaining ring 40 to the polishing surface 2a is P1, which is the same as the surface pressure P1 applied from the retaining ring 40 under the first polishing condition. In such a case, while the same surface pressure of the retaining ring 40 as the surface pressure applied under the first polishing condition is maintained, the polishing profile can be obtained under the different condition in terms of the attitude of the retaining ring 40. For controlling the polishing profile of the edge portion of the wafer W, the surface pressure applied by the retaining ring pressing mechanism 60 under the second polishing condition is preferably in the range of P1+0.5×P2 to P1+2.5×P2, and more preferably in the range of P1+1.2×P2 to P1+1.8×P2.

Figure 11:
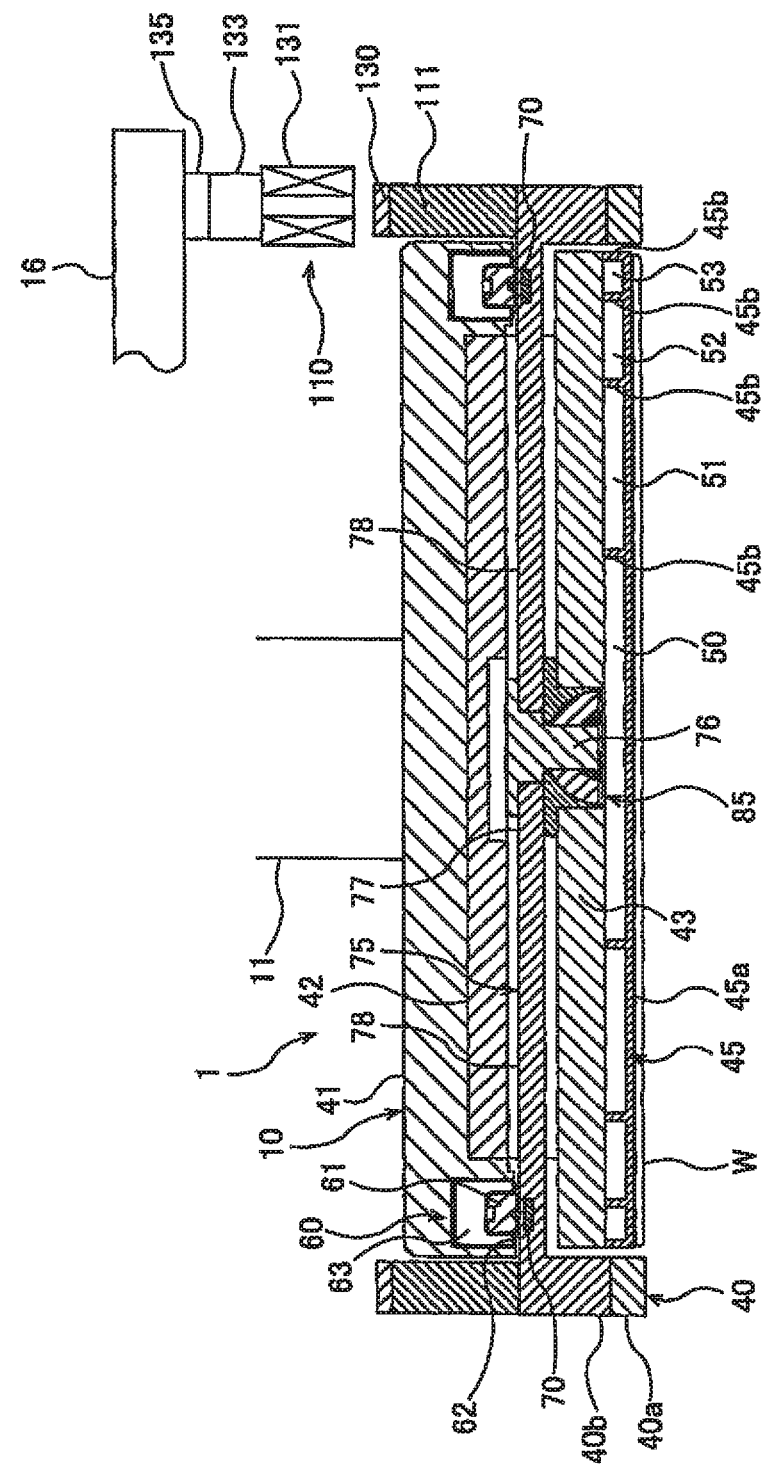
FIG. 11 is a view showing still another embodiment of the local load exerting mechanism.

FIG. 11 shows the local load exerting mechanism 110 according to still another embodiment. Top ring 1 shown in FIG. 11 is identical in structure to the top ring 1 shown in FIG. 3, and its repetitive descriptions are omitted. In this embodiment, the local load exerting mechanism 110 includes a permanent magnet 130 instead of the guide ring 112 shown in FIG. 3, and an electromagnet 131 instead of the wheel 115 shown in FIG. 3. The permanent magnet 130 is supported by load transmitting member 111 fixed to the retaining ring 40. The electromagnet 131 is arranged so as to face the permanent magnet 130 arranged above the retaining ring 40. The local load exerting mechanism 110 is capable of exerting a vertical local load on a part of the retaining ring 40 via a magnetic force acting between the electromagnet 131 and the permanent magnet 130.

When the electromagnet 131 generates a magnetic force with the same magnetic pole as the permanent magnet 130, the local load exerting mechanism 110 can exert a downward local load (repulsive force) on the retaining ring 40. When the electromagnet 131 generates a magnetic force with a magnetic pole opposite to the permanent magnet 130, the local load exerting mechanism 110 can exert an upward local load (attractive force) on the retaining ring 40. In this manner, the electromagnet 131 can selectively exert a downward load or an upward load on a part of the retaining ring 40. Controlling the load on the retaining ring 40 makes it possible to change the attitude of the retaining ring 40. As a result, the polishing profile of the wafer W, especially the polishing profile of the wafer edge portion, can be controlled. While the permanent magnet 130 is arranged above the retaining ring 40 in the present embodiment, the permanent magnet 130 may be replaced with a magnetic member, and the electromagnet 131 may attract the magnetic member to exert an upward local load (force) on the retaining ring 40.

The electromagnet 131 is supported by an elevating mechanism 133 which is coupled to the top ring head 16. The elevating mechanism 133 may be constituted by an air cylinder or a mechanism including a ball screw and a servomotor. If the lowered position of the electromagnet 131 is to be controlled precisely as described below, it is preferable to use the mechanism including the ball screw and the servomotor as the elevating mechanism 133.

With the retaining ring 40 in contact with the polishing surface 2a, the elevating mechanism 133 lowers the electromagnet 131 to a position near the permanent magnet 130, and then the electromagnet 131 is energized to exert a local force on a part of the retaining ring 40. The force applied to the retaining ring 40 can be changed by varying the magnetic force generated by the electromagnet 131 and/or a distance between the permanent magnet 130 and the electromagnet 131. If a relationship between the distance of the permanent magnet 130 from the electromagnet 131, electric current supplied to the electromagnet 131, and magnetic force corresponding to the supplied electric current and the distance is obtained in advance, it is possible to determine the magnetic force generated by the electromagnet 131 from the electric current supplied to the electromagnet 131 and the distance between the permanent magnet 130 and the electromagnet 131.

In the present embodiment, the local load exerting mechanism 110 is configured to exert the local load via the magnetic force. In order to prevent a magnetic field from adversely affecting other parts, magnetic shielding materials may be used to constitute components of the top ring 1, such as the top ring body 10, or may be used to cover those components. The adverse effects of the magnetic field include destruction of semiconductor devices of the wafer W caused by a large electric current induced in fine electric interconnects of the semiconductor devices, and a decrease in an accuracy of the eddy current sensor that obtains the film-thickness signal of the metal film from the polishing-surface side.

Typically, every time a wafer W is polished, the polishing surface 2a of the polishing pad 2 is conditioned by a dresser that uses diamond particles or the like. Therefore, each time a wafer W is polished, the polishing pad 2 is worn and the distance between the electromagnet 131 and the permanent magnet 130 increases gradually. Since the retaining ring 40 is placed in sliding contact with the polishing pad 2 while the wafer W is being polished, a pad contact surface of the retaining ring 40 is also worn gradually, and as a result the distance between the electromagnet 131 and the permanent magnet 130 increases gradually. Because the local load applied to the retaining ring 40 greatly depends on the gap between the electromagnet 131 and the permanent magnet 130, it is highly important to keep the gap between the electromagnet 131 and the permanent magnet 130 constant regardless of a change in the height of the polishing pad 2 and the retaining ring 40, both of which are consumables. For example, when the height of the polishing pad 2 is reduced by ΔH, the position of the electromagnet 131 is lowered by ΔH by the elevating mechanism 133. The change in the gap between the electromagnet 131 and the permanent magnet 130 may be determined by a process of measuring amounts of wear of a polishing pad and a retaining ring as disclosed in Japanese laid-open patent publication No. 2006-128582 and Japanese laid-open patent publication No. 2006-255851.

As the polishing pad 2 is worn, it is necessary to change the height of the top ring 1 when polishing the wafer W (which will hereinafter be referred to as "polishing position"). This polishing position of the top ring 1 can be adjusted using the vertically moving mechanism 27. The lowered position of the electromagnet 131 is adjusted in accordance with the change in the polishing position of the top ring 1.

In the present embodiment, a load cell 135 is disposed between the top ring head 16 and the elevating mechanism 133. The load cell 135 is capable of measuring a force that varies according to the local load applied to the retaining ring 40. The force that varies according to the local load is a force determined by subtracting weights of suspended components including the elevating mechanism 133 and the electromagnet 131, which are suspended from the load cell 135, from the repulsive force acting between the magnets 130 and 131. The weights of the suspended elements are measured beforehand. The force measured by the load cell 135 changes at the same rate as a rate of change in the local load applied to the retaining ring 40. It is possible to determine the load that is actually exerted from the local load exerting mechanism 110 on the retaining ring 40 during polishing of the wafer by adding the weights of the suspended components to the force measured by the load cell 135.

If the measurement result is different from a desired load, the electric current supplied to the electromagnet 131 is controlled so as to adjust the magnetic force. The magnetic force generated by the permanent magnet 130 may vary with time. In order to correct such a change in the magnetic force, a correction process may be performed which includes the steps of energizing the electromagnet 131 while the wafer W is not polished, calculating the load on the retaining ring 40 at that time, and correcting the electric current supplied to the electromagnet 131 such that a difference between a preset initial load and the present load is eliminated. The corrected electric current can be used in polishing of subsequent wafers W. Although no load cell is shown in FIG. 3, a load cell may be disposed between the top ring head 16 and the air cylinder 114 shown in FIG. 3 as well. In this case also, the actual load can be calculated, and the pressing force of the air cylinder 114 can be corrected based on the difference between the calculated load and the initial value of the load.

According to the embodiment shown in FIG. 11, the local load exerting mechanism 110 does not include sliding parts, such as the guide ring 112 and the wheel 115 shown in FIG. 3, and can thus exert a force on the retaining ring 40 without physical contact. Therefore, the local load exerting mechanism 110 according to this embodiment does not need the covers 120 and 121 for covering the top ring 1 as shown in FIG. 3. This embodiment with no covers 120 and 121 enables easy maintenance, such as replacement of the consumables of the top ring 1. The permanent magnet 130 may be a neodymium magnet. The permanent magnet 130 may be an integrally-formed ring-shaped magnet, a ring-shaped assembly of a plurality of separate permanent magnets, or a plurality of separate permanent magnets embedded in a ring-shaped member. The permanent magnet 130 may have its surface protected against corrosion by coating or plating. Instead, the permanent magnet 130 may be covered with a corrosion-resistant magnetic material, such as magnetic stainless steel.

Figure 12:
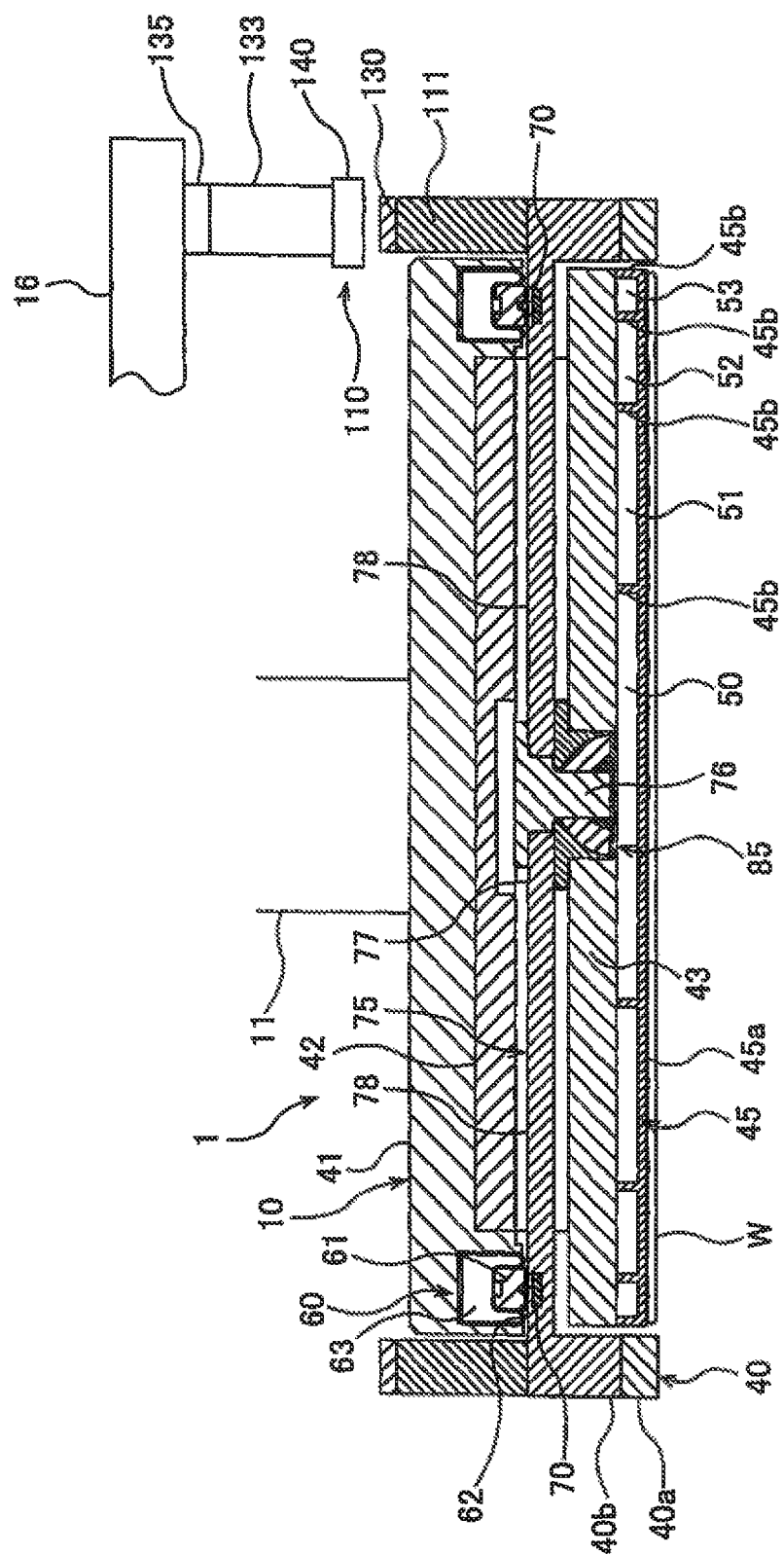
FIG. 12 is a view showing still another embodiment of the local load exerting mechanism.

FIG. 12 shows the local load exerting mechanism 110 according to yet another embodiment. In this embodiment, a permanent magnet 140 is provided instead of the electromagnet 131 shown in FIG. 11. The permanent magnet 140 is disposed in facing relation to the permanent magnet 130 which is supported by the load transmitting member 111 so that a repulsive force is generated between the permanent magnets 130 and 140. In the present embodiment, an air cylinder is used as the elevating mechanism 133. The air cylinder 133 lowers the permanent magnet 140 with a force that is smaller than the maximum repulsive force acting between the permanent magnets 130 and 140 when a gap between the permanent magnets 130 and 140 is minimum. This is for the purpose of preventing the upper permanent magnet 140 from contacting the lower permanent magnet 130.

When the gap between the permanent magnets 130 and 140 is large, the upper permanent magnet 140 is lowered, because the downward force of the air cylinder 133 is larger than the repulsive force between the permanent magnets 130 and 140. When the gap between the permanent magnets 130 and 140 is reduced until the repulsive force between the permanent magnets 130 and 140 counterbalances the downward force of the air cylinder 133, the downward movement of the permanent magnet 140 is stopped. At this time, a load corresponding to the downward force generated by the air cylinder 133 is exerted on the retaining ring 40. Consequently, it is possible to regulate the load on the retaining ring 40 by changing the pressure of the gas supplied to the air cylinder 133.

The local load exerting mechanism 110 shown in FIGS. 11 and 12 uses the magnetic force for its operations. However, the local load exerting mechanism 110 is not limited to the above embodiments. For example, an electromagnet may be mounted to the upper surface of the retaining ring 40, or a combination of an electromagnet and an air cylinder may be used to constitute the local load exerting mechanism 110.

Figure 13:
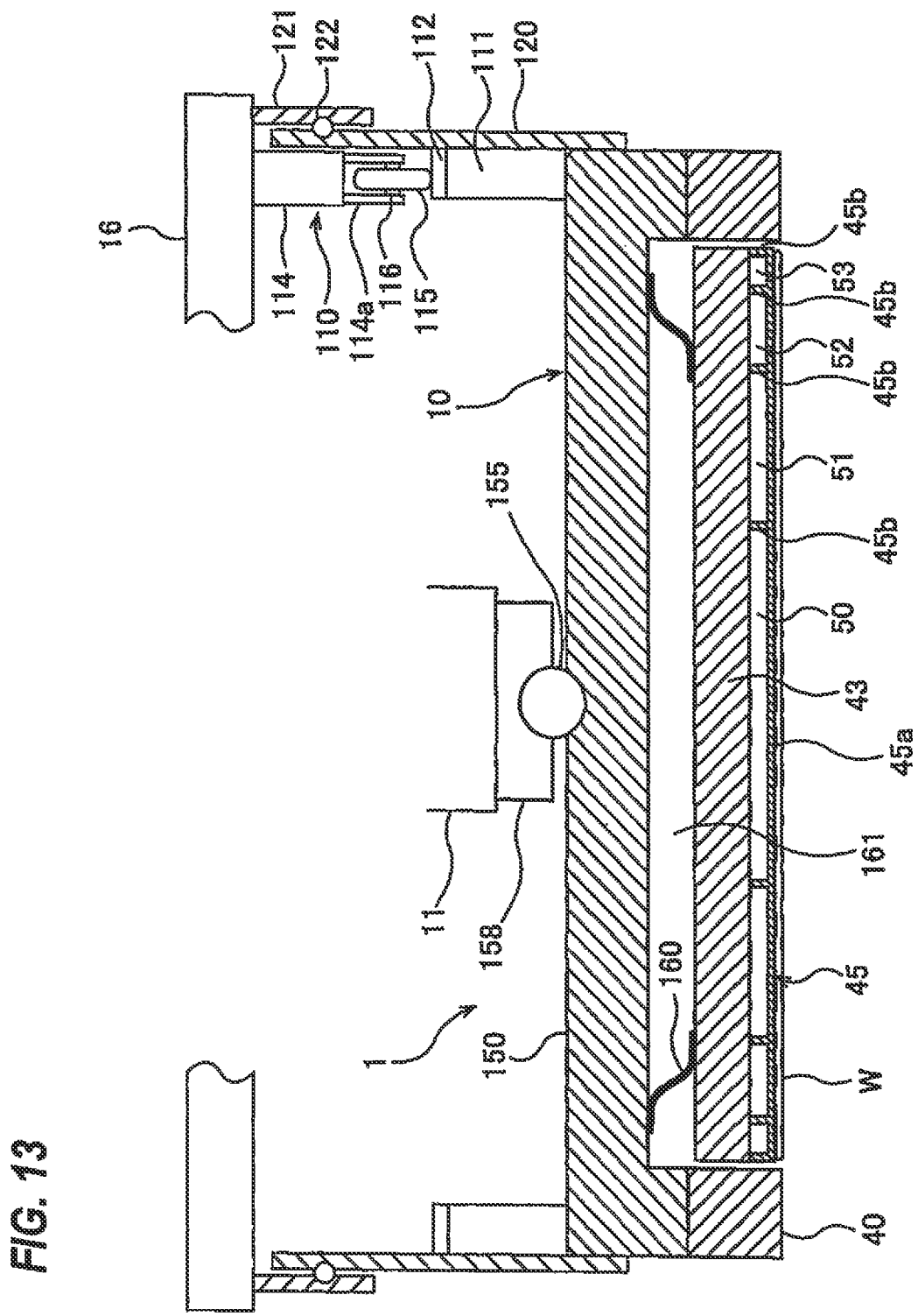
FIG. 13 is a view showing another embodiment of the top ring.

FIG. 13 shows the top ring 1 according to another embodiment. The local load exerting mechanism 110 shown in FIG. 13 includes the air cylinder 114 and the wheel 115 shown in FIG. 3. Alternatively, the local load exerting mechanism 110 having the magnetic components shown in FIG. 11 or 12 may be used. Structures of this embodiment which will not be described particularly are identical to those shown in FIG. 3.

The top ring body 10 includes a top ring base 150 and carrier 43 holding flexible membrane 45. The flexible membrane 45 has a lower surface serving as substrate holding surface 45a for holding a wafer W. A spherical bearing 155 is disposed between the top ring base 150 and a drive flange 158 to allow the top ring base 150 to tilt freely with respect to the drive flange 158. The spherical bearing 155 includes a hard ball made of ceramic or the like.

The retaining ring 40 is fixed to the top ring base 150 and is configured to be tiltable in unison with the top ring base 150. The drive flange 158 is fixed to the lower end of the top ring shaft 11 and rotates in unison with the top ring shaft 11. Rotation of the drive flange 158 is transmitted to the top ring base 150 through a plurality of torque transmitting pins (not shown) that are fixed to the top ring base 150.

The carrier 43, which is separated from the top ring base 150, is coupled to the top ring base 150 by an elastic membrane 160. The carrier 43 is movable vertically and tiltable relative to the top ring base 150. The carrier 43, the top ring base 150, and the elastic membrane 160 jointly form a pressure chamber 161. When the pressure chamber 161 is supplied with a pressurized fluid from the pressure regulator 65 (see FIG. 3), the carrier 43, the flexible membrane 45, and the wafer W are lowered. When negative pressure is developed in the pressure chamber 161 by the pressure regulator 65, the carrier 43, the flexible membrane 45, and the wafer W are elevated.

The top ring base 150 and the retaining ring 40 that are supported by the spherical bearing 155 are tiltable in all directions (360°) relative to the drive flange 158. The center of the tilting movement of the spherical bearing 155 lies on the central axis of the retaining ring 40. The drive flange 158 and the top ring base 150 should desirably be made of a relatively rigid material, such as metal (e.g., stainless steel or aluminum) or ceramic.

The downward load and the torque of the top ring shaft 11 are transmitted to the top ring base 150 through the drive flange 158. Specifically, the downward load of the top ring shaft 11 is transmitted to the top ring base 150 through the drive flange 158 and the spherical bearing 155, and the torque of the top ring shaft 11 is transmitted to the top ring base 150 through the drive flange 158 and the torque transmitting pins (not shown). In this embodiment, the top ring 1 does not have the retaining ring pressing mechanism 60 shown in FIG. 3. Therefore, the retaining ring 40 is tiltable, rotatable, and vertically movable in unison with the top ring base 150.

The local load exerting mechanism 110 is disposed above the retaining ring 40 and the top ring base 150. The local load exerting mechanism 110 exerts a downward local load on a part of the retaining ring 40 through the top ring base 150. The retaining ring 40 is rotatable in unison with the wafer W that is held on the substrate holding surface 45a of the flexible membrane 45, while the retaining ring 40 is tiltable independently of the substrate holding surface 45a. Therefore, when the local load exerting mechanism 110 presses a part of the retaining ring 40 downwardly, the wafer W held on the substrate holding surface 45a W remains unchanged in its attitude.

While the wafer W is being polished, the pressure chambers formed between the flexible membrane 45 and the carrier 43, i.e., the central chamber 50, the ripple chamber 51, the outer chamber 52, and the edge chamber 53 are supplied with the pressurized fluid. Therefore, the top ring body 10 receives an upward reaction force from these pressure chambers 50 through 53. The load of the retaining ring 40 on the polishing pad 2 is determined by subtracting the upward reaction force from the downward load applied through the drive flange 158 to the top ring base 150. It is possible to change the load applied from the retaining ring 40 to the polishing pad 2 by changing the downward load applied from the vertically moving mechanism 27 (see FIG. 2) to the top ring shaft 11. In this embodiment, the vertically moving mechanism 27 may use an air cylinder instead of the combination of the ball screw and the servomotor.

The top ring 1 shown in FIG. 13 may be combined with the magnetic local load exerting mechanism 110 shown in FIG. 11 or FIG. 12. In this case, the change in the gap between the permanent magnet 130 and the electromagnet 131 due to wear of the polishing pad 2 and/or the retaining ring 40 can be determined from a measured value of the height of the top ring 1. Specifically, the change in the gap between the permanent magnet 130 and the electromagnet 131 can be determined from the difference between an initial measured value and a current measured value of the height of the top ring 1. As shown in FIG. 1, the top ring height sensor 39 is mounted to the top ring head 16. This top ring height sensor 39 is configured to measure the height of the top ring 1 based on the position of the bridge 28 which vertically moves in unison with the top ring 1.

As with the above embodiment, the lateral force (i.e., the frictional force acting between the wafer W and the polishing pad 2) that is applied to the retaining ring 40 during polishing of the wafer W is received by the spherical bearing 155. According to the present embodiment, even if a perpendicularity of the top ring shaft 11 to the polishing surface 2a may be slightly shifted, the spherical bearing 155 allows the top ring base 150 to tilt so as to follow the polishing surface 2a. Further, during polishing of the wafer W, the top ring base 150 and the retaining ring 40 can tilt smoothly under the frictional force generated between the wafer W and the polishing pad 2. Since the top ring base 150 is made of a relatively rigid material, such as metal or ceramic, an effect of the deformation of the top ring base 150 can be minimized, and the top ring base 150 is allowed to tilt smoothly by the spherical bearing 155.

The carrier 43 is separated from the top ring base 150 and coupled to the top ring base 150 through the elastic membrane 160. That is, the carrier 43 is in a so-called floating state. The top ring 1 thus constructed allows the retaining ring 40 to tilt independently of the substrate holding surface 45a and the wafer W held thereon, and allows the retaining ring 40 to press the polishing pad 2 independently. Therefore, when the local load exerting mechanism 110 presses a part of the retaining ring 40 downwardly, the wafer W does not tilt, and the pressure applied from the substrate holding surface 45a of the flexible membrane 45 to the wafer W remains unchanged. Therefore, the local load exerting mechanism 110 can control the attitude of the retaining ring 40 without affecting the attitude of the wafer W and the pressure on the wafer W. In other words, it is possible to control the polishing profile by controlling the attitude of the retaining ring 40 while keeping the pressure applied from the substrate holding surface 45a to the wafer W constant.

The retaining ring 40 is pressed against the polishing pad 2 while rotating in unison with the wafer W held by the top ring 1. Since the retaining ring 40 and the wafer W are rotating during the polishing process, the region of the polishing surface 2a contacting the retaining ring 40 and the wafer W changes gradually as the polishing table 3 rotates. Therefore, a particular region of the polishing pad 2 is prevented from remaining in contact only with a particular area of the wafer W. As a result, the surface of the wafer W can be uniformly polished. For the same reason, the retaining ring 40 is prevented from being locally worn away.

The inside diameter of the retaining ring 40 is larger than the diameter of the wafer W. Therefore, as the top ring 1 rotates, the relative position between the retaining ring 40 and the wafer W in the circumferential direction changes gradually due to sun-and-planet motion. As a result, the effect of the flatness of the retaining ring 40 can be averaged so that the flatness of the retaining ring 40 does not affect any certain circumferential position of the wafer W. As a consequence, the surface of the wafer W can be polished uniformly, especially over the circumferential direction thereof.

Figure 14:
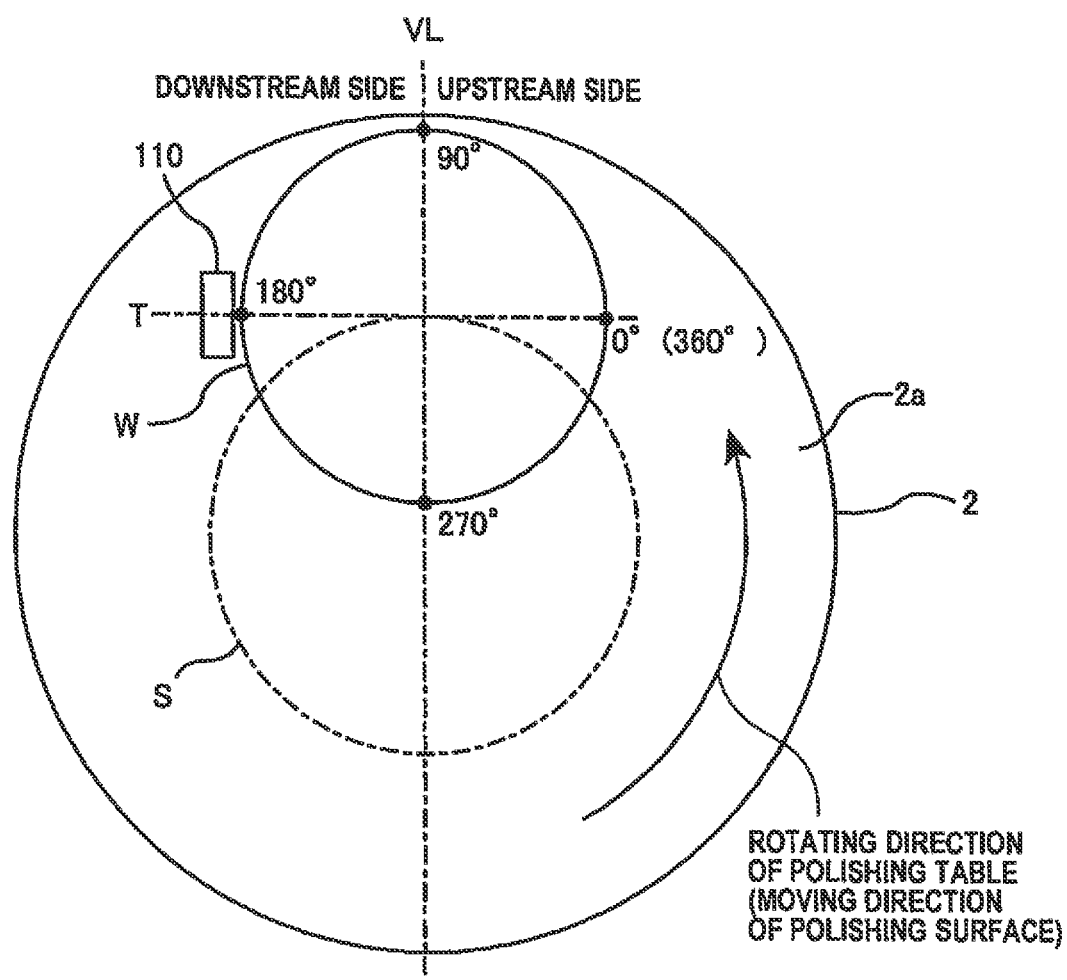
FIG. 14 is a diagram showing a positional relationship as viewed from above a polishing surface.

FIG. 14 is a diagram showing a positional relationship as viewed from above the polishing surface 2a. In FIG. 14, a line interconnecting the center of the wafer W and the center of the polishing surface 2a is defined as a virtual line VL. The polishing surface 2a can be divided into an upstream side of the virtual line VL and a downstream side of the virtual line VL with respect to the rotating direction of the polishing surface 2a. Stated otherwise, the upstream side of the virtual line VL and the downstream side of the virtual line VL are an upstream side of the wafer W and a downstream side of the wafer W with respect to the moving direction of the polishing surface 2a. In FIG. 14, the polishing surface 2a rotates as illustrated. In a polishing apparatus in which the polishing surface is provided by a belt and moves at a constant speed over the surface of the wafer W, it is possible to more easily define the upstream side and the downstream side of the polishing surface.

In FIG. 14, a circle S represents a path of a point on the polishing surface 2a passing through the center of the wafer W as the polishing surface 2a rotates about its central axis. A line T which is tangential to the circle S at the center of the wafer W intersects with a wafer circle at two points. One of the two points that lies at the upstream side is defined as an angle 0°, and the other at the downstream side is defined as an angle 180°. The virtual line VL intersects with the wafer circle at two points. One of the two points which is near the center of the polishing surface 2a is defined as an angle 270°, and the other which is near the peripheral edge of the polishing surface 2a is defined as an angle 90°. The wafer circle represents a peripheral edge of the wafer W.

When the wafer W is being polished, the retaining ring 40, which receives the frictional force from the wafer W, rises from the polishing pad 2 at the downstream side, i.e., in a region around the angle 180°. Conversely, the retaining ring 40 sinks into the polishing pad 2 at the upstream side, i.e., in a region around the angle 0°. When the local load exerting mechanism 110 exerts a downward local load on a downstream part of the retaining ring 40, this load can effectively change the attitude of the retaining ring 40 for controlling the polishing profile. Since the wafer W receives the frictional force from the polishing surface 2a during the polishing process, the wafer W is pressed against an inner circumferential surface of the retaining ring 40. Therefore, the smallest gap between the retaining ring 40 and the wafer W lies in the downstream side. When the local load exerting mechanism 110 increases the downward local load on the retaining ring 40 in the downstream side, the local load exerting mechanism 110 can impart a significant pad rebounding effect on the wafer W. In contrast, when the local load exerting mechanism 110 exerts an upward local load on an upstream part of the retaining ring 40, such an upward local load can effectively change the attitude of the retaining ring 40 for controlling the polishing profile.

Under processing conditions that increase the frictional force between the wafer W and the polishing surface 2a, the retaining ring 40 may rise greatly at the downstream side until the wafer W eventually slips out of the top ring 1. This problem can be solved by exerting a local downward load on the downstream part of the retaining ring 40 to reduce the degree to which the retaining ring 40 rises at the downstream side. As a result, the wafer W can be polished safely. In addition, polishing of the wafer W can be performed safely even under conditions that have been difficult to be applied in the conventional polishing process. For example, even when a high load is exerted on the wafer W or a high frictional force is produced as a result of a combination of the polishing pad 2, the polishing liquid, the wafer W, and the like, the wafer W can be safely polished.

The polishing liquid flows from the upstream side into the top ring 1 as the polishing surface 2a rotates. When a local downward load is exerted on the downstream part of the retaining ring 40 so as to reduce the degree to which the retaining ring 40 sinks into the polishing pad 2 at the upstream side, the polishing liquid can easily flow into the top ring 1. Hence the polishing liquid can effectively be used in polishing of the wafer W. In addition, the polishing rate can increase with a less amount of polishing liquid used, while an increase in polishing temperature is suppressed. Moreover, since the wafer W is polished in the presence of the abundant polishing liquid, it is possible to reduce defects, such as scratch, of the polished wafer W and reduce surface steps of the polished wafer W. In most cases, the local load exerting mechanism 110 configured to exert the downward local load is installed preferably at the downstream side, more preferably in an angular range of 180°±60°.

As described above, types of semiconductor devices and types of consumables have been dramatically increasing in recent years. In this trend, there is a need to establish controllability of a variety of polishing profiles for improvement of a product yield. When the position at which the local load is applied to the retaining ring 40 is changed, the manner of change in the polishing profile is changed. Therefore, the polishing profile can be changed in various ways depending on the installation position of the local load exerting mechanism 110. In some processes, the local load exerting mechanism 110 may preferably be installed in an angular range of 270°±60°, 90°±60°, or 0°±60°.

In order to meet the demands for realizing various polishing profiles, the local load exerting mechanism 110 may be movably installed. According to an embodiment shown in FIG. 15, the local load exerting mechanism 110 is movable through 360° around the center of the top ring 1 by an annular moving mechanism 170 that is mounted to the top ring head 16. This moving mechanism 170 can move the local load exerting mechanism 110 to a desired position. The moving mechanism 170 may include, for example, a motion guide mechanism for enabling a curvilinear motion of the local load exerting mechanism 110 and a servomotor for moving the local load exerting mechanism 110. The position of the local load exerting mechanism 110 may be set and changed according to a polishing recipe for a wafer.

Figure 15:
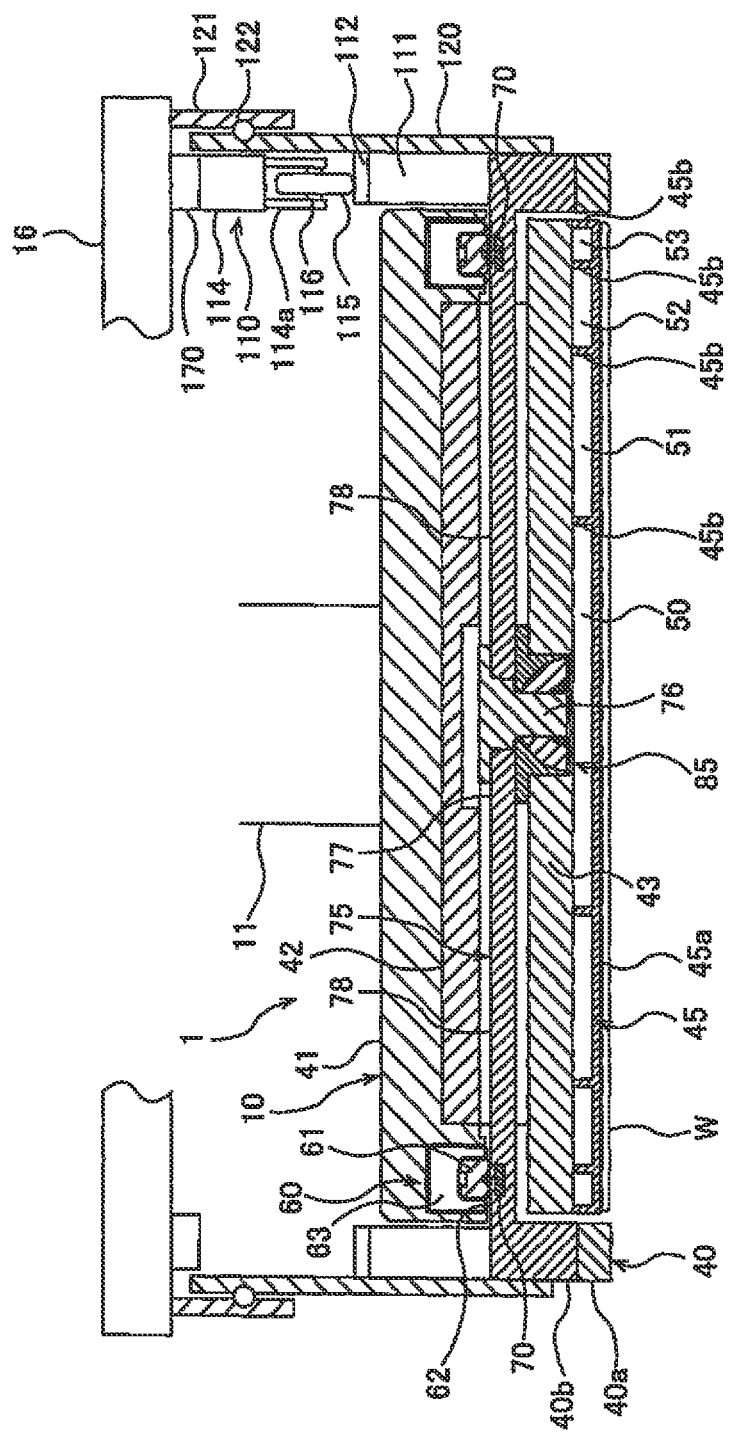
FIG. 15 is a view showing an example in which a moving mechanism for moving the local load exerting mechanism is provided.

Instead of using the moving mechanism 170 shown in FIG. 15, the local load exerting mechanism 110 may be mounted to a desired one of a plurality of predetermined sites on the top ring head 16 by fasteners, such as screws. In this embodiment, the local load exerting mechanism 110 is removably mounted to the top ring head 16 by the fasteners. The moving mechanism 170 and the fasteners that allow the installation position of the local load exerting mechanism 110 to change are also applicable to the embodiments shown in FIGS. 11 through 13.

It is also possible to install a plurality of local load exerting mechanisms 110 along the circumferential direction of the top ring 1. For example, two local load exerting mechanisms 110 may be installed at the downstream side (i.e., the angle 180°) and the polishing-surface center side (i.e., the angle 270°). With this arrangement, the local load exerting mechanisms 110 can control the attitude of the retaining ring 40 about two axes that extend parallel to the polishing surface 2a and perpendicularly to each other. The local load exerting mechanisms 110 thus arranged can control the polishing profile in a wider range, compared with the case of the single local load exerting mechanism 110.

The local load exerting mechanism 110 using the magnetic repulsive force and the magnetic attractive force is advantageous in that the polishing profile control is applicable to a wider range. In the case of using the downward load of the air cylinder or only the magnetic repulsive force, it is preferable to install at least three local load exerting mechanisms 110. If two local load exerting mechanisms 110 each having an air cylinder are installed in two positions, e.g., at the downstream side (i.e., the angle 180°) and the polishing-surface center side (i.e., the angle 270°), the local load exerting mechanism 110 at the polishing-surface center side is capable of changing the attitude of the retaining ring 40 so as to cause the retaining ring 40 to sink into the central region of the polishing pad 2, but is unable to exert a local load on the retaining ring 40 so as to cause the retaining ring 40 to sink into the peripheral region of the polishing pad 2. Therefore, in addition to the two local load exerting mechanisms 110 installed at the downstream side (i.e., the angle 180°) and the polishing-surface center side (i.e., the angle 270°), a local load exerting mechanism 110 is preferably installed at a polishing-surface peripheral side (the angle 90°). Three local load exerting mechanisms 110 may be installed at 120° intervals. The installation positions of plural local load exerting mechanisms 110 may be changed by the moving mechanism 170 shown in FIG. 15.

The structure that allows the change in the installation position of local load exerting mechanisms 110 and the change in the local load on the retaining ring 40 makes it possible to realize a variety of polishing profiles, thus improving a yield of a wide variety of semiconductor devices.

Figure 16:
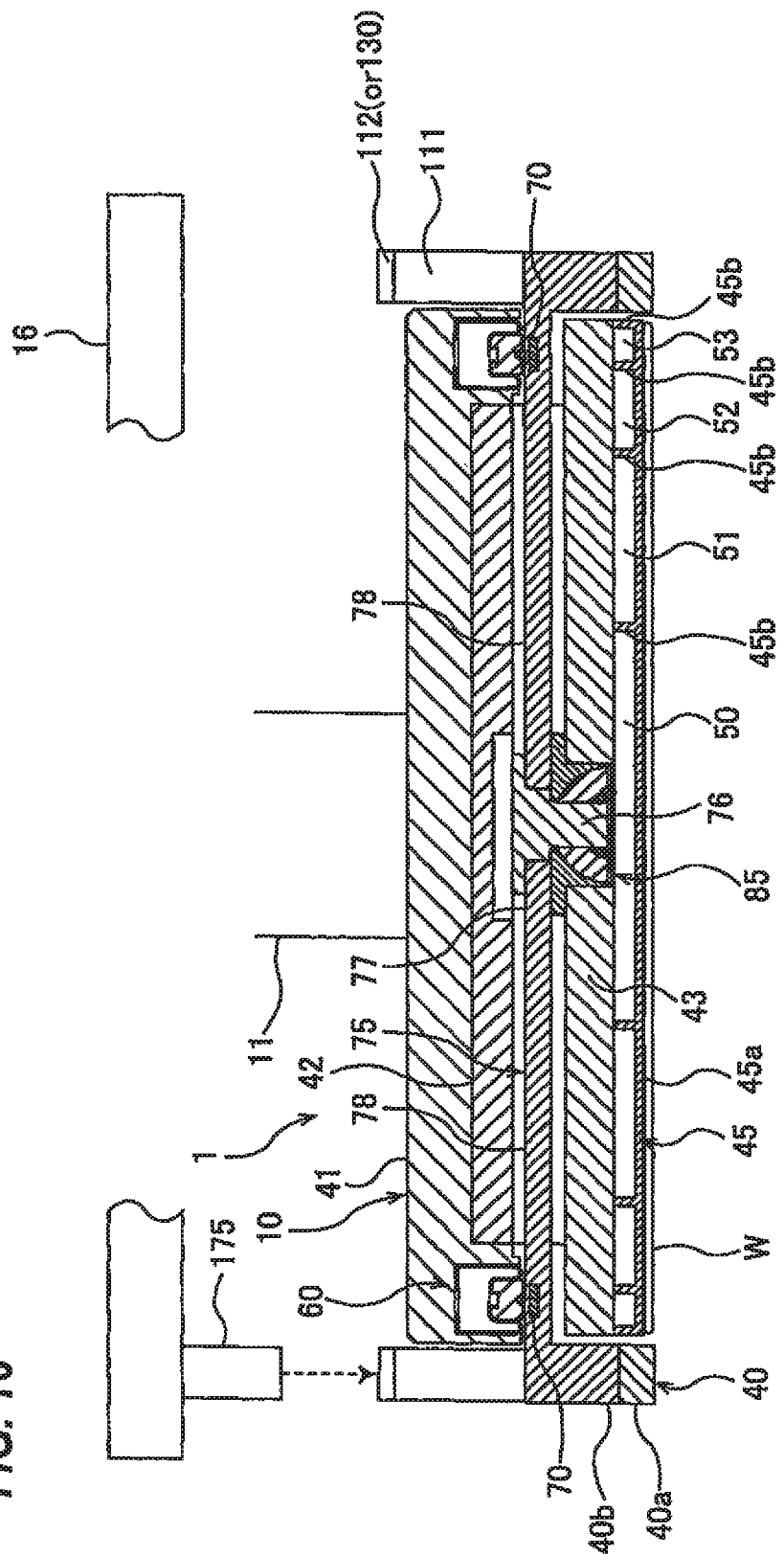
FIG. 16 is a view showing an example in which a retaining ring height sensor is provided.

In an embodiment shown in FIG. 16, in addition to the local load exerting mechanism 110, a retaining ring height sensor 175 is fixed to the top ring head 16. The retaining ring height sensor 175 is capable of measuring a vertical displacement of the retaining ring 40, i.e., the height of the retaining ring 40. Although not shown in FIG. 16, the local load exerting mechanism 110 may include the air cylinder, a combination of the electromagnet and the permanent magnet, or a combination of the permanent magnets as described above, or may be of any other type.

The guide ring 112 has a sensor target surface, which may be in the same location where the local load exerting mechanism 110 exerts a local load, or may be in a different location. Typically, the sensor target surface is a flat surface. While a contact-type displacement sensor may be used as the retaining ring height sensor 175, a non-contact-type displacement sensor capable of measuring the height of the retaining ring 40 in a non-contact manner, such as a laser displacement sensor, is preferably used. If a contact-type displacement sensor is used as the retaining ring height sensor 175, particles may be produced from contact surfaces of a sensor probe and the guide ring 112 and may fall onto the polishing surface 2a, possibly causing defects of the polished wafer. Moreover, the sensor probe which contacts the guide ring 112 may exert a downward load on the retaining ring 40, possibly changing the attitude of the retaining ring 40.

In the embodiments shown in FIGS. 11 and 12, the amount of wear of the polishing pad 2 and/or the amount of wear of the retaining ring 40 can be measured using a process of measuring amounts of wear of a polishing pad and a retaining ring as disclosed in Japanese laid-open patent publication No. 2006-128582 and Japanese laid-open patent publication No. 2006-255851. A change in the height of the retaining ring 40 during the polishing process is calculated from the measured amount of wear of the polishing pad 2 and the measured amount of wear of the retaining ring 40 by the polishing controller 9. The polishing controller 9 feeds the calculated amount of change in the height of the retaining ring 40 back to the elevating mechanism 133 of the local load exerting mechanism 110 to control the elevating mechanism 133 so as to keep the gap between the magnets constant. In the embodiment shown in FIG. 16, the polishing controller 9 may feed the amount of change in the height of the retaining ring 40, which is determined from the measured values sent from the retaining ring height sensor 175, back to the elevating mechanism 133. Based on the measurement result of the height of the retaining ring 40, the magnitude of the local load and/or the position of the local load on the retaining ring 40 (i.e., the position of the local load exerting mechanism 110) may be changed for polishing of the current wafer W or polishing of a next wafer. It is preferable to change the position of the local load on the retaining ring 40 in advance before the next wafer is polished. If a plurality of local load exerting mechanisms 110 are installed, it is possible to change the position of the local load by switching the local load exerting mechanism 110 to be operated from one to another. Alternatively, a plurality of local load exerting mechanisms 110 may be operated simultaneously so as to change a ratio of the magnitudes of the local loads generated by the respective local load exerting mechanisms 110. In this case also, the same effect can be achieved as if the position of the local load exerting mechanism 110 is changed.

In the case where only one retaining ring height sensor 175 is installed, the local load exerting mechanism 110 may be operated such that the measured value of the retaining ring height sensor 175 (i.e., the measured height of the retaining ring 40) is equal to or smaller than a predetermined threshold value. Depending on the installation position of the retaining ring height sensor 175, the local load exerting mechanism 110 may be operated such that the measured value of the height of the retaining ring 40 is equal to or larger than a predetermined threshold value or falls in a predetermined range.

A plurality of retaining ring height sensors 175 may be arranged along the circumferential direction of the top ring 1. In a case of installing two retaining ring height sensors 175, they are disposed in respective positions that are symmetric with respect to the central axis of the top ring 1. Preferably, the two retaining ring height sensors 175 are disposed at an upstream side and a downstream side of the central axis of the top ring 1. A difference in height of the retaining ring 40 between two positions on the retaining ring 40 can be calculated from two measured values obtained from the two retaining ring height sensors 175. The polishing controller 9 may control operation of the local load exerting mechanism 110 such that the calculated difference in the height of the retaining ring 40 lies within a desired range. Preferably, at least three retaining ring height sensors 175 are arranged along the circumferential direction of the top ring 1 in order for the polishing controller 9 to be able to calculate a slope plane of the retaining ring 40. The polishing controller 9 controls operation of the local load exerting mechanism 110 so as to realize a desired slope plane of the retaining ring 40. If the calculated slope plane is different from the desired slope plane, then the load on the retaining ring 40 exerted by the local load exerting mechanism 110 is adjusted.

Instead of controlling the slope plane so as to coincide with the desired plane, the polishing controller 9 may control the local load exerting mechanism 110 using an index calculated from the slope plane. For example, a maximum slope quantity and a maximum slope position may be adjusted to be kept within desired ranges. The maximum slope quantity represents a difference between a maximum height and a minimum height of the retaining ring 40 in the slope plane, and the maximum slope position represents a position of the highest part of the retaining ring 40. For example, if the polishing controller 9 determines that the maximum slope quantity is 0.05 mm and the maximum slope position is 180°, then the polishing controller 9 controls one or more local load exerting mechanisms 110 so that the maximum slope quantity is within a range of 0.03 mm±0.02 mm and the maximum slope position is within a range of 270°±30°. The local load exerting mechanism 110 may have a retaining ring height measuring function, or more specifically, may have a retaining ring height sensor.

Figure 17:
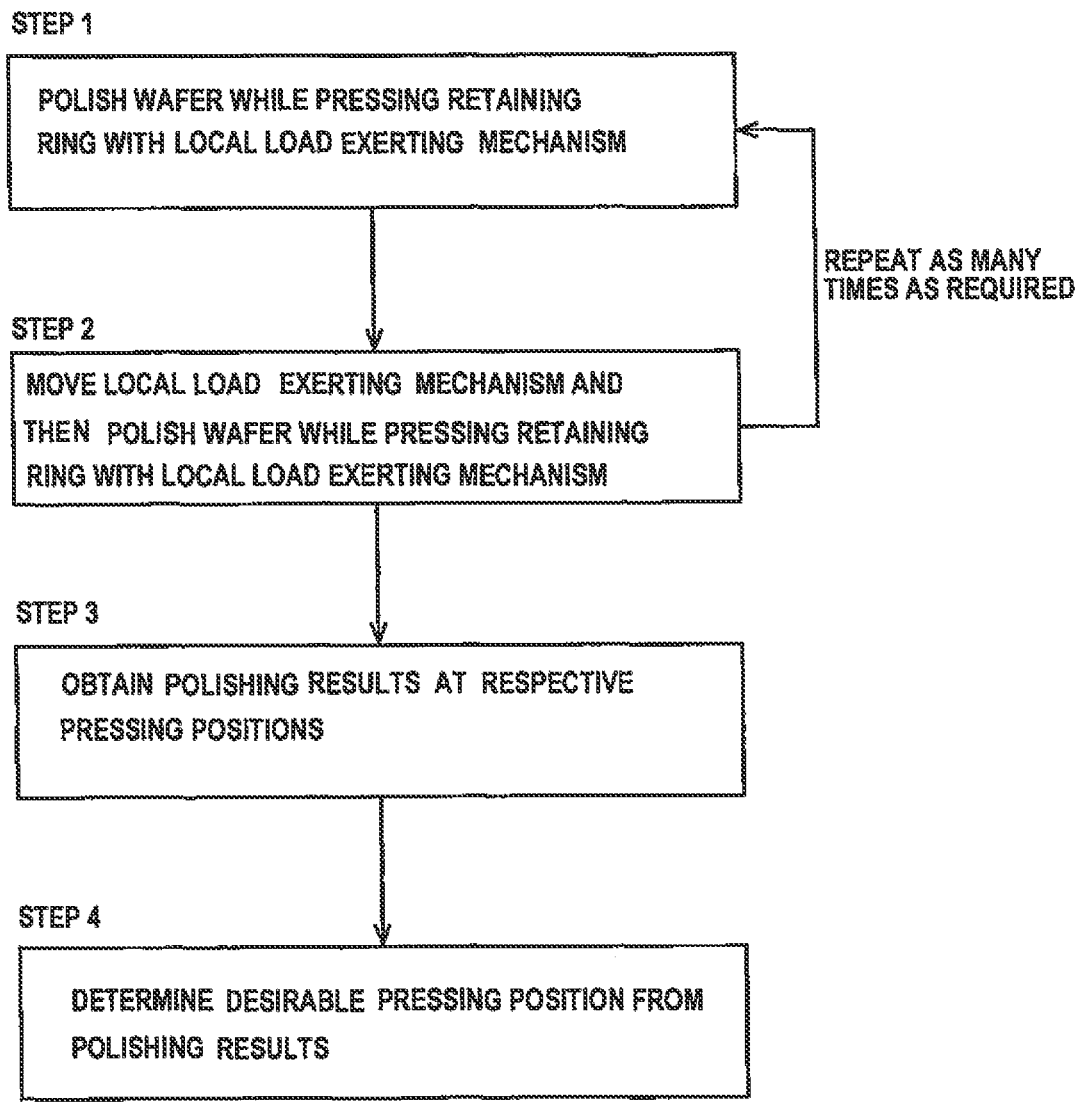
FIG. 17 is a flowchart for illustrating a method of determining a pressing position of the local load exerting mechanism.

A method of determining a desired installation position (pressing position) of the local load exerting mechanism 110 will be described below. FIG. 17 is a flowchart of a method of determining the pressing position of the local load exerting mechanism 110. In step 1, a wafer is polished while the local load exerting mechanism 110 is pressing the retaining ring 40. In step 2, the local load exerting mechanism 110 is moved, and then another wafer is polished while the local load exerting mechanism 110 is pressing the retaining ring 40 at a position different from the position in step 1. Step 1 and step 2 are repeated as many times as required. In step 3, polishing results are obtained at the respective pressing positions. In step 4, a desirable local pressing position is determined from the polishing results.

Typical examples of the "polishing results" include in-plane uniformity of a polishing rate distribution, in-plane uniformity of a remaining film thickness distribution, a polishing profile of a wafer edge portion, a polishing rate, a polishing temperature, defects of a polished wafer (e.g., scratch and foreign matter), flatness characteristics (typically dishing and erosion) of a polished wafer, a frictional force between a wafer and the polishing surface 2a, and a drive current supplied to the polishing table rotating motor 13 which varies due to the frictional force. The "polishing results" thus include items that can be measured and calculated by a sensor and a film thickness measuring device disposed in the polishing apparatus and items that can be acquired by an instrument disposed outside of the polishing apparatus, such as a defect inspection device.

Figure 18:
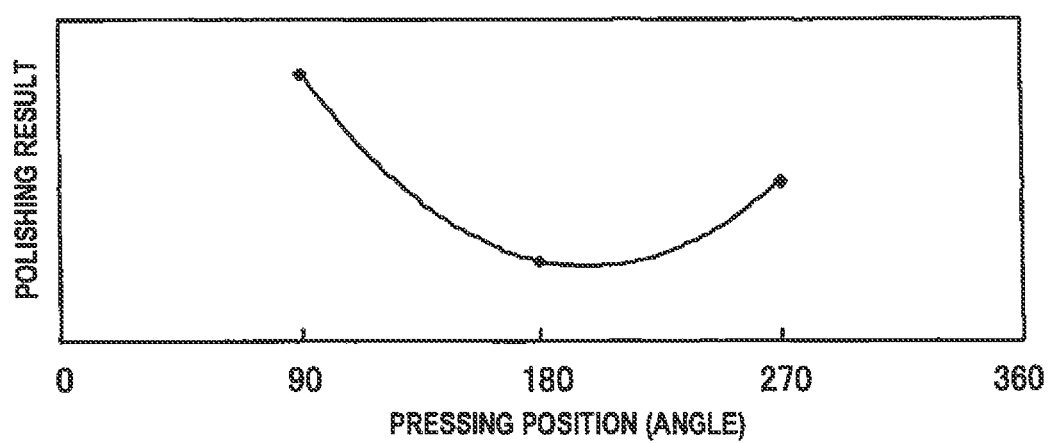
FIG. 18 is a diagram showing another example of a method of determining the pressing position of the local load exerting mechanism.

FIG. 18 is a diagram showing another example of a method of determining the pressing position of the local load exerting mechanism 110. In this reference example, the local load exerting mechanism 110 is operated in each of the pressing positions 90°, 180°, and 270° (corresponding to step 3 of the flowchart). The number of pressing positions may be more than or less than three. The "polishing result" shown in FIG. 18 represents the in-plane uniformity of the remaining film thickness distribution. As shown in FIG. 18, the in-plane uniformity is minimized at the pressing position 180°. Since it is generally desirable that the in-plane uniformity be small, the pressing position 180° is determined to be a desirable pressing position (corresponding to step 4 of the flowchart). The polishing results may be interpolated by linear interpolation or curve approximation for use in determination of the desirable pressing position. FIG. 18 further shows a curve representing the polishing results approximated by a quadratic expression. It can be seen from the curve that the pressing position where the polishing result is minimized is an angle slightly greater than the angle 180°. In this manner, the desirable pressing position can be determined.

Figure 19:
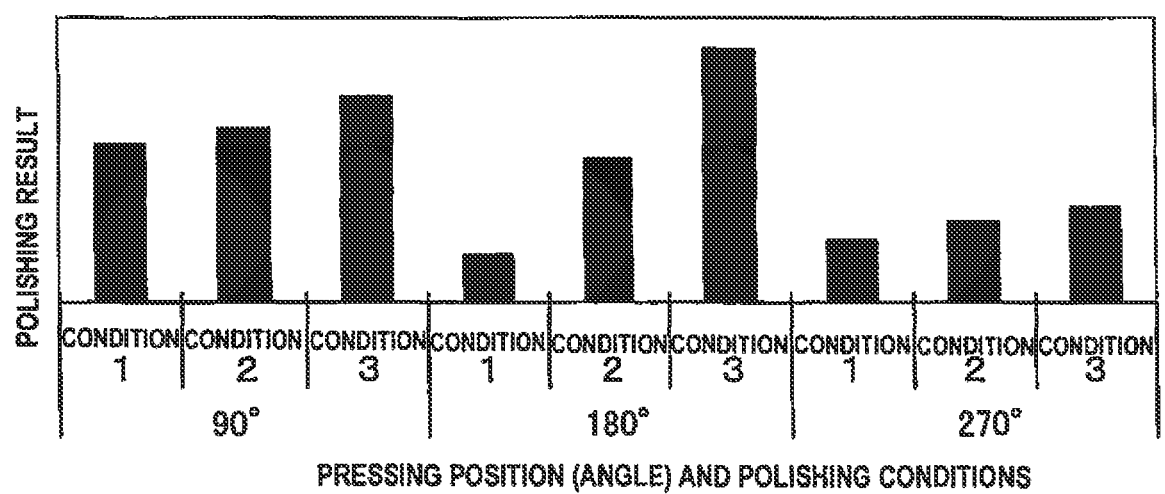
FIG. 19 is a diagram showing still another example of a method of determining the pressing position of the local load exerting mechanism.

FIG. 19 is a diagram showing still another example of a method of determining the pressing position of the local load exerting mechanism 110. In this example shown in FIG. 19, a polishing condition is the local load applied by the local load exerting mechanism 110 to the retaining ring 40. Conditions 1, 2, 3 in FIG. 19 represent different local loads. The polishing result represents the in-plane uniformity of the remaining film thickness distribution.

As shown in FIG. 19, the polishing result obtained under the different polishing conditions (i.e., the conditions 1, 2, 3) changes greatly when the pressing position is 180°. In contrast, the change in the polishing result under the different polishing conditions is small when the pressing position is 90° and 270°. More specifically, the polishing result at the pressing position 90° is large in its entirety, and the polishing result at the pressing position 270° is small in its entirety. Since it is generally desirable that the in-plane uniformity of the remaining film thickness distribution be small, the pressing position 270° where the polishing result is small and stable may be selected.

In the pressing position 180°, the in-plane uniformity varies greatly depending on the polishing condition. This means that the polishing profile varies greatly depending on the polishing condition. In a case where a wide controllable range of the polishing profile is required, such as when various types of semiconductor devices are polished, the angle 180° may be selected as the desirable pressing position. With use of the above-described interpolation, a pressing position which is different from the position where the polishing result was actually obtained may be selected as the desirable pressing position.

A desirable pressing position and a desirable load of the local load exerting mechanism 110 may be determined based on a period of time for which consumables, such as the polishing pad 2, have been used. For example, the desirable pressing position and load may be determined in advance for an initial stage, a middle stage, and a final stage of a service life of the polishing pad 2, and the pressing position and the load may be changed in accordance with the period of time for which the polishing pad 2 has been used. The other consumables of the polishing apparatus include the retaining ring 40, the flexible membrane 45, and the dresser.

A wafer may be polished in two stages in one polishing apparatus. For example, in a first polishing stage, a relatively high pressure is applied to the wafer to remove surface steps of the wafer. In a second polishing stage, a reduced pressure is applied to the wafer during polishing thereof so as to reduce surface steps (e.g., dishing) that have been produced as a result of locally excessive polishing. The pressing position and the load of the local load exerting mechanism 110 may be different between the first polishing stage and the second polishing stage. For example, in the first polishing stage, the local load exerting mechanism 110 may exert a first local load on the retaining ring 40 at a first pressing position, and in the second polishing stage, the local load exerting mechanism 110 may exert a second local load, which is different from the first local load, on the retaining ring 40 at a second pressing position which is different from the first pressing position.

Typically, after the retaining ring 40 contacts the polishing surface 2a at the start of polishing of the wafer, the operation of the local load exerting mechanism 110 is started to press the retaining ring 40, and is stopped after polishing of the wafer is terminated and before the top ring 1 is elevated. If the local load exerting mechanism 110 presses the retaining ring 40 when the top ring 1 is in its elevated position, the retaining ring 40 is forced to tilt, causing a trouble in transporting of the wafer. In order to avoid such a trouble, the local load exerting mechanism 110 does not press the retaining ring 40 when the top ring 1 is in its elevated position with the retaining ring 40 out of contact with the polishing surface 2a.

Based on the measurement results of the film-thickness sensor 7 that are obtained when a wafer W is polished, the magnitude of the local load and/or the position of the local load on the retaining ring 40 (i.e., the position of the local load exerting mechanism 110) may be changed for polishing of the wafer W or polishing of a next wafer. It is preferable to change the position of the local load on the retaining ring 40 in advance before the next wafer is polished. If a plurality of local load exerting mechanisms 110 are installed, it is possible to change the position of the local load by switching the local load exerting mechanism 110 to be operated from one to another. Alternatively, a plurality of local load exerting mechanisms 110 may be operated simultaneously so as to change a ratio of the magnitudes of the local loads generated by the respective local load exerting mechanisms 110. In this case also, the same effect can be achieved as if the position of the local load exerting mechanism 110 is changed. Furthermore, the polishing controller 9 may produce a polishing profile (i.e., a film thickness distribution along the radial direction of the wafer) from the measurement results, and the local load and the local pressing position may be changed based on the polishing profile, particularly the polishing profile of the edge portion of the wafer. Alternatively, the local load and the local pressing position may be changed based on the measurement results obtained from another film-thickness measuring device disposed in the polishing apparatus.

Figure 20:
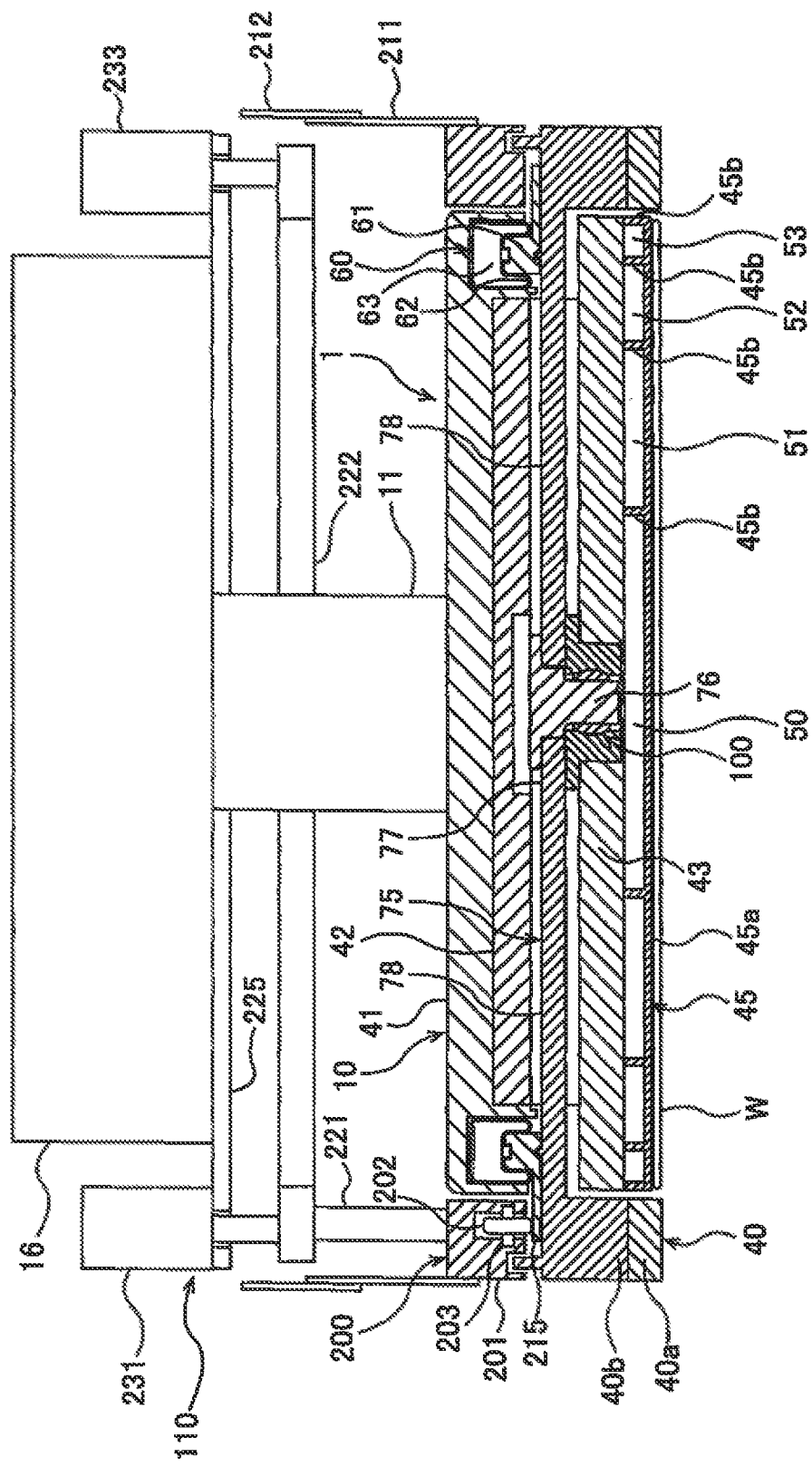
FIG. 20 is a view showing still another embodiment of the local load exerting mechanism.

FIG. 20 shows the local load exerting mechanism 110 according to still another embodiment. Structures and operations of the top ring 1 which will not be described below are identical to those of the top ring 1 shown in FIGS. 3 and 4, and repetitive descriptions thereof are omitted. The top ring 1 shown in FIG. 20 includes the spherical bearing 100 shown in FIGS. 7 and 8A through 8C. The top ring 1 may include the spherical bearing 85 shown in FIGS. 5 and 6A through 6C, instead of the spherical bearing 100.

The retaining ring 40 has the upper portion that contacts the annular retaining ring pressing mechanism 60. This retaining ring pressing mechanism 60 exerts a uniform downward load on the upper surface of the retaining ring 40 (more specifically the upper surface of the drive ring 40b) to thereby press the lower surface of the retaining ring 40 (i.e., the lower surface of the ring member 40a) against the polishing surface 2a of the polishing pad 2.

The retaining ring 40 is not fixed to the retaining ring pressing mechanism 60, and simply receives the load from the retaining ring pressing mechanism 60. Instead of this configuration, the retaining ring 40 may be fixed to the retaining ring pressing mechanism 60. In the case where the retaining ring 40 is fixed to the retaining ring pressing mechanism 60, the piston 61 of the retaining ring pressing mechanism 60 is formed by a magnetic material, such as metal, and a plurality of magnets are disposed on the upper portion of the drive ring 40b as shown in FIG. 3.

Figure 21:
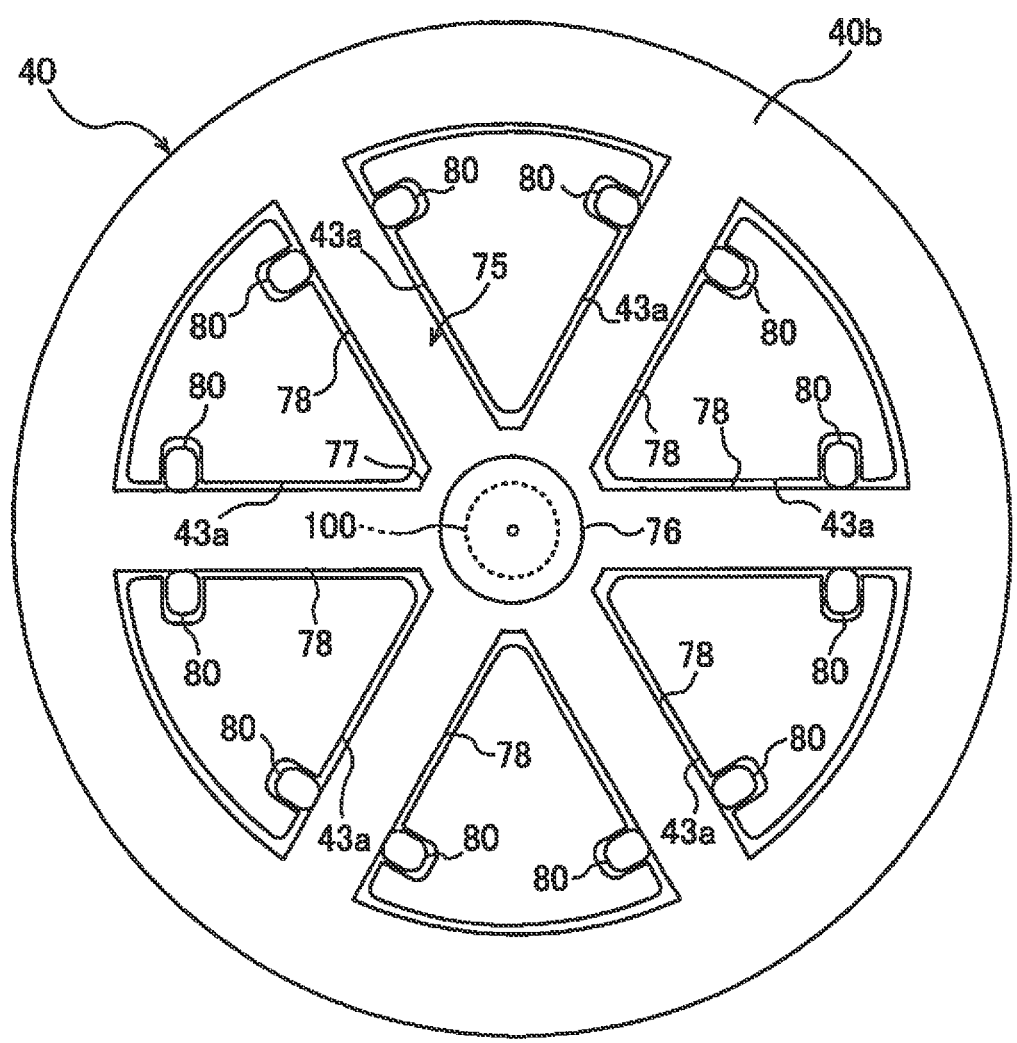
FIG. 21 is a plan view showing the coupling member which couples the retaining ring to the spherical bearing.

FIG. 21 is a plan view showing coupling member 75 which couples the retaining ring 40 to the spherical bearing 100. The basic structure shown in FIG. 21 is identical to the structure shown in FIG. 4 except that the coupling member 75 shown in FIG. 21 has six spokes 78. The other structural details shown in FIG. 21 are identical to those shown in FIG. 4, and their repetitive descriptions are omitted.

As shown in FIG. 20, the retaining ring 40 has an upper surface extending radially outwardly from the top ring body 10. A pressure ring 200, which is configured to exert a local load on a part of the retaining ring 40, is disposed above the retaining ring 40. The local load exerting mechanism 110 is disposed above the pressure ring 200. This local load exerting mechanism 110 is configured to exert a local load on a part of the pressure ring 200 in the direction perpendicular to the polishing surface 2a. The pressure ring 200 has a support ring 201 disposed above the retaining ring 40 and a load transmitting element 202 fixed to a lower portion of the support ring 201. The local load applied to the pressure ring 200 is transmitted to the retaining ring 40 through the load transmitting element 202. In this manner, the local load exerting mechanism 110 exerts a local load on the retaining ring 40 through the pressure ring 200 so as to change the tilt of the retaining ring 40 with respect to the substrate holding surface 45a.

The support ring 201 of the pressure ring 200 is made of a resin material, such as engineering plastic (e.g., PEEK, PPS), or metal, such as stainless steel or aluminum. A cylindrical lower cover 211 is fixed to an outer circumferential surface of the pressure ring 200. A cylindrical upper cover 212 is fixed to an outer circumferential surface of the lower cover 211. The lower cover 211 and the upper cover 212 extend upwardly from the pressure ring 200, and serve to prevent a liquid, such as the polishing liquid, from entering the top ring 1.

In this embodiment shown in FIG. 20, the load transmitting element 202 is constructed by a roller (rolling member) which is rotatably supported by the support ring 201. The load transmitting element will hereinafter be referred to as "roller". The roller 202 is rotatably supported by a roller shaft 203 which is secured to the support ring 201. The roller 202 has a bearing (not shown) therein, so that the load transmitting element 202 can freely rotate around the roller shaft 203.

The roller 202 is placed in rolling contact with an annular plate 215 fixed to the upper surface of the retaining ring 40 (more specially, the upper surface of the drive ring 40b). The pressure ring 200 receives the local load from the local load exerting mechanism 110 and exerts the local load on a part of the retaining ring 40 through the roller 202. The annular plate 215 is integrally connected to the piston 61 of the retaining ring pressing mechanism 60. Therefore, the annular plate 215 receives both the uniform pressing force from the retaining ring pressing mechanism 60 and the local load from the local load exerting mechanism 110. The annular plate 215 and the piston 61 may be provided as separate members. Alternatively, the annular plate 215 may be omitted, and the roller 202 may be placed in direct rolling contact with the upper surface of the retaining ring 40.

The annular plate 215 is made of a resin material, such as engineering plastic (e.g., PEEK, PPS), or metal, such as stainless steel or aluminum. If a plurality of magnets are disposed in the drive ring 40b as described above, the annular plate 215 may be made of magnetic metal or magnetic corrosion-resistant stainless steel. The roller 202 is placed in rolling contact with an upper surface of the annular plate 215. This upper surface of the annular plate 215 may be plated with a hard material, such as electroless nickel or hard chromium, or may be coated with a hard material, such as DLC (diamond-like carbon), for increasing a wear resistance.

The local load exerting mechanism 110 is secured to the top ring head 16 and fixed in position. The pressure ring 200 is held by the local load exerting mechanism 110 so as not to rotate in unison with the top ring 1. Specifically, during polishing of the wafer W, the retaining ring 40 rotates about its own axis, while the local load exerting mechanism 110 and the pressure ring 200 do not rotate with the retaining ring 40 and are stationary.

Figure 22:
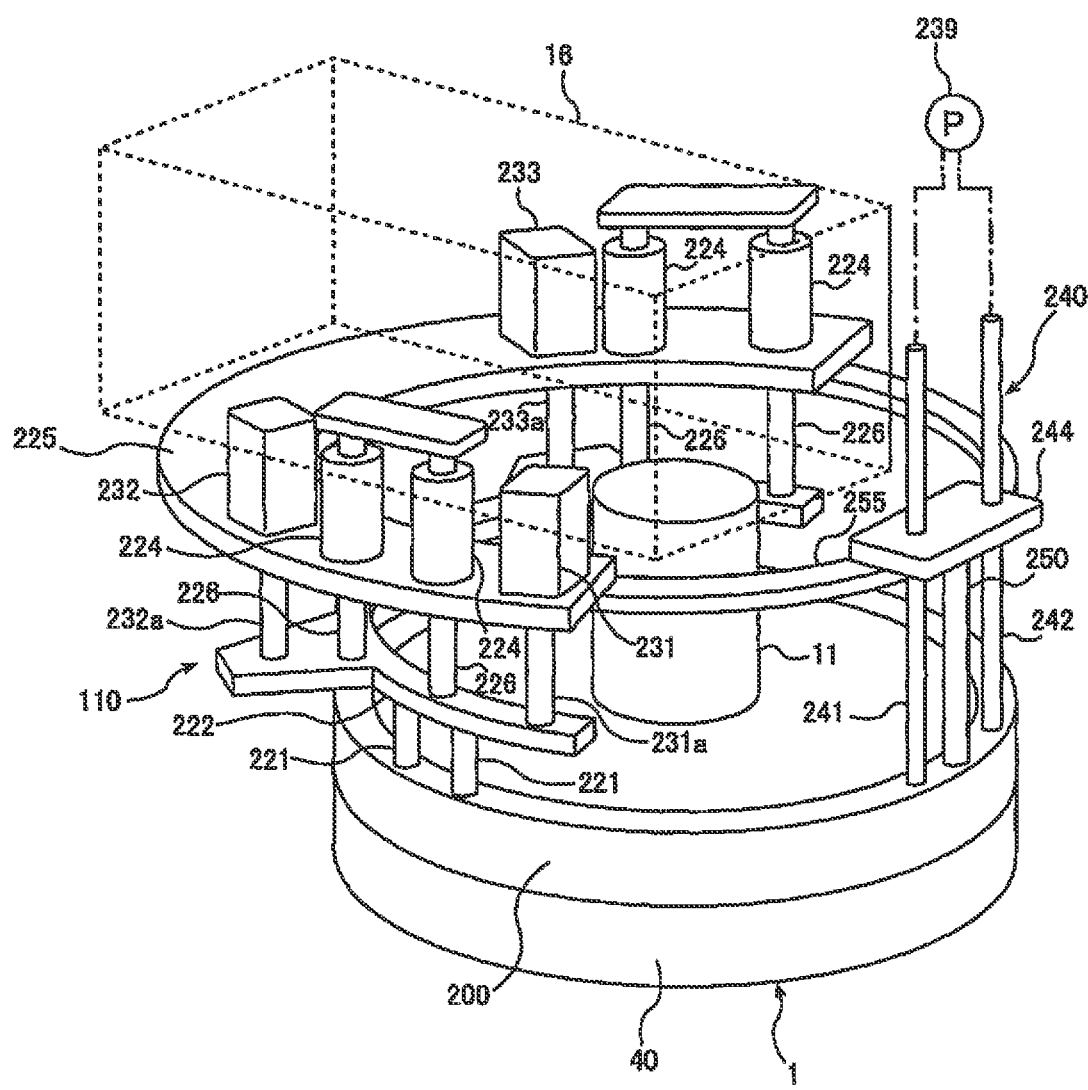
FIG. 22 is a perspective view of the top ring, a pressure ring, and the local load exerting mechanism.

FIG. 22 shows a perspective view of the top ring 1, the pressure ring 200, and the local load exerting mechanism 110. For illustrative purpose, certain components are omitted from FIG. 22. The pressure ring 200 is disposed on the top ring 1 and is concentric with the retaining ring 40. The pressure ring 200 and the retaining ring 40 have substantially the same diameter. The local load exerting mechanism 110 is coupled to the pressure ring 200 and configured to exert a local load on a part of the pressure ring 200.

The local load exerting mechanism 110 includes two push rods 221, a bridge 222, a plurality of (three in FIG. 22) air cylinders (load generators) 231, 232, and 233, a plurality of (four in FIG. 22) linear guides 224, and a unit base 225. The unit base 225 is secured to the top ring head 16, and the air cylinders 231, 232, and 233 and the linear guides 224 are mounted to the unit base 225. The air cylinders 231, 232, and 233 have piston rods 231a, 232a, and 233a, respectively. The piston rods 231a, 232a, and 233a and a plurality of guide rods 226 are coupled to the common bridge 222. The guide rods 226 are vertically movably supported by the respective linear guides 224 with low friction. Therefore, the linear guides 224 allow the bridge 222 to move smoothly in the vertical direction without being inclined.

The air cylinders 231, 232, and 233 generate loads that are transmitted to the common bridge 222. The bridge 222 is coupled to the pressure ring 200 through the push rods (connector) 221, which transmit the loads, applied from the air cylinders 231, 232, and 233 to the bridge 222, to the pressure ring 200. The roller 202 as the load transmitting element is located below a position where the pressure ring 200 is coupled to the push rods 221. The local load that is exerted from the push rods 221 on the pressure ring 200 is transmitted to the retaining ring 40 through the roller 202. In FIG. 22, the roller shaft 203 is disposed below a middle point between the two push rods 221. The air cylinders 231, 232, and 233 are coupled respectively to pressure regulators, vertical movement controllers, and air vent mechanisms (not shown), so that they can generate loads independently of each other.

Figure 23A:
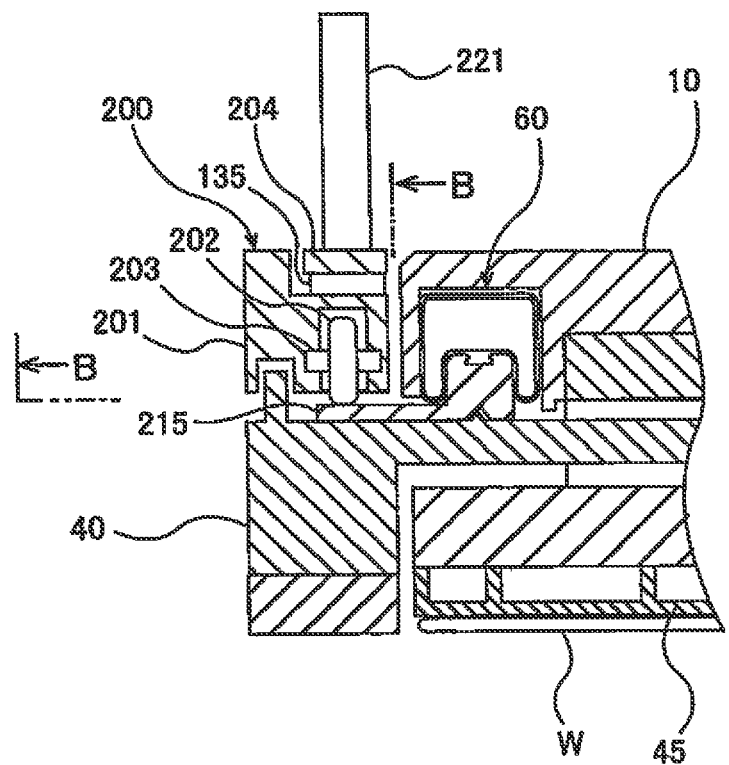
FIG. 23A is a view showing a load cell for measuring a local load applied from the local load exerting mechanism to the retaining ring.
Figure 23B:
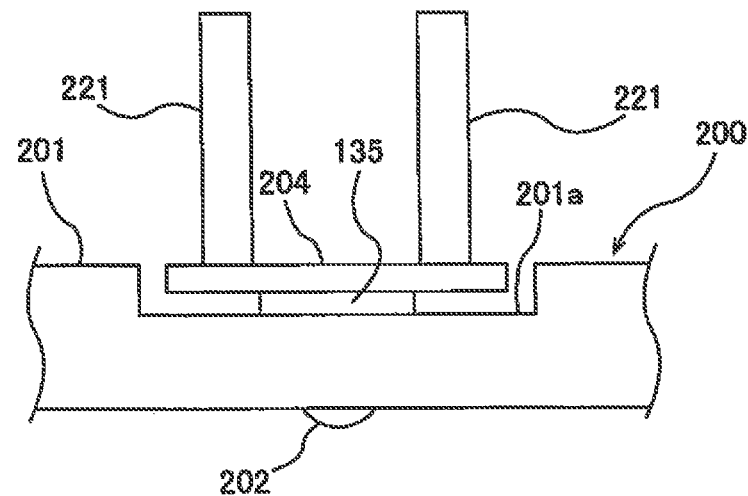
FIG. 23B is a view showing the pressure ring taken along line B-B in FIG. 23A.

FIG. 23A is a view showing a load cell 135 for measuring the local load applied from the local load exerting mechanism 110 to the retaining ring 40. FIG. 23B is a view showing the pressure ring 200 taken along line B-B in FIG. 23A. The pressure ring 200 includes the load cell 135 therein. More specifically, the support ring 201 of the pressure ring 200 has a recess 201s formed in an upper surface thereof, and the load cell 135 is disposed in the recess 201a. The load cell 135 is located above the roller 202. A load plate 204 is mounted to the load cell 135. The two push rods 221 have respective lower ends coupled to the load plate 204. The local load generated by the local load exerting mechanism 110 is transmitted through the two push rods 221 and the load plate 204 to the load cell 135, which measures the local load.

The pressure ring 200 may have at least three rollers for stabilizing its own attitude. In the present embodiment, the pressure ring 200 has, in addition to the roller 202 (which may hereinafter be referred to as "first roller 202"), a second roller, and a third roller (not shown), which are disposed in positions that are angularly spaced from the first roller 202 by angles of ±150°, respectively. Since the first roller 202 is located under the push rods 202, the local load from the local load exerting mechanism 110 is transmitted to the retaining ring 40 through the first roller 202, and the second roller and the third roller do not substantially transmit the local load from the local load exerting mechanism 110 to the retaining ring 40. The push rods 221 are arranged radially inwardly of the first roller 202 to prevent the pressure ring 200 from being inclined when the push rods 221 press the pressure ring 200.

Figure 24:
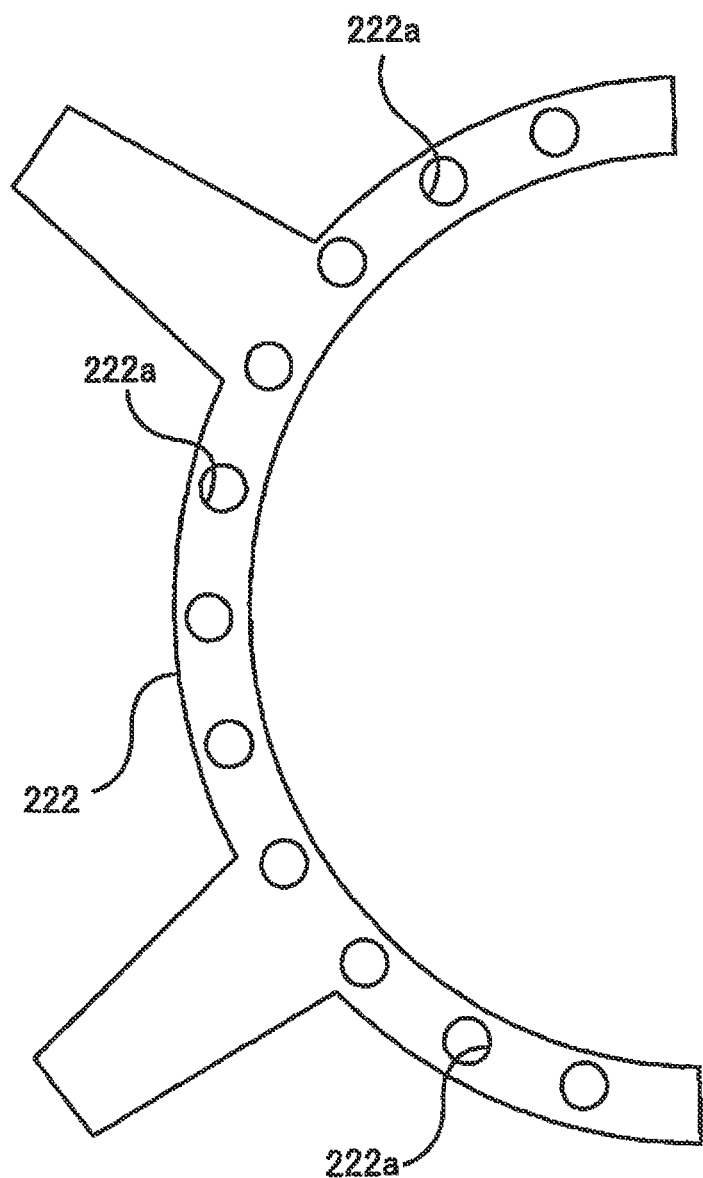
FIG. 24 is a plan view showing a bridge.

FIG. 24 is a plan view of the bridge 222. As shown in FIG. 24, the bridge 222 is of a substantially arcuate shape and has a plurality of through-holes 222a which are arranged along a circumferential direction of the bridge 222. The through-holes 222a are also arranged along a circumferential direction of the pressure ring 200. The two push rods 221 are removably inserted into either two of the through-holes 222a. Instead of the two push rods 221, only one push rod 221 may be used. According to the bridge 222 thus constructed, a connecting position between the bridge 222 and the push rods 221 is allowed to change, while a connecting position between the push rods 221 and the pressure ring 200 is maintained as it is. By changing the connecting position between the bridge 222 and the push rods 221, the position of the local load on the retaining ring 40 can be changed along the circumferential direction of the retaining ring 40.

In order to prevent a liquid, such as the polishing liquid, from entering the top ring 1, it is desirable to vertically move the top ring 1 when the pressure ring 200 and the retaining ring 40 are not away from each other. Specifically, when the top ring 1 is elevated, the air cylinders 231, 232, and 233 are supplied with atmospheric pressure or low pressure. When the top ring 1 is lowered (e.g., at the time of starting the wafer polishing process), the pressurized fluid is supplied to the three air cylinders 231, 232, and 233 to lower the three piston rods 231a, 232a, and 233a at the same time the downward movement of the top ring 1 is started. In order to lower the three piston rods 231a, 232a, and 233a at the same speed, the three air cylinders 231, 232, and 233 are typically supplied with the fluid having the same pressure. When the top ring 1 reaches its lowered position, the pressure of the supply fluid is changed, and the loads of the air cylinders 231, 232, and 233 are controlled according to a control process described below. When the top ring 1 is elevated (e.g., after the wafer W has been polished), the fluid in the air cylinders 231, 232, and 233 is vented to the atmosphere or a low-pressure fluid is supplied into the air cylinders 231, 232, and 233, so that the pressure ring 200 is elevated by the ascending top ring 1 in unison.

Figure 25:
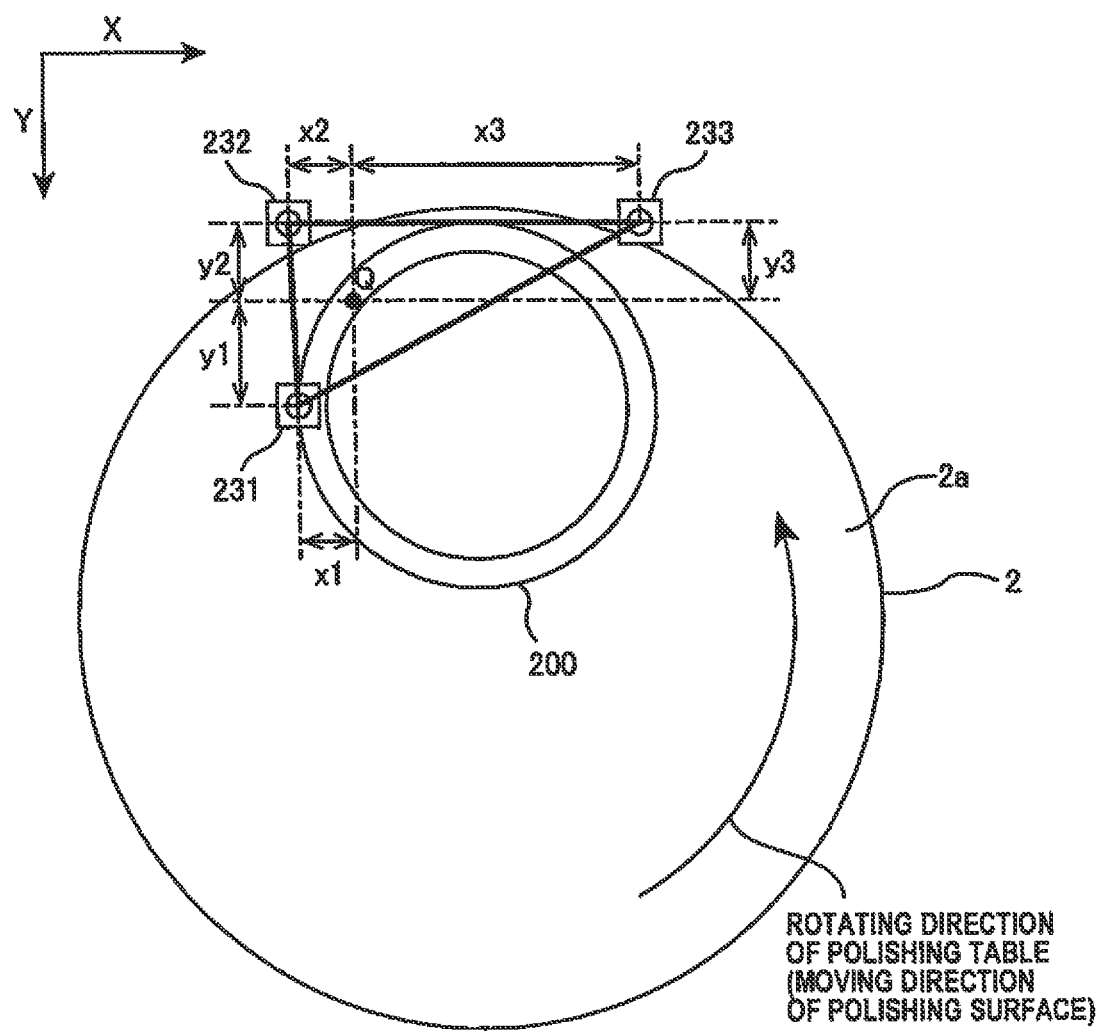
FIG. 25 is a plan view showing a positional relationship between air cylinders and a local load point.

A method of controlling the loads generated by the air cylinders 231, 232, and 233 will be described below with reference to FIG. 25. FIG. 25 is a plan view showing a positional relationship between the air cylinders 231, 232, and 233 and a local load point (i.e., the roller 202). As described above, a position of a local load point Q on the retaining ring 40 can be changed by changing the attachment position of the push rods 221 to the bridge 222. The loads generated by the air cylinders 231, 232, and 233 are controlled based on the attachment position of the push rods 221. Specifically, a load balance between the air cylinders 231, 232, and 233 is determined such that moments about the local load point Q are balanced. If the air cylinders 231, 232, and 233 press the bridge 222 with the moments about the local load point Q unbalanced, then the bridge 222 is inclined, thus increasing sliding resistance of the piston rods 231a, 232a, and 233a and the linear guides 224. As a result, the local load on the retaining ring 40 will become unstable.

As shown in FIG. 25, assuming that distances in a X direction from the air cylinders 231, 232, and 233 to the local load point Q are x1, x2, x3, distances in a Y direction, which is perpendicular to the X direction, from the air cylinders 231, 232, and 233 to the local load point Q are y1, y2, y3, the loads generated by the air cylinders 231, 232, and 233 are F1, F2, F3, and a target local load is F, the following equations hold:

$$F1*x1+F2*x2-F3*x3=0$$

$$F1*y1-F2*y2-F3*y3=0$$

$$F1+F2+F3=F$$

Since values of x1, x2, x3, y1, y2, y3 are determined from the position of the local load point Q, ratios of F1, F2, F3 to F are calculated according to the above equations. Of the air cylinders 231, 232, and 233, one which is closer to the push rods (connector) 221 generates a relatively large load, and one which is away from the push rods 221 generates a relatively small load. It is preferable that the air cylinders 231, 232, and 233 generate loads such that the center of gravity of the loads generated coincides with the position of the push rods 221, i.e., the position of the local load point Q. The loads generated by the air cylinders 231, 232, and 233 are controlled based on the load balance thus calculated.

If the local load measured by the load cell 135 is different from the desired local load F, a warning may be issued or the loads F1, F2, F3 generated by the air cylinders 231, 232, and 233 may be changed. If the measured local load is smaller than the desired local load F, the loads F1, F2, F3 are increased, and if the measured local load is greater than the desired local load F, the loads F1, F2, F3 are reduced. In these cases, the loads F1, F2, F3 may be changed while the calculated ratio F1:F2:F3 is maintained.

The position of the local load point Q, i.e., the position of the roller 202, can be selected as desired. For better stability of the load, the roller 202 is preferably located within a triangle (illustrated by bold lines) that interconnects the three air cylinders 231, 232, and 233. The roller 202 located within the triangle interconnecting the three air cylinders 231, 232, and 233 can locally press the retaining ring 40, while the moments about the local load point Q are in equilibrium.

Next, a suction mechanism 240 for sucking a liquid and particles from the top ring 1 will be described. As shown in FIG. 22, the suction mechanism 240 has a first suction line 241 and a second suction line 242 which are coupled to a vacuum source 239, e.g., a vacuum pump, and a suction line holder 244 which holds the first suction line 241 and the second suction line 242. The first suction line 241 and the second suction line 242 have respective distal ends coupled to the pressure ring 200.

Figure 26A:
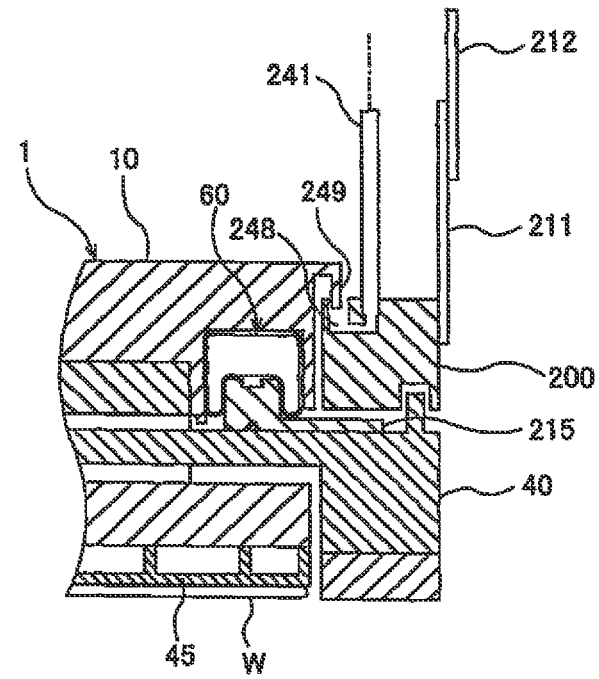
FIG. 26A is an enlarged view showing a junction between a first suction line and the pressure ring.
Figure 26B:
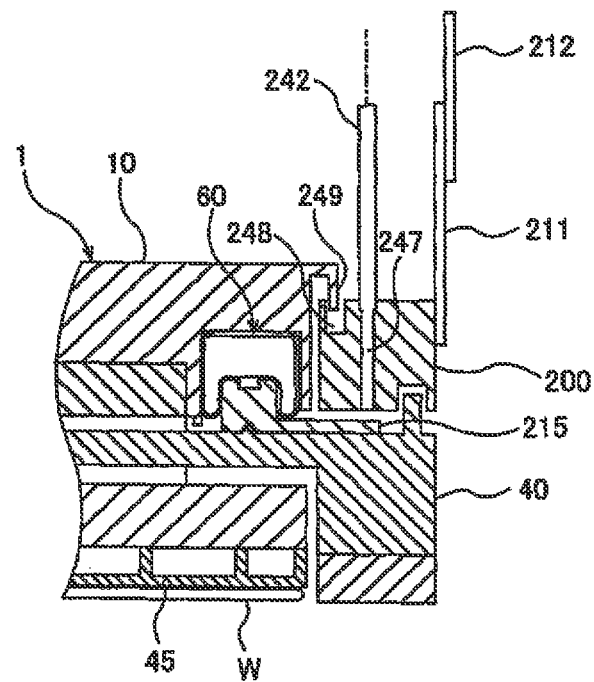
FIG. 26B is an enlarged view showing a junction between a second suction line and the pressure ring.

FIG. 26A is an enlarged view showing a junction between the first suction line 241 and the pressure ring 200, and FIG. 26B is an enlarged view showing a junction between the second suction line 242 and the pressure ring 200. The first suction line 241 is in fluid communication with an annular trench 248 formed on an upper surface of the pressure ring 200. A downwardly extending annular protrusion 249 that is fixed to a circumferential surface of the top ring body 10 is loosely inserted in the annular trench 248. The annular protrusion 249 and the annular trench 248 jointly construct a labyrinth structure that prevents a liquid from entering the gap between the pressure ring 200 and the top ring 1. The first suction line 241 serves to suck the liquid collected in the annular trench 248.

As shown in FIG. 26B, the distal end of the second suction line 242 is connected to a vertical hole 247 formed in the pressure ring 200. The vertical hole 247 extends through the pressure ring 200 and is in fluid communication with the gap between the pressure ring 200 and the retaining ring 40. The second suction line 242 draws in dust particles (e.g., particles worn off from the roller 202) which may be produced as a result of the rolling contact of the roller 202 serving as the load transmitting element.

Figure 27:
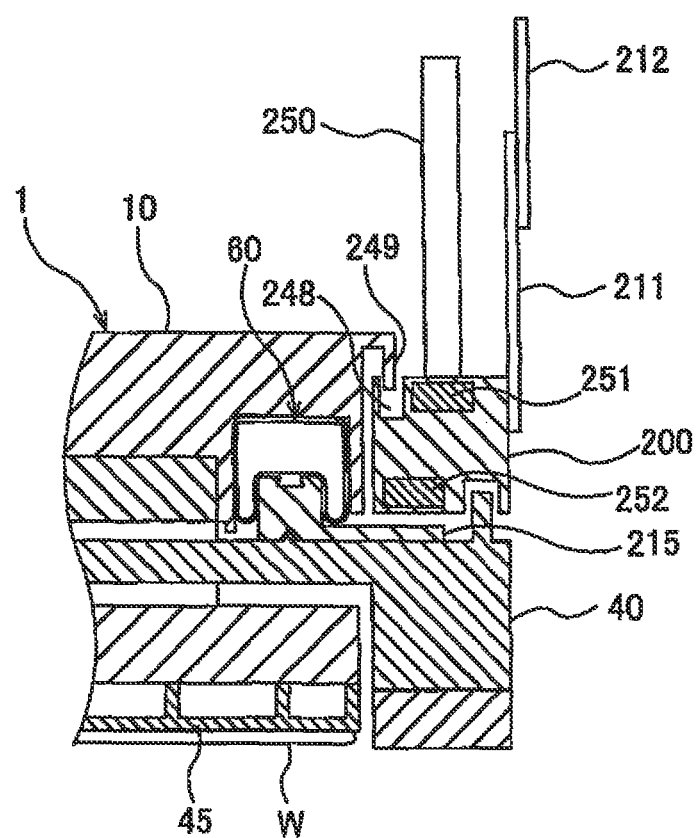
FIG. 27 is an enlarged view showing a magnetic member and the pressure ring.

As shown in FIG. 22, a magnetic member 250 which extends downwardly to the upper surface of the pressure ring 200 is fixed to the suction line holder 244. FIG. 27 is an enlarged view showing the magnetic member 250 and the pressure ring 200. As shown in FIG. 27, an upper permanent magnet 251 and a plurality of lower permanent magnets 252 are embedded in the pressure ring 200. The upper permanent magnet 251 is located at a position corresponding to a position of the magnetic member 250, so that an attractive magnetic force is produced between a lower end of the magnetic member 250 and the upper permanent magnet 251. The two suction lines 241 and 242 are removably secured to the pressure ring 200 via this magnetic force. With such a construction, the magnetic member 250 and the suction lines 241 and 242 can be easily removed from the pressure ring 200 for maintenance. The lower permanent magnets 252 are arranged along the circumferential direction of the pressure ring 200. An attractive magnetic force is produced between the lower permanent magnets 252 and the annular plate 215, which is made of a magnetic material, to thereby stabilize the position of the pressure ring 200.

Figure 28:
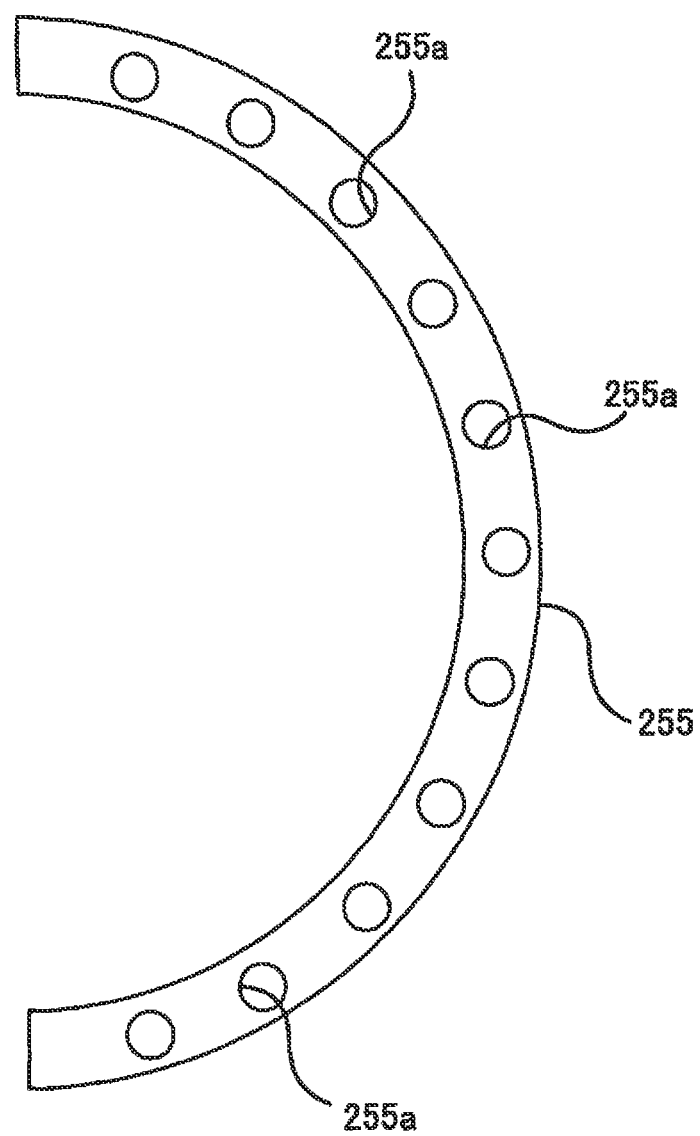
FIG. 28 is a plan view of a mount ring.

As shown in FIG. 22, the suction mechanism 240 is removably mounted to a mount ring 255, which is secured to the unit base 225. FIG. 28 is a plan view of the mount ring 255. The mount ring 255 is of an arcuate shape and has a plurality of attachment holes 255a arranged along a circumferential direction of the mount ring 255. The suction line bolder 244 is removably secured to the mount ring 255 by at least one screw (not shown) which is inserted into at least one of the attachment holes 255a. Therefore, the position of the suction mechanism 240 mounted to the mount ring 255 can be changed.

As described previously, changing of the position of the local load point is achieved by changing the attachment position of the push rods 221 relative to the bridge 222. When changing the attachment position of the push rods 221, it is necessary to move the suction lines 241 and 242 together with the pressure ring 200 along the circumferential direction of the pressure ring 200. Therefore, when the attachment position of the push rods 221 is changed, the position of the suction mechanism 240 is also changed.

Figure 29:
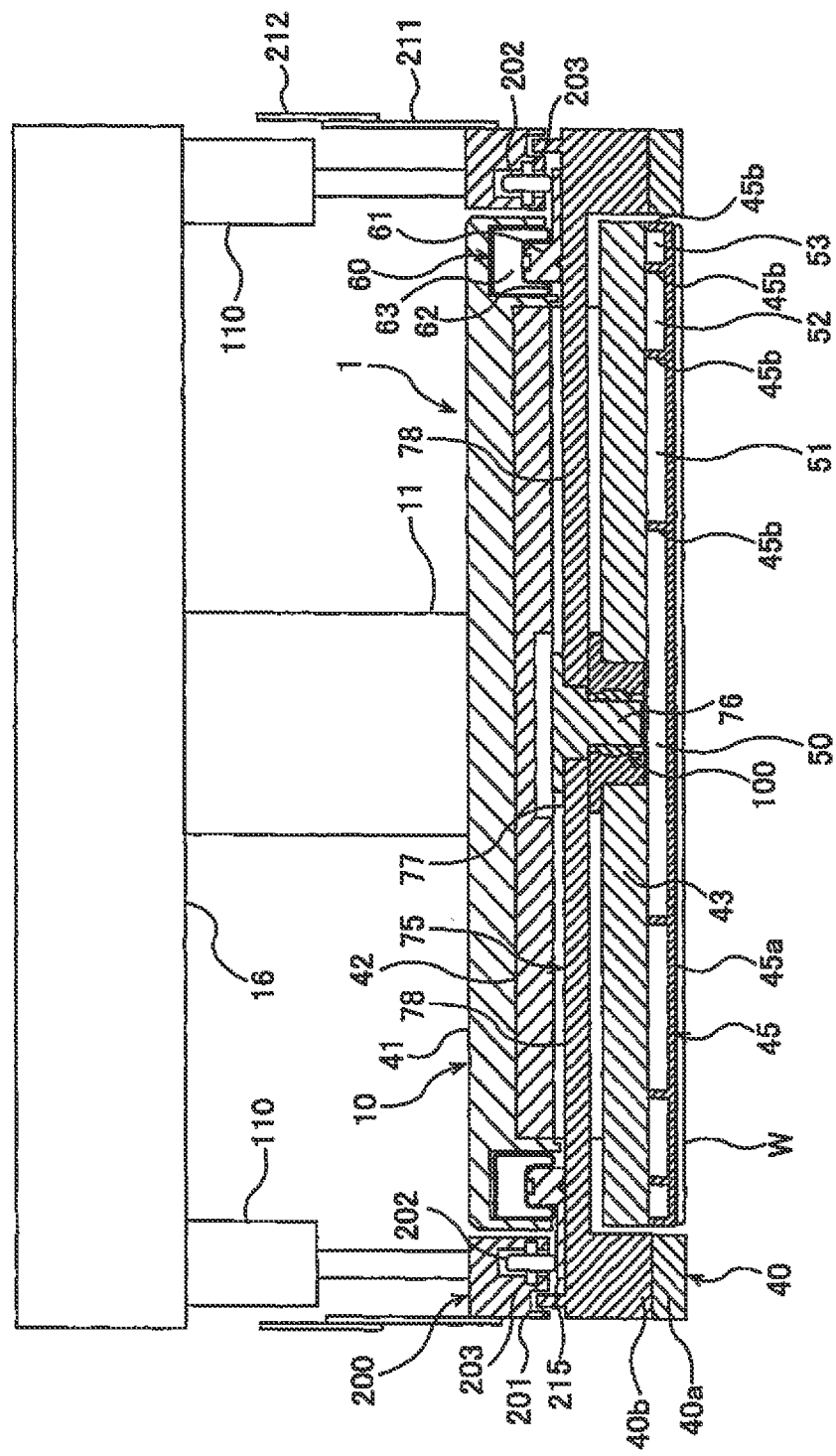
FIG. 29 is a cross-sectional view of local load exerting mechanisms according to another embodiment.

FIG. 29 is a cross-sectional view of the local load exerting mechanisms 110 according to another embodiment. Structures and operations of the local load exerting mechanisms 110 which will not be described below are identical to those of the local load exerting mechanisms 110 shown in FIG. 20, and repetitive descriptions are omitted. In this embodiment, the plural local load exerting mechanisms 110 are secured to the top ring head 16. Air cylinders are used as the local load exerting mechanisms 110, respectively. These local load exerting mechanisms 110 are coupled to the pressure ring 200. Each local load exerting mechanism 110 is configured to exert a local load on a part of the pressure ring 200 in the direction perpendicular to the polishing surface 2a.

The pressure ring 200 has a plurality of rollers (rolling members) 202 as load transmitting elements for receiving the local loads from the local load exerting mechanisms 110 and transmitting the local loads to the retaining ring 40. The rollers 202 are disposed just below the local load exerting mechanisms 110, respectively. The load transmitting elements may be convex sliding members in sliding contact with the retaining ring 40, instead of the rollers 202.

Although not shown, a plurality of load cells are disposed in the pressure ring 200. The load cells are disposed between the rollers 202 and the local load exerting mechanisms 110. The load cells are arranged in the same manner as the load cell 135 shown in FIGS. 23A and 23B. In the embodiment shown in FIG. 29, the load cells are disposed above the respective rollers 202. If the loads measured by these load cells are different from desired values, then a warning may be issued or the loads generated by the local load exerting mechanisms 110 may be changed.

A load balance between the local load exerting mechanisms (e.g., the air cylinders in the present embodiment) 110 can control the center of the gravity of the local loads applied to the retaining ring 40, i.e., a pressure distribution along the circumferential direction of the retaining ring 40. In the embodiment shown in FIG. 22, the change in the relative position of the push rods 221 with respect to the bridge 222 results in the change in the position of the local load point. According to the embodiment shown in FIG. 29, it is possible to change the position of the local load point on the retaining ring 40 with greater case by changing the load balance between the local load exerting mechanisms 110. In the top ring 1 shown in FIG. 20, the retaining ring pressing mechanism 60 exerts a uniform load on the retaining ring 40 in its entirety, and the pressure ring 200 exerts a local load on the retaining ring 40. In the present embodiment, the retaining ring pressing mechanism 60 may be omitted, and the local load exerting mechanisms 110 may exert both a uniform load and a local load on the retaining ring 40.

A method of controlling the local loads of the local load exerting mechanisms 110 shown in FIG. 29 will be described below with reference to FIGS. 30A through 30C. FIGS. 30A through 30C are plan views of the air cylinders and the pressure ring 200. The angle θ shown in FIGS. 30A through 30C corresponds to the angle illustrated in FIG. 14. FIG. 30A shows an example in which two air cylinders exert local loads on the pressure ring 200. FIG. 30B shows an example in which three air cylinders exert local loads on the pressure ring 200. FIG. 30C shows an example in which four air cylinders exert local loads on the pressure ring 200. In any one of these examples, the center of gravity of the local loads generated by the air cylinders is deviated from the center of the retaining ring 40. Although not shown, the principle of the present embodiment is also applicable to a case of using five or more air cylinders.

In FIG. 30A, two air cylinders 110A and 11B are axisymmetrical with respect to a line of the angle 180° (the angle is represented by θ). When the two air cylinders 110A and 110B exert respective local loads on the retaining ring 40, the center of gravity of the two local loads can be located within a line segment interconnecting the two air cylinders 110A and 110B. For example, if a local load is to be applied to a position on the line of the angle 180°, the loads generated by the two air cylinders 110A and 110B are set to be equal to each other.

In FIG. 30B, three air cylinders 110A, 110B, and 110C are arranged at equal intervals around the center of the retaining ring 40, i.e., the center of the pressure ring 200. In this example, the center of gravity of the three local loads generated by the three air cylinders 110A, 110B, and 110C can be located within an equilateral triangle interconnecting the three air cylinders 110A, 110B, and 110C. For example, if a local load is to be applied to a position on the line of the angle 180°, the load generated by the air cylinder 110C at the downstream side is set to be the highest one, while the loads generated by the two air cylinders 110A and 110B at the upstream side are set to be equal to each other. Further, the total load generated by the two air cylinders 110A and 110B at the upstream side is set to be smaller than the load generated by the air cylinder 110C at the downstream side. When the loads of the two air cylinders 110A and 1101B at the upstream side are zero, the air cylinder 110C can tilt the retaining ring 40 most effectively.

In FIG. 30C, four air cylinders 110A, 110B, 110C, and 110D are arranged at equal intervals around the center of the retaining ring 40, i.e., the center of the pressure ring 200. The center of gravity of the four local loads generated by the four air cylinders 110A, 110B, 110C, and 110D can be located within a regular square interconnecting the four air cylinders 110A, 1108, 110C, and 110D. For example, if a local load is to be applied to a position on the line of the angle 180°, the loads generated by the two air cylinder 110C and 110D at the downstream side are set to be equal to each other, and the loads generated by the two air cylinders 110A and 1108 at the upstream side are also set to be equal to each other. Further, the total load generated by the two air cylinders 110A and 110B is set to be smaller than the total load generated by the two air cylinders 110C and 110D. In this example also, when the loads generated by the two air cylinders 110A and 110B at the upstream side are zero, the air cylinders 110C and 110D can tilt the retaining ring 40 most effectively.

The four-load-point arrangement shown in FIG. 30C is capable of bringing the center of gravity of the loads close to the retaining ring 40 in a wider area than the three-load-point arrangement shown in FIG. 30B. Therefore, the four-load-point arrangement shown in FIG. 30C is capable of tilting the retaining ring 40 in a wider area than the three-load-point arrangement shown in FIG. 30B. For example, when the three-load-point arrangement is used to press a position on a line of an angle 135°, the air cylinder 110A and the air cylinder 110C press the retaining ring 40 at the same load L, while the air cylinder 110B exerts a zero load. Where a distance from the center of the retaining ring 40 to each of the air cylinders is R, a moment of changing the tilt of the retaining ring 40 is L*R. With the four-load-point arrangement, only the air cylinder 110C presses the retaining ring 40 at a load 2L, which means twice the load L. In this case, a moment of changing the tilt of the retaining ring 40 is 2L*R. While the total local load acting on the retaining ring 40 is 2L in both cases using the three-load-point arrangement and the four-load-point arrangement, the four-load-point arrangement can produce a greater moment for changing the tilt of the retaining ring 40 than the three-load-point arrangement.

Figure 31:
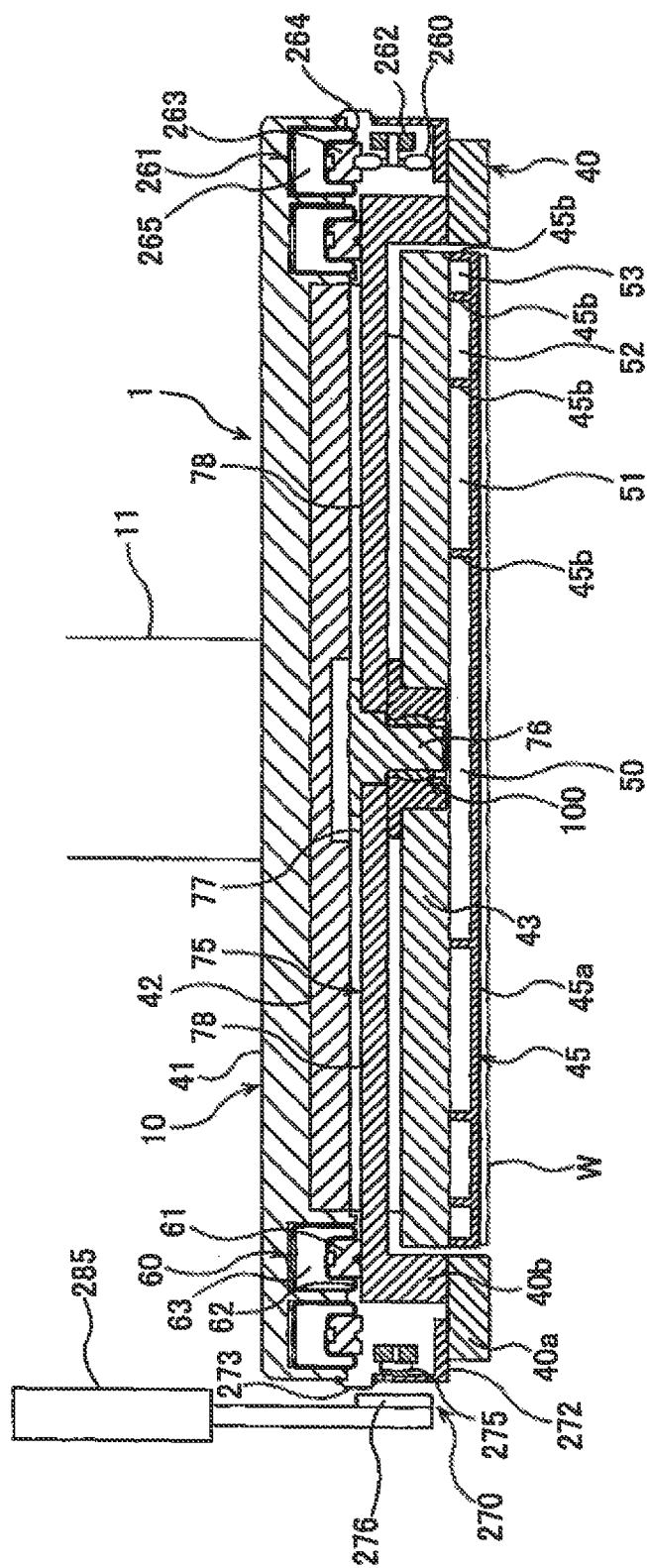
FIG. 31 is a cross-sectional view of the top ring according to another embodiment.

FIG. 31 is a cross-sectional view of the top ring 1 according to still another embodiment. In this embodiment, the top ring 1 includes a pressing member 260 for pressing a part of the retaining ring 40 in the direction perpendicular to the polishing surface 2a, and a load generator 261 for exerting, on the pressing member 260, a pressing force for pressing the retaining ring 40 against the polishing surface 2a. The load generator 261 and the pressing member 260 jointly constitute a local load exerting mechanism for exerting a local load on a part of the retaining ring 40 perpendicularly to the polishing surface 2a. The pressing member 260 is secured to a support ring 262 disposed between the load generator 261 and the retaining ring 40. The polishing apparatus has a position retaining mechanism 270 configured to retain a position of the pressing member 260 so as not to allow the pressing member 260 to rotate together with the top ring 1.

The load generator 261 is disposed in the flange 41 of the top ring body 10. This load generator 261 has a piston 263 and a rolling diaphragm 264, as with the retaining ring pressing mechanism 60. The load generator 261 can change the pressing force applied to the pressing member 260 by changing the pressure of the pressurized fluid supplied into a pressure chamber 265 which is defined by the rolling diaphragm 264.

Figure 32A:
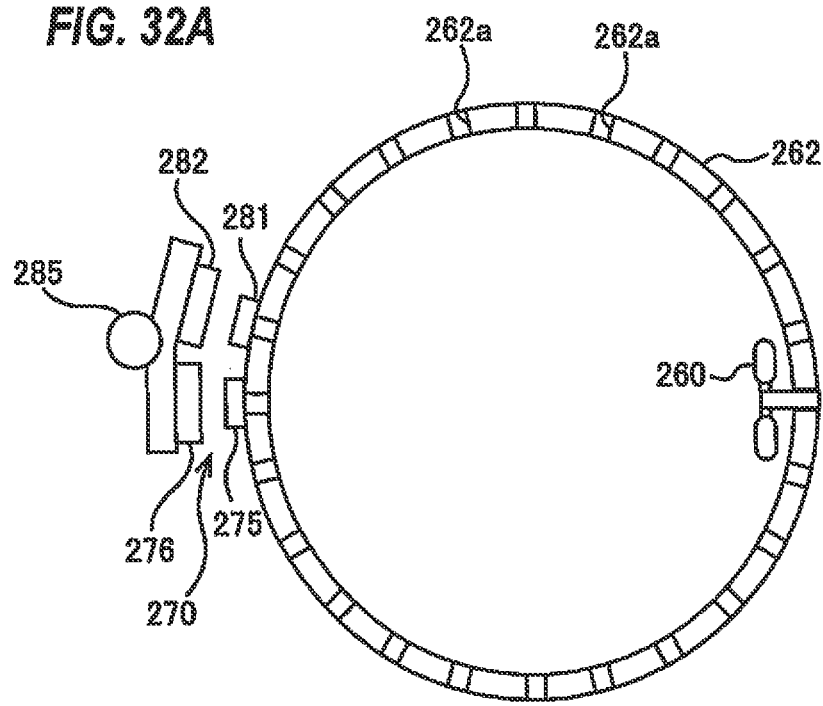
FIG. 32A is a plan view showing a pressing member and a position retaining mechanism.
Figure 32B:
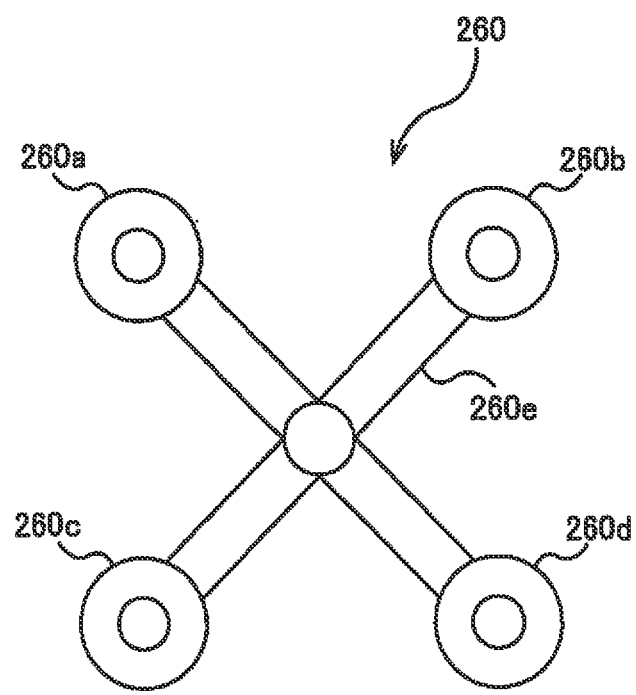
FIG. 32B is a side view of the pressing member.

FIG. 32A is a plan view showing the pressing member 260 and the position retaining mechanism 270. FIG. 32B is a side view of the pressing member 260. The pressing member 260 has upper rollers 260a and 260b for receiving a load from the load generator 261, lower rollers 260c and 260d for transmitting the load to a pert of the retaining ring 40, and a roller holder 260e holding the rollers 260a, 260b, 260c, and 260d thereon. The roller holder 260e is fixed to the support ring 262.

The gap between the top ring body 10 and the retaining ring 40 is sealed by a seal ring 272 and a seal sheet 273, which prevent droplets of the polishing liquid from entering the top ring 1 and also prevent particles, produced in the top ring 1, from failing onto the polishing surface 2a. The seal ring 272 has an L-shaped cross section and has a lower surface fixed to the retaining ring 40. The seal ring 272 is rotatable together with the retaining ring 40, and is tiltable in unison with the retaining ring 40. The lower rollers 260c and 260d are held in rolling contact with an upper surface of the seal ring 272. Therefore, the lower rollers 260c and 260d transmit the load, generated by the load generator 261, to a part of the retaining ring 40 through the seal ring 272, thus tilting the retaining ring 40 with respect to the substrate holding surface 45a. The lower rollers 260c and 260d may be placed in direct contact with the upper surface of the retaining ring 40 so as to directly transmit the load to a part of the retaining ring 40.

The position retaining mechanism 270 has a retaining target 275 mounted to the support ring 262 and a target retainer 276 for retaining the retaining target 275. The support ring 262 has a plurality of attachment holes 262a which are arranged along the entire circumference of the support ring 262. The retaining target 275 is removably attached to either one of the attachment holes 262a. By changing the attachment position of the retaining target 275, the position of the pressing member 260 can be changed along the circumferential direction of the retaining ring 40, i.e., the position of the local load applied to the retaining ring 40 can be changed.

The target retainer 276 is located closely to the retaining target 275. The target retainer 276 is fixed in position. The target retainer 276 retains the position of the retaining target 275 via a magnetic force in a non-contact manner. More specifically, one of the target retainer 276 and the retaining target 275 is constituted by a permanent magnet, and the other is constituted by a magnetic material. The permanent magnet may be replaced with an electromagnet. An attractive magnetic force is produced between the target retainer 276 and the retaining target 275, so that the target retainer 276 can retain the retaining target 275 via the magnetic force without physical contact with the retaining target 275. As a result, the support ring 262 to which the retaining target 275 is fixed is magnetically fixed in position and is not allowed to rotate in unison with the top ring 1.

Since the target retainer 276 and the retaining target 275 are spaced from each other, it is possible to provide the seal ring 272 and/or the seal sheet 273 between the target retainer 276 and the retaining target 275, as shown in FIG. 31. Alternatively, the target retainer 276 may be directly connected to the retaining target 275 so as to retain the retaining target 275 in a contact manner.

As shown in FIG. 32A, a sensor target 281 may be provided on the support ring 262, and a proximity sensor 282 for sensing the sensor target 281 may be provided. The proximity sensor 282 is disposed outside of the top ring 1 and does not rotate together with the top ring 1. The proximity sensor 282 thus arranged is capable of detecting whether or not the position of the support ring 262 is retained by the position retaining mechanism 270, i.e., whether or not the support ring 262 and the pressing member 260 are not rotating in unison with the top ring 1. The sensor target 281 is removably attached to one of the attachment holes 262a of the support ring 262, so that an installation position of the sensor target 281 can be changed. In FIG. 32A, the sensor target 281 is disposed adjacent to the retaining target 275. The sensor target 281 may be located away from the retaining target 275. The sensor target 281 may be made of nonmagnetic metal and the proximity sensor 282 may be an eddy-current sensor.

In order to retain the position of the support ring 262 via the magnetic force, the target retainer 276 may be vertically movable in synchronism with the top ring 1 or may have a vertical dimension larger than a vertically movable distance of the top ring 1. In FIGS. 31 and 32A, the target retainer 276 and the proximity sensor 282 are coupled to a vertically moving mechanism 285, which moves the target retainer 276 and the proximity sensor 282 in the vertical direction in synchronism with the vertical movement of the top ring 1. The vertically moving mechanism 285 may be constituted by a combination of a servomotor and a ball screw.

While the target retainer 276 is fixed in position, the position at which the retaining target 275 is mounted to the support ring 262 can be changed. Therefore, by changing the relative position of the pressing member 260 and the retaining target 275 on the support ring 262, it is possible to change the local load point on the retaining ring 40. For example, when the pressing member 260 is located in a position spaced apart from the retaining target 275 by an angle of 180°, the pressing member 260 can exert a local load on the position spaced apart from the retaining target 275 by an angle of 180°. When the pressing member 260 is located in a position spaced apart from the retaining target 275 by an angle of 90°, the pressing member 260 can exert a local load on the position spaced apart from the retaining target 275 by an angle of 90°. Instead of this structure in which the attachment position of the retaining target 275 is variable, the attachment position of the pressing member 260 may be variable.

Figure 33:
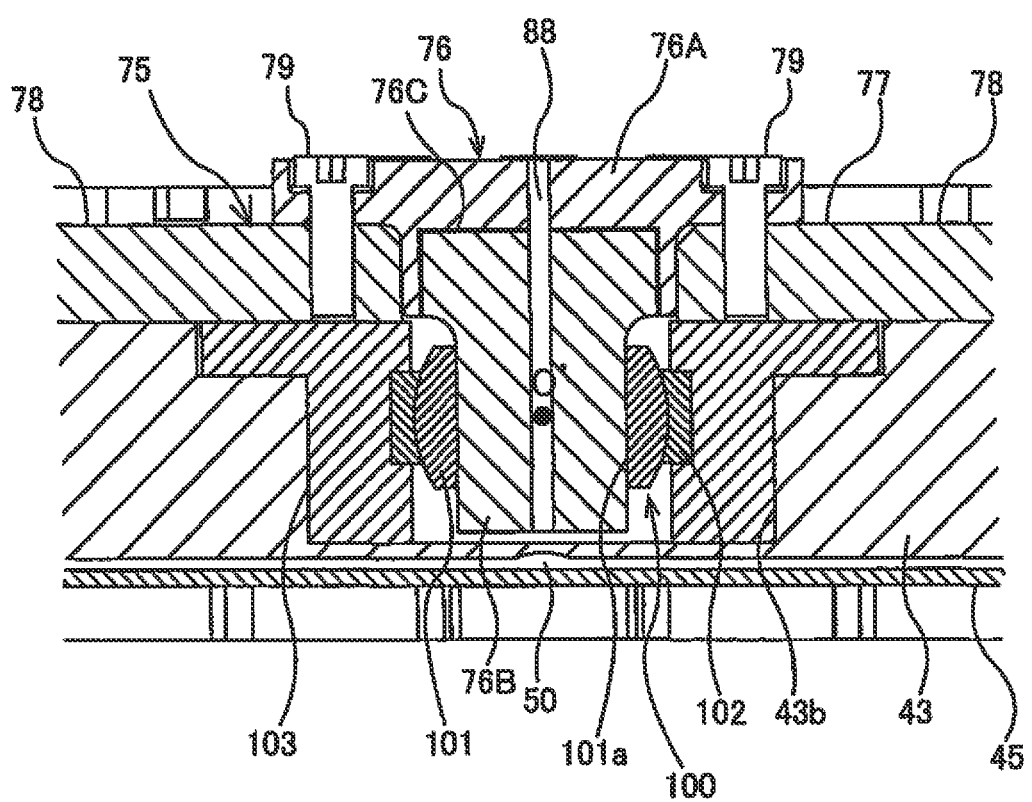
FIG. 33 is a cross-sectional view showing another embodiment of a shaft portion supported by the spherical bearing.

FIG. 33 is a cross-sectional view showing another embodiment of the shaft portion 76 supported by the spherical bearing 100. As shown in FIG. 33, the shaft portion 76 includes a flange element 76A and a shaft element 76B, which are separated components. The flange element 76A and the shaft element 76B are bonded to each other by an adhesive layer 76C. Preferably, the flange element 76A is made of metal, such as aluminum or stainless steel, and the shaft element 76B is made of highly rigid and highly wear-resistant ceramic, such as alumina, SiC, or zirconia. The shaft portion 76 thus constructed is suitable in the case where an eddy-current sensor is used as the film thickness sensor 7 embedded in the polishing table 3. If metal exists near the substrate holding surface 45a of the top ring 1, a measurement value of the eddy-current sensor may adversely be affected. In order to avoid such an adverse effect, the shaft element 76B is preferably made of ceramic. The modification shown in FIG. 33 is also applicable to the shaft portion 76 supported by the spherical bearing 85 shown in FIG. 5.

Figure 34:
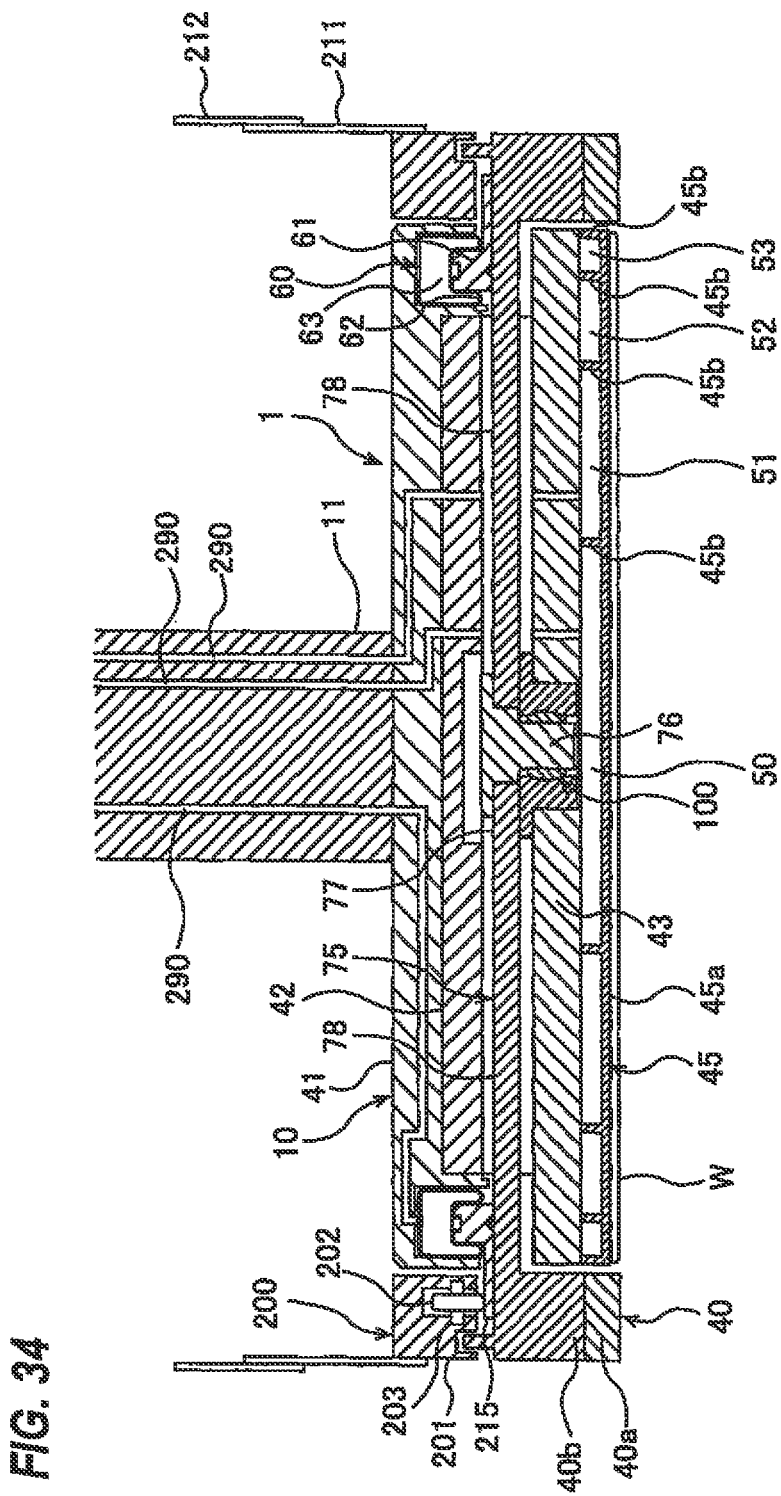
FIG. 34 is a cross-sectional view of the top ring according to still another embodiment.

FIG. 34 is a cross-sectional view of the top ring 1 according to still another embodiment. Structures and operations of the top ring 1 which will not be described below are identical to those of the top ring 1 shown in FIG. 20, and repetitive descriptions thereof are omitted. As shown in FIG. 34, the flange 41 is connected to the top ring shaft 11. The top ring shaft 11 and the top ring body 10 have a plurality of fluid passages 290 formed therein which are connected to the pressure chambers 50, 51, 52, and 53 and the retaining ring pressure chamber 63, respectively. In FIG. 34, only some of the fluid passages 290 are depicted. These fluid passages 290 are not constituted by pipes, such as tubes, but are formed by drilling holes in the top ring shaft 11 and the top ring body 10.

Figure 35:
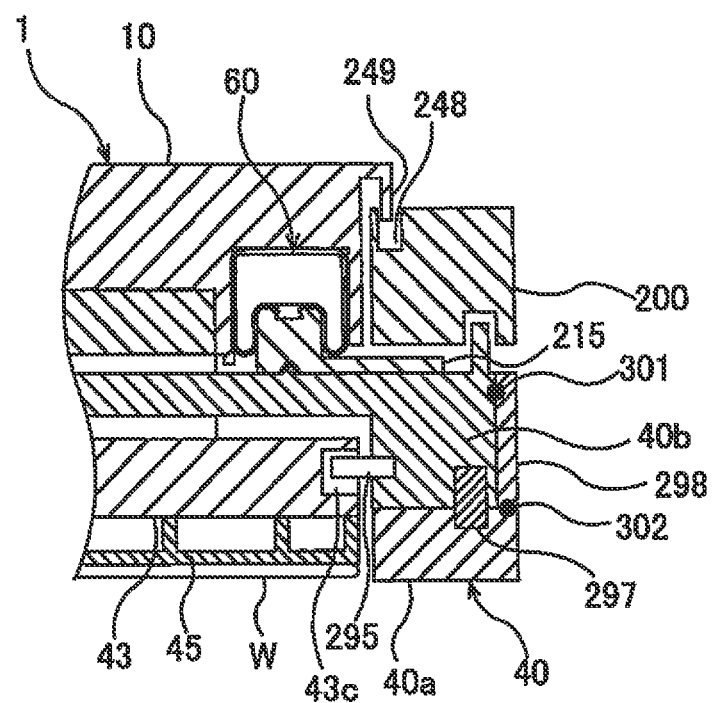
FIG. 35 is a cross-sectional view showing a part of the top ring according to still another embodiment.

FIG. 35 is a cross-sectional view showing a part of the top ring 1 according to still another embodiment. As shown in FIG. 35, a plurality of radially inwardly extending stopper pins 295 are mounted to the drive ring 40b. These stopper pins 295 are inserted in respective holes 43c formed on a circumferential surface of the carrier 43. When the carrier 43, the drive ring 40b, and the retaining ring 40 are removed for maintenance, the carrier 43 and the drive ring 40b are not separated from each other because of the stopper pins 295 inserted in the holes 43c.

A reinforcement ring 297 is embedded in the retaining ring 40. This reinforcement ring 297 is disposed between the drive ring 40b and the ring member 40a and arranged concentrically with the retaining ring 40. The reinforcement ring 297 serves to prevent the deformation of the retaining ring 40 when the retaining ring 40 is subjected to the frictional force produced between the wafer and the polishing pad 2 during polishing of the wafer. A cover ring 298 is disposed to an outer circumferential surface of the drive ring 40b. An O-ring 301 is interposed between the cover ring 298 and the drive ring 40b, and an O-ring 302 is interposed between the cover ring 298 and the ring member 40a. The O-rings 301 and 302 serve to prevent a liquid, such as the polishing liquid, from entering the top ring 1.

Figure 36:
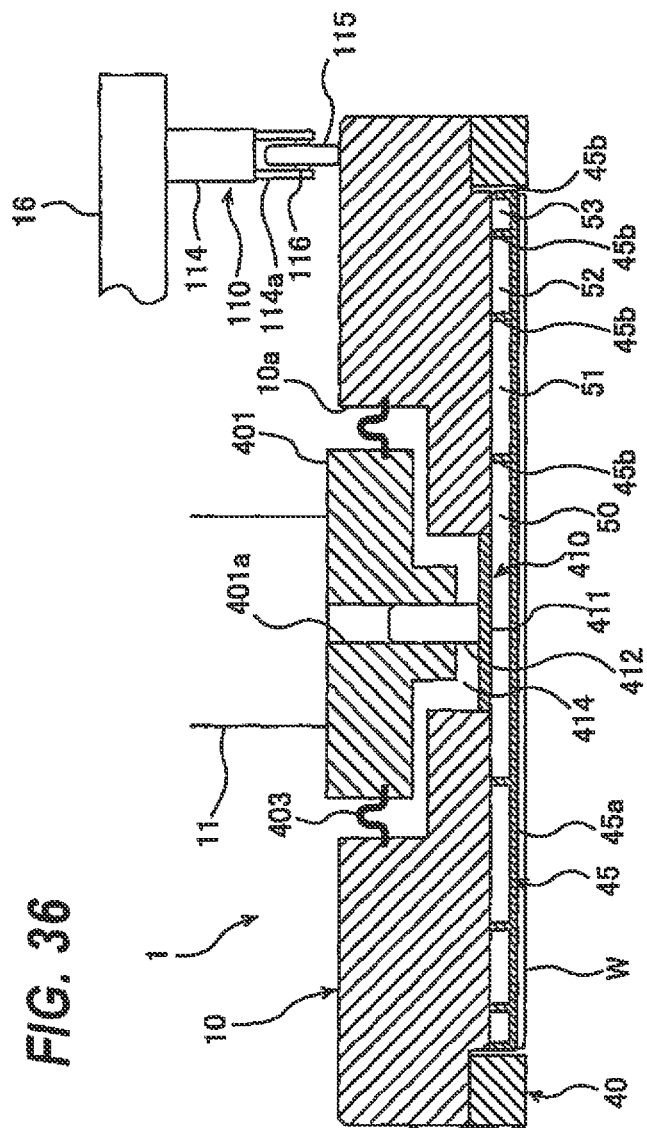
FIG. 36 is a cross-sectional view of the top ring according to still another embodiment.

FIG. 36 is a cross-sectional view of the top ring 1 according to still another embodiment. The top ring 1 includes a housing 401 fixed to the lower end of the top ring shaft 11, and an annular elastic membrane 403 that couples the housing 401 to the top ring body 10. A recess 10a is formed in an upper surface of the top ring body 10, and the housing 401 is disposed in this recess 10a. An inner circumferential edge of the elastic membrane 403 is fixed to an outer circumferential surface of the housing 401, and an outer circumferential edge of the elastic membrane 403 is fixed to an inner circumferential surface forming the recess 10a of the top ring body 10. The elastic membrane 403 is formed of a flexible material.

The flexible membrane 45 for pressing the wafer W against the polishing pad 2 is fixed to the lower surface of the top ring body 10. Structures of the flexible membrane 45 are identical to those of the previously-discussed embodiments, and their repetitive descriptions are omitted.

In this embodiment, instead of the spherical bearing, a gimbal mechanism 410 is provided. This gimbal mechanism 410 is configured to allow the top ring body 10, the retaining ring 40, and the flexible membrane 45 in their entirety to tilt with respect to the top ring shaft 11 and the housing 401, while transmitting the torque of the top ring shaft 11 to the top ring body 10 and the retaining ring 40.

The gimbal mechanism 410 includes a plate element 411 fixed to the top ring body 10, and a post 412 fixed to this plate element 411. The housing 401 has a hole 401a extending in the vertical direction, and the post 412 is inserted in this hole 401a in a vertically movable manner. The post 412 is movable in the vertical direction relative to the housing 401. Therefore, the top ring body 10, the retaining ring 40, and the flexible membrane 45 are vertically movable relative to the housing 401 and the top ring shaft 11.

The post 412 is slidably fitted in the hole 401a. More specifically, the post 412 is vertically movable relative to the housing 401, while the post 412 is not allowed to tilt with respect to the housing 401. A lower end of the post 412 is fixed to an upper surface of the plate element 411, which is formed of a deformable material. Therefore, the top ring body 10, the retaining ring 40, and the flexible membrane 45 can tilt with respect to the top ring shaft 11 and the housing 401. The retaining ring 40 is fixed (or coupled) to the top ring body 10, so that the retaining ring 40 is configured to be able to tilt together with the top ring body 10.

The housing 401, the top ring body 10, the gimbal mechanism 410, and the elastic membrane 403 form a pressure chamber 414 in the top ring 1. This pressure chamber 414 is located between the housing 401 and the top ring body 10. The pressurized fluid (e.g., pressurized air) is supplied from the previously-discussed pressure regulator 65 into the pressure chamber 414. The pressure of the pressurized fluid acts on the top ring body 10, thus pressing the retaining ring 40 against the polishing pad 2.

Structures of the local load exerting mechanism 110 are identical to those of the previously-discussed embodiment shown in FIG. 3 and their repetitive descriptions are omitted. The local load exerting mechanism 110 is disposed above the retaining ring 40, and the wheel 115 of the local load exerting mechanism 110 is in contact with the upper surface of the top ring body 10. The local load exerting mechanism 110 presses the top ring body 10 downwardly from above the retaining ring 40. More specifically, the air cylinder 114 pushes down the wheel 115 to thereby exert the downward local load on a part of the retaining ring 40. The local load exerting mechanism 110 according to this embodiment can exert the same effects as those of the local load exerting mechanism 110 shown in FIG. 3.

Figure 37:
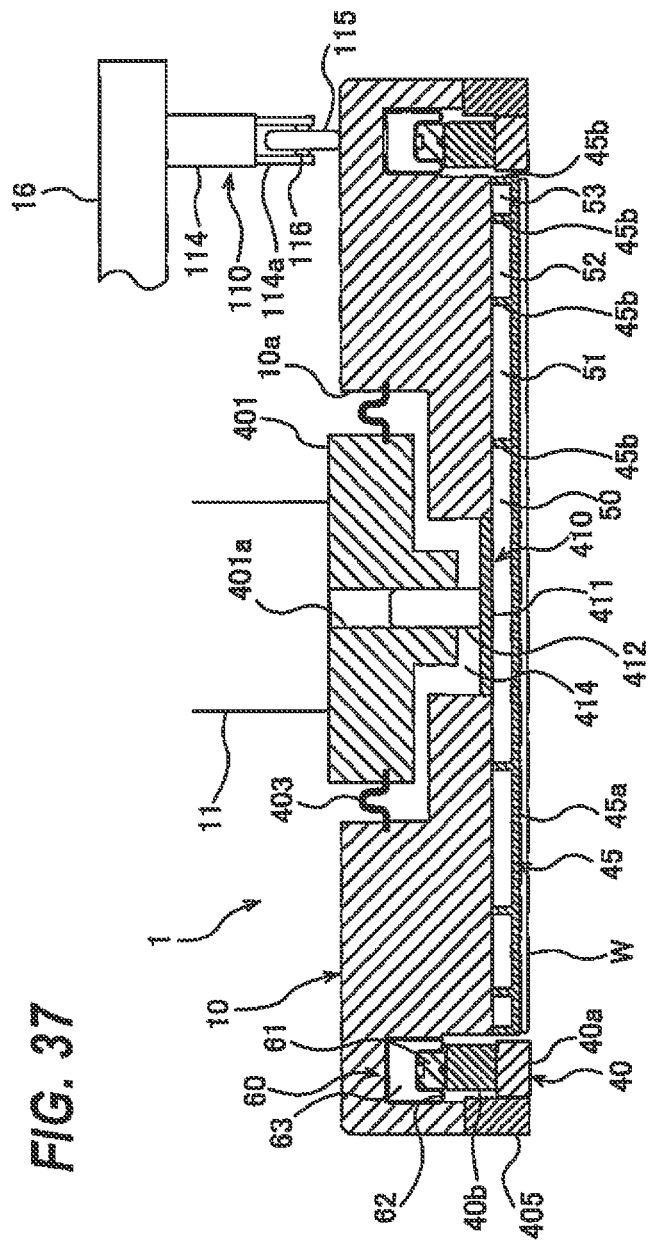
FIG. 37 is a cross-sectional view of the top ring according to still another embodiment.

FIG. 37 is a cross-sectional view of the top ring 1 according to still another embodiment. Structures that are not described particularly in this embodiment are identical to those of the previously-discussed embodiment shown in FIG. 36 and their repetitive descriptions are omitted. The upper portion of the retaining ring 40 is mounted to the retaining ring pressing mechanism 60 that is in the annular shape, and the retaining ring pressing mechanism 60 is fixed to the top ring body 10. The retaining ring 40 is coupled to the top ring body 10 through the retaining ring pressing mechanism 60.

The retaining ring pressing mechanism 60 is configured to exert the uniform downward load on the upper surface of the retaining ring 40 (more specifically, the upper surface of the drive ring 40b) in its entirety to thereby press the lower surface of the retaining ring 40 (i.e., the lower surface of the ring member 40a) in its entirety against the polishing surface 2a of the polishing pad 2. Structures of the retaining ring pressing mechanism 60 are identical to those of the previously-discussed retaining ring pressing mechanism 60 shown in FIG. 3 and their repetitive descriptions are omitted.

A carrier ring 405 is attached to the outer circumferential surface of the retaining ring 40. This carrier ring 405 is disposed so as to surround the retaining ring 40. An upper portion of the carrier ring 405 is fixed to the top ring body 10. As well as the retaining ring 40, a lower surface of the carrier ring 405 may contact the polishing surface 2a of the polishing pad 2.

The gimbal mechanism 410 allows the top ring body 10, the retaining ring 40, the flexible membrane 45, and the carrier ring 405 in their entirety to tilt with respect to the top ring shaft 11 and the housing 401. Structures of the gimbal mechanism 410 are identical to those of the previously-discussed embodiment shown in FIG. 36 and their repetitive descriptions are omitted.

The local load exerting mechanism 110 is disposed above the retaining ring 40. The local load exerting mechanism 110 pushes down the top ring body 10 from above the retaining ring 40 to thereby exert the downward local load on a part of the retaining ring 40. The downward local load is also transmitted to a part of the carrier ring 405. Therefore, the local load exerting mechanism 110 can exert the downward local load on the retaining ring 40 and the carrier ring 405. The local load exerting mechanism 110 may be disposed above the carrier ring 405.

Figure 38:
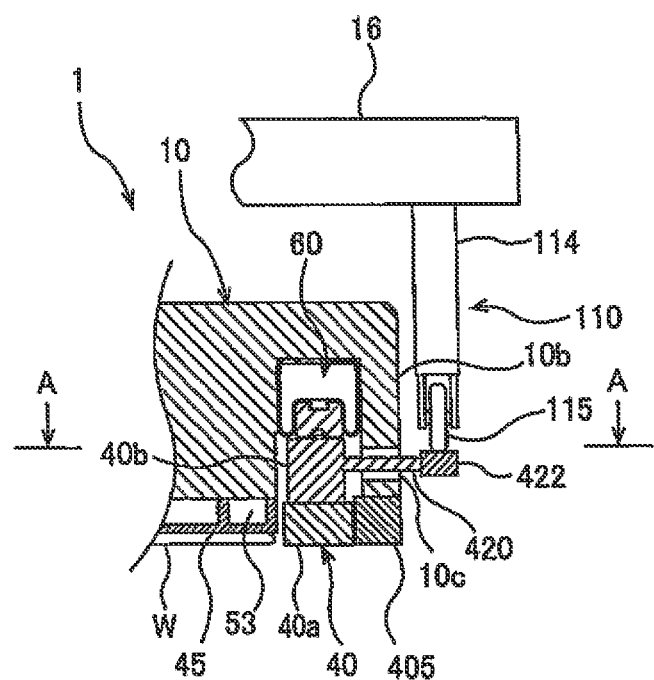
FIG. 38 is a cross-sectional view of the top ring according to still another embodiment.
Figure 39:
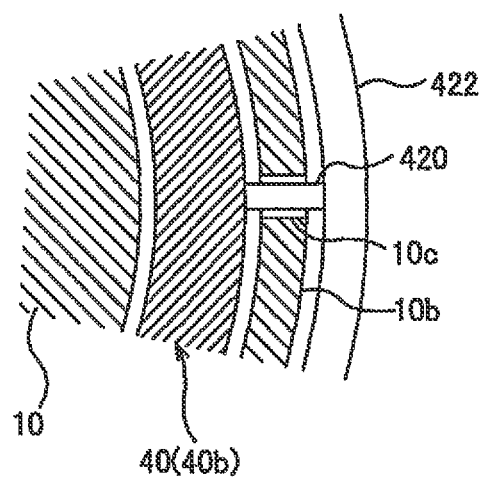
FIG. 39 is a cross-sectional view taken along line A-A in FIG. 38.

FIG. 38 is a cross-sectional view of the top ring 1 according to still another embodiment, and FIG. 39 is a cross-sectional view taken along line A-A in FIG. 38. FIG. 38 and FIG. 39 each shows only a part of structures of the top ring 1. Structures that are not described particularly in this embodiment are identical to those of the previously-discussed embodiment shown in FIG. 37 and their repetitive descriptions are omitted. A plurality of radial arms 420, extending radially outwardly, are connected to the outer circumferential surface of the retaining ring 40 (more specifically, the outer circumferential surface of the drive ring 40b). The radial arms 420 have distal ends connected to an outer ring 422. This outer ring 422 is arranged so as to surround the top ring body 10. The multiple radial arms 420 extend through a plurality of through-holes 10c formed in an outer circumferential wall 10b of the top ring body 10, and are connected to an inner circumferential surface of the outer ring 422. Therefore, the outer ring 422 is coupled to the retaining ring 40 through the radial arms 420.

The outer ring 422 is rotatable together with the retaining ring 40, and vertically movable together with the retaining ring 40. The lower end of the local load exerting mechanism 110, i.e., the wheel 115, is in contact with an upper surface of the outer ring 422. Therefore, when the outer ring 422 is being rotated, the wheel 115 is placed in rolling contact with the upper surface of the outer ring 422. The local load exerting mechanism 110 exerts the downward local load on the outer ring 422 to thereby exert the local load on a part of the retaining ring 40. The radial arms 420 may be integral with the retaining ring 40, or may be constituted as another element different from the retaining ring 40 so long as the radial arms 420 are fixed to the retaining ring 40. The embodiment shown in FIG. 38 may be combined with the embodiment shown in FIG. 37.

The polishing apparatus and the polishing method according to the embodiments described above may be appropriately combined.

Although certain embodiments have been shown and described in detail, it should be understood that various changes and modifications may be made without departing from the scope of the technical concept.

What is claimed is:

1. A polishing apparatus comprising:
   a top ring shaft;
   a housing fixed to the top ring shaft;
   a flexible membrane defining a pressure chamber configured to press a wafer against a polishing pad;
   a top ring body configured to hold the flexible membrane;
   a retaining ring coupled to the top ring body and disposed so as to surround the flexible membrane;
   a carrier ring that surrounds the retaining ring, the carrier ring being secured to the top ring body, the carrier ring having a lower surface arranged to contact the polishing pad;
   a gimbal mechanism configured to allow the top ring body, the flexible membrane, the carrier ring, and the retaining ring to tilt with respect to the housing;
   radial arms coupled to the retaining ring, the radial arms extending radially outwardly; and
   an outer ring secured to the radial arms; and
   no more than one local load exerting mechanism configured to adjustably tilt the retaining ring with respect to the housing while maintaining an attitude of the wafer by exerting a downward local load on a part of the outer ring.

2. The polishing apparatus according to claim 1, wherein the local load exerting mechanism is disposed above the outer ring.

3. The polishing apparatus according to claim 1, wherein the local load exerting mechanism has a wheel that contacts the outer ring.

4. The polishing apparatus according to claim 1, further comprising a retaining ring pressing mechanism configured to press the retaining ring against the polishing pad.

5. The polishing apparatus according to claim 1, wherein the top ring body, the retaining ring, and the flexible membrane are vertically movable relative to the housing and the top ring shaft.

6. The polishing apparatus according to claim 1, wherein the gimbal mechanism includes a plate element fixed to the top ring body, and the gimbal mechanism further includes a post fixed to the plate element.

7. The polishing apparatus according to claim 6, wherein the downward local load is exerted in a first direction, the housing defines a hole extending in a second direction opposite the first direction, and the post is configured to be inserted into the hole such that the top ring body, the retaining ring, and the flexible membrane are all movable relative to the housing along the first direction and the second direction.

8. The polishing apparatus according to claim 6, wherein the plate element is formed of a deformable material, such that deformation of the plate element provides tilting of the top ring body, the retaining ring, and the flexible member relative to the housing.

9. The polishing apparatus according to claim 1, wherein the retaining ring is coupled to the top ring body such that the retaining ring is prevented from tilting relative to the top ring body.

10. The polishing apparatus according to claim 1, wherein the outer ring is arranged around the top ring body.

11. The polishing apparatus according to claim 1, wherein the top ring body has a circumferential wall having through-holes formed therein, and the radial arms extend radially outwardly through the through-holes.

12. The polishing apparatus according to claim 1, wherein the outer ring is rotatable and vertically movable together with the retaining ring.

13. The polishing apparatus according to claim 4, wherein the retaining ring is coupled to the top ring body through the retaining ring pressing mechanism.

14. The polishing apparatus according to claim 1, further comprising:
   a polishing table for supporting a polishing pad having a polishing surface; and
   a motor coupled to the polishing table and configured to rotate the polishing table, the local load exerting mechanism being arranged downstream of the retaining ring with respect to a rotating direction of the polishing table.

15. The polishing apparatus according to claim 1, wherein the local load exerting mechanism has an air cylinder and a piston.

* * * * *